(12) United States Patent
Nakatani et al.

(10) Patent No.: US 8,222,632 B2
(45) Date of Patent: Jul. 17, 2012

(54) POLYMERIC MATERIAL AND POLYMERIC LUMINESCENT ELEMENT

(75) Inventors: Tomoya Nakatani, Ibaraki (JP); Takeshi Yamada, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1087 days.

(21) Appl. No.: 11/993,703

(22) PCT Filed: Jun. 21, 2006

(86) PCT No.: PCT/JP2006/312404
§ 371 (c)(1),
(2), (4) Date: Dec. 21, 2007

(87) PCT Pub. No.: WO2006/137434
PCT Pub. Date: Dec. 28, 2006

(65) Prior Publication Data
US 2010/0171100 A1    Jul. 8, 2010

(30) Foreign Application Priority Data
Jun. 22, 2005 (JP) .................................. 2005-182275

(51) Int. Cl.
*H01L 35/24* (2006.01)
(52) U.S. Cl. .................................. 257/40; 257/E21.264
(58) Field of Classification Search .................... 257/40, 257/E21.264
See application file for complete search history.

(56) References Cited

U.S. PATENT DOCUMENTS

| 6,521,359 | B1 | 2/2003 | Noguchi et al. |
| 2002/0058157 | A1 | 5/2002 | Doi et al. |
| 2002/0076577 | A1 | 6/2002 | Noguchi et al. |
| 2003/0165713 | A1 | 9/2003 | Oguma et al. |
| 2004/0109955 | A1 | 6/2004 | Kitano et al. |
| 2005/0147843 | A1 | 7/2005 | Kobayashi et al. |

FOREIGN PATENT DOCUMENTS

| JP | 2004-277568 A | 10/2004 |
| JP | 2004-362910 A | 12/2004 |
| JP | 2005-8723 A | 1/2005 |
| JP | 2005-8860 A | 1/2005 |
| JP | 2005-75913 A | 3/2005 |
| JP | 2006-56821 A | 3/2006 |
| WO | WO 99/54385 A1 | 10/1999 |
| WO | WO 01/62822 A1 | 8/2001 |
| WO | WO 2004/102615 A2 | 11/2004 |

OTHER PUBLICATIONS

M. Grell et al., "A Glass-Forming Conjugated Main-Chain Liquid Crystal Polymer for Polarized Electroluminescence Applications", Advanced Materials, (1997), 9, No. 10, pp. 798-802.
C. Ego et al., "Triphenylamine-Substituted Polyfluorene-A Stable Blue-Emitter with Improved Charge Injection for Light-Emitting Diodes", Advanced Materials, (2002), 14, No. 11, pp. 809-811.
H. Su et al., "Polyfluorene Containing Diphenylquinoline Pendants and Their Applications in Organic Light Emitting Diodes", J. Polyther Science, Part A, 43 (4), 2005, pp. 859-869.
Chinese Office Action dated Sep. 1, 2011, corresponding to Chinese Patent Application No. 200680022253.2.
Japanese Office Action issued Dec. 27, 2011, corresponding to Japanese Patent Application No. 2006-170883.

*Primary Examiner* — Anthony Ho
(74) *Attorney, Agent, or Firm* — Sughrue Mion, PLLC

(57) ABSTRACT

A luminescent or charge-transporting polymer which has in the backbone optionally substituted fluorenediyl groups as repeating units and further has a functional side chain comprising at least one functional group selected from the group consisting of a hole-injection/transporting group containing one or more heteroatoms other than nitrogen or two or more nitrogen atoms, an electron-injection/transporting group containing one or more heteroatoms other than nitrogen or two or more nitrogen atoms, and a luminescent group comprising a fused aromatic hydrocarbon or heterocycle, characterized in that the functional group is directly bonded to the saturated carbon atom of any of the fluorenediyl groups or is bonded to any of the fluorenediyl groups through —$R_k$—X—($R_k$ represents alkylene and X represents a direct bond or connecting group) at the X.

15 Claims, No Drawings

POLYMERIC MATERIAL AND POLYMERIC LUMINESCENT ELEMENT

TECHNICAL FIELD

The present invention relates to a polymer compound and a polymer light-emitting device using the same.

BACKGROUND ART

A high-polymer weight light-emitting material and charge transport material are soluble in a solvent and capable of forming an organic layer in a light-emitting device by a coating method. Therefore, various types of materials have been investigated. For example, a polymer compound having the following structure, in which two benzene rings (see, e.g., Non-Patent Document 1 and Patent Document 1) are condensed with a cyclopentadiene ring, is known.

[Formula 1]

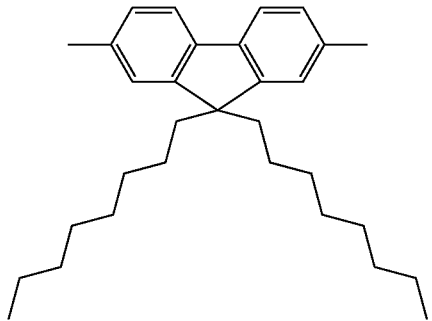

As another example, a polymer compound having a functional substituent such as hole injection/transport group, an electron injection/transport group or a light-emitting group in a conjugated main chain and side chain (see, e.g., Patent Documents 2 and 3 and Non-Patent Documents 2 and 3).

Patent Document 1: International Publication WO99/54385 pamphlet,

Patent Document 2: JP-A-2004-277568

Patent Document 3: WO2001-62822

Non-Patent Document 1: Advanced Materials, Vol. 9, No. 10 (1997), p. 798

Non-Patent Document 2: Advanced Materials, 2002, 14(11), 809-811

Non-Patent Document 3: J. Polymer Science, Part A; 2005, 43(3), 859-869

DISCLOSURE OF THE INVENTION

Problem to be Solved by the Invention

When a polymer compound is used as a light-emitting material for a light-emitting device, in order to obtain high light emission properties, the polymer compound must have good injectability and transportability of positive charge (holes) and negative charge (electrons) and have high light emission efficiency. However, it may not be said that conventional polymer compounds mentioned above have sufficient properties. In the circumstances, it has been desired to develop a polymer compound having high charge injectability/transportability and high light emission efficiency.

Means for Solving the Problem

The present invention therefore provides a light emitting or charge transport polymer compound having a fluorenediyl group that may have a substituent as a repeat unit in the main chain and a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring, characterized in that the functional group is directly bonded to a saturated carbon of the fluorenediyl group or bonded to the fluorenediyl group via —$R_k$—X— ($R_k$ represents an alkylene group and X represents a direct bond or bonding group) at X.

ADVANTAGES OF THE INVENTION

The polymer compound of the present invention has effects such as high charge injectability and transportability and high light emission efficiency. When a side chain has a hole injection/transport group, the energy of the highest occupied molecular orbital (HOMO) increases, with the result that hole injectability and hole transportability improve, increasing light emission efficiency. When a side chain has an electron injection/transport group, the energy of the lowest unoccupied orbital (LUMO) decreases, with the result that electron injectability and electron transportability improve, increasing light emission efficiency. When a side chain has a light-emitting group, it is expected that the light emission efficiency increases or light having a different wavelength from that of the main chain is emitted.

When a polymer compound whose main chain has electron transportability and side chain has a hole injection/transport group, a new function can be added without inhibiting the electron transportability of the main chain and the transportability of electrons and holes can be controlled.

When a polymer compound whose main chain has electron transportability and side chain has a light-emitting group, light having a different wavelength from that of the main chain can be emitted. Furthermore, when a light-emitting group having high efficiency is used, the light emission efficiency can be also improved.

When a polymer compound whose main chain has electron transportability and side chain has an electron injection/transport group, the electron transportability of the main chain can be improved.

Likewise, by separating the function of the main chain from that of the side chain, a function can be added without inhibiting the function of the main chain, with the result that functional improvement of a polymer compound can be expected.

Accordingly, a polymer LED containing a polymer compound according to the present invention can be used as curved and planar light sources for backlight or illumination of liquid crystal displays and used in devices such as a segment type display device and a flat panel display of dot matrix.

BEST MODE FOR CARRYING OUT THE INVENTION

A polymer compound according to the present invention has a fluorenediyl group that may have a substituent in the main chain.

The fluorenediyl group is represented by the following formula (1).

[Formula 2]

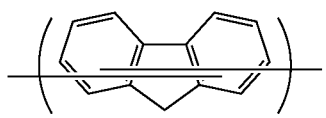

(1)

The compound represented by the formula (1), may have a substituent.

When a fluorenediyl group has a substituent, the compound may have substituents whose number is selected from the integers of 0 to 7, other than a functional side chain. The substituent(s) are preferably selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group and nitro group.

The alkyl group may be linear, branched or cyclic and may have a substituent. The number of carbon atoms is generally about 1 to 20. Specific examples thereof include a methyl group, ethyl group, propyl group, isopropyl group, butyl group, isobutyl group, t-butyl group, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group and perfluorooctyl group.

The alkoxy group may be linear, branched or cyclic and may have a substituent. The number of carbon atoms is generally about 1 to 20. Specific examples thereof include a methoxy group, ethoxy group, propyloxy group, isopropyloxy group, butoxy group, isobutoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group and 2-methoxyethyloxy group.

The alkylthio group may be linear, branched or cyclic and may have a substituent. The number of carbon atoms is generally about 1 to 20. Specific examples thereof include a methylthio group, ethylthio group, propylthio group, isopropylthio group, butylthio group, iso butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and trifluoromethylthio group.

The aryl group is the remaining atom group obtained by removing a single hydrogen atom from an aromatic hydrocarbon and includes an aryl group having a condensed ring and an aryl group having two or more independent benzene rings or condensed rings directly joined thereto or joined via a group such as vinylene. The aryl group generally has about 6 to 60 carbon atoms, and preferably, 7 to 48 carbon atoms. Specific examples thereof include a phenyl group, $C_1$-$C_{12}$alkoxyphenyl group ($C_1$-$C_{12}$ represents that the number of carbon atoms is 1 to 12 and hereinafter, the same definition will be also applied), $C_1$-$C_{12}$alkylphenyl group, 1-naphthyl group, 2-naphthyl group, 1-anthracenyl group, 2-anthracenyl group, 9-anthracenyl group and pentafluorophenyl group, and a $C_1$-$C_{12}$alkoxyphenyl group and $C_1$-$C_{12}$alkylphenyl group are preferable. Specific examples of the $C_1$-$C_{12}$alkoxy include methoxy, ethoxy, propyloxy, isopropyloxy, butoxy, isobutoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy. Specific examples of the $C_1$-$C_{12}$alkylphenyl group include a methylphenyl group, ethylphenyl group, dimethylphenyl group, propylphenyl group, mesityl group, methylethylphenyl group, isopropylphenyl group, butylphenyl group, isobutylphenyl group, t-butylphenyl group, pentylphenyl group, isoamylphenyl group, hexylphenyl group, heptylphenyl group, octylphenyl group, nonylphenyl group, decylphenyl group and dodecylphenyl group.

The aryloxy group generally has about 6 to 60 carbon atoms and preferably 7 to 48. Specific examples thereof include a phenoxy group, $C_1$-$C_{12}$alkoxyphenoxy group $C_1$-$C_{12}$alkylphenoxy group, 1-naphthyloxy group, 2-naphthyloxy group and pentafluorophenyloxy group, and a $C_1$-$C_{12}$alkoxyphenoxy group and $C_1$-$C_{12}$alkylphenoxy group are preferable.

Specific examples of the $C_1$-$C_{12}$alkoxy include methoxy, ethoxy, propyloxy, isopropyloxy, butoxy, isobutoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy.

Specific examples of the $C_1$-$C_{12}$alkylphenoxy group include a methylphenoxy group, ethylphenoxy group, dimethylphenoxy group, propylphenoxy group, 1,3,5-timethylphenoxy group, methylethylphenoxy group, isopropylphenoxy group, butylphenoxy group, isobutylphenoxy group, t-butylphenoxy group, pentylphenoxy group, isoamyiphenoxy group, hexylphenoxy group, heptyiphenoxy group, octylphenoxy group, nonylphenoxy group, decylphenoxy group and dodecylphenoxy group.

The arylthio group may have a substituent on the aromatic ring and generally has about 3 to 60 carbon atoms. Specific examples thereof include a phenylthio group, $C_1$-$C_{12}$alkoxyphenylthio group, $C_1$-$C_{12}$alkylphenylthio group, 1-naphthylthio group, 2-naphthylthio group, pentafluorophenylthio group, pyridylthio group, pyridazinylthio group, pyrimidylthio group, pyrazylthio group and triazylthio group.

The arylalkyl group may have a substituent and generally has about 7 to 60 carbon atoms. Specific examples thereof include a phenyl-$C_1$-$C_{12}$alkyl group, $C_1$-$C_{12}$alkoxyphenyl-$C_1$-$C_{12}$alkyl group, $C_1$-$C_{12}$alkylphenyl-$C_1$-$C_{12}$alkyl group, 1-naphthyl-$C_1$-$C_{12}$alkyl group and 2-naphthyl-$C_1$-$C_{12}$alkyl group.

The arylalkoxy group may have a substituent and generally has about 7 to 60 carbon atoms. Specific examples thereof include a phenyl-$C_1$-$C_{12}$alkoxy group, $C_1$-$C_{12}$alkoxyphenyl-$C_1$-$C_{12}$alkoxy group, $C_1$-$C_{12}$alxylphenyl-$C_1$-$C_{12}$alkoxy group, 1-naphthyl-$C_1$-$C_{12}$alkoxy group and 2-naphthyl-$C_1$-$C_{12}$alkoxy group.

The arylalkylthio group may have a substituent and generally has about 7 to 60 carbon atoms. Specific examples thereof include a phenyl-$C_1$-$C_{12}$alkylthio group, $C_1$-$C_{12}$alkoxyphenyl-$C_1$-$C_{12}$alkylthio group, $C_1$-$C_{12}$alxylphenyl-$C_1$-$C_{12}$alkylthio group, 1-naphthyl-$C_1$-$C_{12}$alkylthio group and 2-naphthyl-$C_1$-$C_{12}$alkylthio group.

The arylalkenyl group generally has about 8 to 60 carbon atoms. Specific examples thereof include a phenyl-$C_2$-$C_{12}$alkenyl group, $C_1$-$C_{12}$alkoxyphenyl-$C_2$-$C_{12}$alkenyl group, $C_1$-$C_{12}$alxylphenyl-$C_2$-$C_{12}$alkenyl group, 1-naphthyl-$C_2$-$C_{12}$alkenyl group and 2-naphthyl-$C_2$-$C_{12}$alkenyl group; and a $C_1$-$C_{12}$alkoxyphenyl-$C_2$-$C_{12}$alkenyl group and $C_2$-$C_{12}$alkylphenyl-$C_1$-$C_{12}$alkenyl group are preferable.

The arylalkynyl group generally has about 8 to 60 carbon atoms. Specific examples thereof include a phenyl-$C_2$-$C_{12}$alkynyl group, $C_1$-$C_{12}$alkoxyphenyl-$C_2$-$C_{12}$alkynyl group, $C_1$-$C_{12}$alxylphenyl-$C_2$-$C_{12}$alkynyl group, 1-naphthyl-$C_2$-$C_{12}$alkynyl group and 2-naphthyl-$C_2$-$C_{12}$alkynyl group; and a $C_1$-$C_{12}$alkoxyphenyl-$C_2$-$C_{12}$alkynyl group and $C_1$-$C_{12}$alkylphenyl-$C_2$-$C_{12}$alkynyl group are preferable.

The substituted amino group may include amino groups substituted with a single group or two groups selected from the group consisting of an alkyl group, aryl group, arylalkyl group and a monovalent heterocyclic group. The alkyl group, aryl group, arylalkyl group or a monovalent heterocyclic group may have a substituent S. The number of carbon atoms of the substituted amino group excluding that of the substituent S is generally about 1 to 60, and preferably, 2 to 48.

Specific examples include a methylamino group, dimethylamino group, ethylamino group, diethylamino group, propylamino group, dipropylamino group, isopropylamino group, diisopropylamino group, butylamino group, isobutylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$-$C_{12}$alkoxyphenylamino group, di($C_1$-$C_{12}$alkoxyphenyl)amino group, di($C_1$-$C_{12}$alkylphenyl)amino group, 1-naphthylamino group, 2-naphthylamino group, pentafluorophenylamino group, pyridylamino group, pyridazinylamino group, pyrimidylamino group, pyrazylamino group, triazylamino group phenyl-$C_1$-$C_{12}$alkylamino group, $C_1$-$C_{12}$alkoxyphenyl-$C_1$-$C_{12}$alkylamino group, $C_1$-$C_{12}$alkylphenyl-$C_1$-$C_{12}$alkylamino group, di($C_1$-$C_{12}$alkoxyphenyl-$C_1$-$C_{12}$alkyl)amino group, di($C_1$-$C_{12}$alkylphenyl-$C_1$-$C_{12}$alkyl)amino group, 1-naphthyl-$C_1$-$C_{12}$alkylamino group and 2-naphthyl-$C_1$-$C_{12}$alkylamino group.

The substituted silyl group may include silyl groups substituted with 1, 2 or 3 groups selected from the group consisting of an alkyl group, aryl group, arylalkyl group and a monovalent heterocyclic group.

The substituted silyl group generally has about 1 to 60 carbon atoms, and preferably 3 to 48 carbon atoms. The alkyl group, aryl group, aryloxy group or a monovalent heterocyclic group may have a substituent. Note that the alkyl group, aryl group, arylalkyl group and a monovalent heterocyclic group may have a substituent.

Specific examples thereof include a trimethylsilyl group, triethylsilyl group, tripropylsilyl group, tri-isopropylsilyl group, dimethyl-isopropylsilyl group, diethyl-isopropylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$-$C_{12}$alkylsilyl group, $C_1$-$C_{12}$alkoxyphenyl-$C_1$-$C_{12}$alkylsilyl group, $C_1$-$C_{12}$alkylphenyl-$C_1$-$C_{12}$alkylsilyl group, 1-naphthyl-$C_1$-$C_{12}$alkylsilyl group, 2-naphthyl-$C_1$-$C_{12}$alkylsilyl group, phenyl-$C_1$-$C_{12}$alkyldimethylsilyl group, triphenylsilyl group, tri-p-xylylsilyl group, tribenzylsilyl group, diphenylmethylsilyl group, t-butyldiphenylsilyl group and dimethylphenylsilyl group.

Examples of the halogen atom include a fluorine atom, chlorine atom, bromine atom and iodine atom.

The acyl group generally has about 2 to 20 carbon atoms, and preferably, 2 to 18 carbon atoms. Specific examples thereof include an acetyl group, propionyl group, butyryl group, isobutyryl group, pivaloyl group, benzoyl group, trifluoroacetyl group and pentafluorobenzoyl group.

The acyloxy group generally has about 2 to 20 carbon atoms, and preferably, 2 to 18 carbon atoms. Specific examples thereof include an acetoxy group, propionyloxy group, butyryloxy group, isobutyryloxy group, pivaloyloxy group, benzoyloxy group, trifluoroacetyloxy group and pentafluorobenzoyloxy group.

The imine residue has about 2 to 20 carbon atoms, and preferably 2 to 18 carbon atoms. Specific examples thereof include groups represented by the following formulas.

[Formula 3]

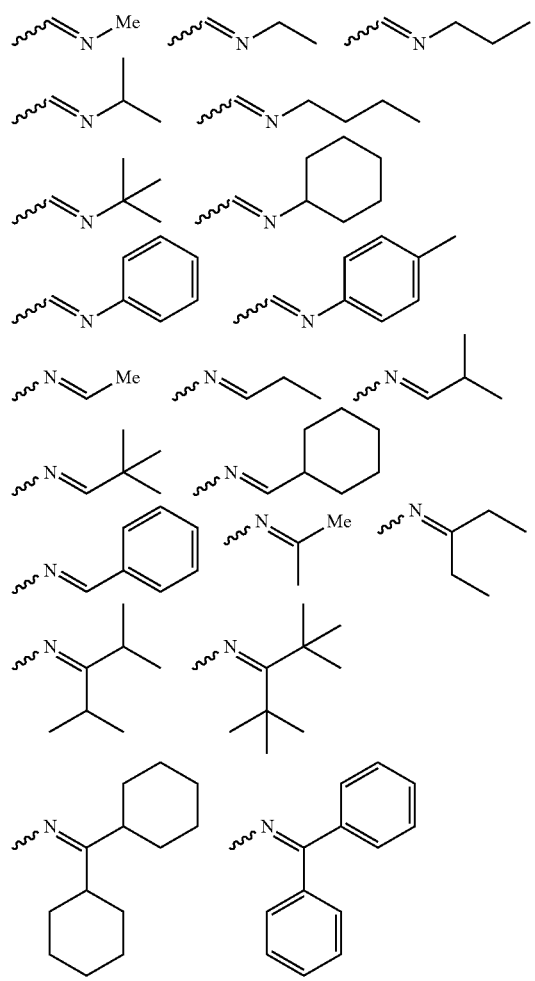

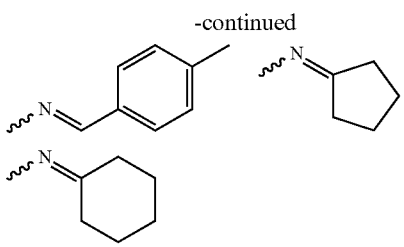

The amide group has about 2 to 20 carbon atoms, and preferably, 2 to 18 carbon atoms. Specific examples thereof include a formamide group, acetamido group, propioamide group, butyroamide group, benzamido group, trifluoroacetamido group, pentafluorobenzamide group, diformamide group, diacetamide group, dipropyoamide group, dibutyroamide group, dibenzamide group, ditrifluoroacetamide group and dipentafluorobenzamide group.

The acid imido group may be a residue obtained by removing a hydrogen atom bound to the nitrogen atom of the acid imido and has about 4 to 20 carbon atoms. Specific examples thereof include groups represented below.

[Formula 4]

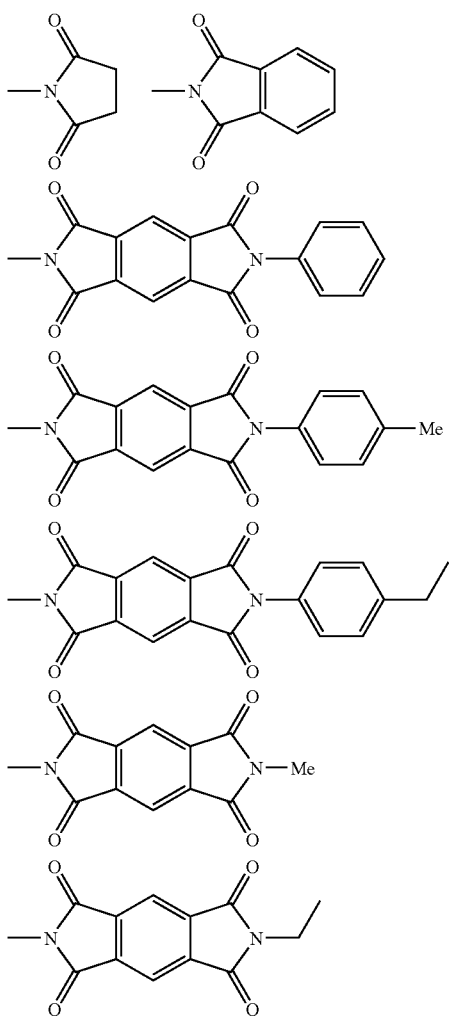

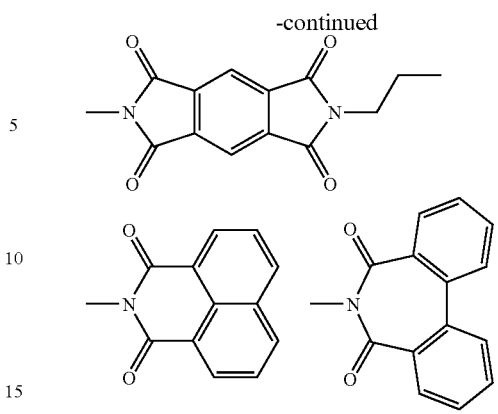

The monovalent heterocyclic group refers to an atom group obtained by removing a single hydrogen atom from a heterocyclic compound and generally has about 4 to 60 carbon atoms, and preferably, 4 to 20 carbon atoms. Note that the number of carbon atoms of the heterocyclic ring does not include the number of carbon atoms of a substituent. The heterocyclic compound herein refers to an organic compound having a ring structure which may not be necessarily constituted of carbon atoms alone and may include a hetero atom such as oxygen, sulfur, nitrogen, phosphorus or boron. Specific examples thereof include a thienyl group, $C_1$-$C_{12}$alkylthienyl group, pyrrolyl group, furyl group, pyridyl group, $C_1$-$C_{12}$alkylpyridyl group, piperidyl group, quinolyl group and isoquinolyl group; and a thienyl group, $C_1$-$C_{12}$alkylthienyl group, pyridyl group and $C_1$-$C_{12}$alkylpyridyl group are preferable.

The substituted carboxyl group is a carboxyl group substituted with an alkyl group, aryl group, arylalkyl group or monovalent heterocyclic group and generally has about 2 to 60 carbon atoms, and preferably, 2 to 48 carbon atoms. Specific examples thereof include a methoxycarbonyl group, ethoxycarbonyl group, propoxycarbonyl group, isopropoxycarbonyl group, butoxycarbonyl group, isobutoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group and pyridyloxycarbonyl group. Note that the alkyl group, aryl group, arylalkyl group or monovalent heterocyclic group may have a substituent. Note that the number of carbon atoms of the substituted carboxyl group mentioned above does not include the number of carbon atoms of a substituent.

In view of ease of synthesis, of the repeat units shown in the formula (1), repeat units represented by the following formulas (1-1) and (1-2) are preferable.

[Formula 5]

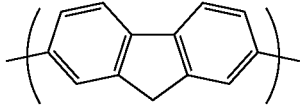

(1-1)

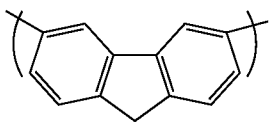
(1-2)

The compounds represented by formulas (1-1) and (1-2) may have a substituent.

When the compounds represented by formulas (1-1) and (1-2) have a substituent, they may have substituents whose number is selected from the integers of 0 to 7, other than a functional side chain. Examples of the substituent(s) are the same as those listed in the formula (1).

Furthermore, a polymer compound according to the present invention has a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring.

As the hole injection/transport group, mention may be made of a monovalent group having hole injectability superior to that of the main chain or a monovalent group having hole transportability superior to the main chain.

The hole injectability generally depends upon the energy value of the highest occupied molecular orbital (HOMO) of a polymer compound. The smaller the absolute value of the HOMO energy value, the better the hole injectability.

As the monovalent group having hole injectability superior to that of the main chain, mention may be made of a monovalent group having a lower absolute value of the HOMO energy than that of the main chain.

The HOMO energy is obtained by measuring the oxidation potential of a polymer compound by use of cyclic voltammetry (CV) and calculating the energy based on the value of oxidation potential. In the case of a polymer compound according to the present invention, the oxidation potential takes a negative value. The lower the oxidation potential (the larger the absolute value of the oxidation potential), the smaller the absolute value of HOMO energy. Thus, the hole injectability is improved. When HOMO energy is calculated based on the value of oxidation potential, since a calculation method varies depending upon the type of electrode and solvent used in CV, calculation is made by correcting the error between electrodes and solvents with reference to the electrochemical handbook, the 5th edition (2000, published by Maruzen Co., Ltd.).

The transportability of holes generally depends upon the mobility of holes of a polymer compound. The higher the mobility of holes, the better the hole injectability.

As the monovalent group having hole transportability superior to that of the main chain, mention may be made of a monovalent group having a higher mobility of holes than that of the main chain.

The measurement of hole mobility is not particularly limited; however, the mobility of holes of a polymer compound can be measured by a Time-of-Flight (TOF) method.

As the electron injection/transport group, mention may be made of a monovalent group having electron injectability superior to that of the main chain or a monovalent group having electron transportability superior to that of the main chain.

The electron injectability generally depends upon the energy value of the lowest unoccupied molecular orbital (LUMO) of a polymer compound. The larger the absolute value of the LUMO energy value, the better the electron injectability.

As the monovalent group having electron injectability superior to that of the main chain, mention may be made of a monovalent group having a larger absolute value of LUMO than that of the main chain.

The LUMO energy is obtained by measuring the reduction potential of a polymer compound by use of cyclic voltammetry (CV) and calculating the energy based on the value of reduction potential. In the case of a polymer compound according to the present invention, the reduction potential takes a negative value. The higher the reduction potential (the smaller the absolute value of the reduction potential), the larger the absolute value of LUMO energy. Thus, the electron injectability is improved. When LUMO energy is calculated based on the value of reduction potential, since a calculation method varies depending upon the type of electrode and solvent used in CV, calculation is made by correcting the error between electrodes and solvents with reference to the electrochemical handbook, the 5th edition (2000, published by Maruzen Co., Ltd.).

The electron transportability generally depends upon the mobility of electrons of a polymer compound. The higher the mobility of electrons, the better the electron injectability.

As the monovalent group having electron transportability superior to that of the main chain, mention may be made of a monovalent group having a higher mobility of electrons than that of the main chain.

The measurement of electron mobility is not particularly limited; however, the mobility of electrons of a polymer compound can be measured by a Time-of-Flight (TOF) method.

The light emitting group is a monovalent group emitting a color different in wavelength from that of the main chain and generally include a monovalent group having a smaller HOMO-LUMO gap (difference in absolute value between HOMO and LUMO energy) than that of the main chain.

The measurement of MONO and LUMO is performed in the same manner as mentioned above.

Examples of the hole injection/transport group containing at least one hetero atom other than a nitrogen atom or at least two nitrogen atoms may include a monovalent aromatic amine containing two or more nitrogen atoms, a monovalent carbazole derivative containing two or more nitrogen atoms, a monovalent metal complex containing two or more nitrogen atoms, a monovalent group containing at least one nitrogen atom and at least one hetero atom other than the nitrogen atom(s), and a monovalent group containing a hetero atom except a nitrogen atom.

Examples of the monovalent aromatic amine containing two or more nitrogen atoms include those represented by the following formulas (H-1) to (H-14);

examples of the monovalent carbazole derivative containing two or more nitrogen atoms include those represented by the following formulas (H-15) to (H-19);

examples of the monovalent metal complex containing two or more nitrogen atoms include those represented by the following formulas (H-20) to (H-22);

examples of the monovalent group containing at least one nitrogen atom and at least one hetero atom other than the nitrogen atom(s) include the residues obtained by removing single R or a hydrogen atom on R from those represented by the following formulas (H-23) to (H-25); and examples of the monovalent group containing a hetero atom except a nitrogen atom include the residues obtained by removing single R or a hydrogen atom on R from those represented by the following formulas (H-26) to (H-29).
[Formula 6-1]
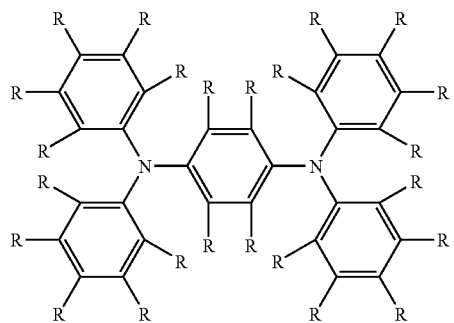
(H-1)
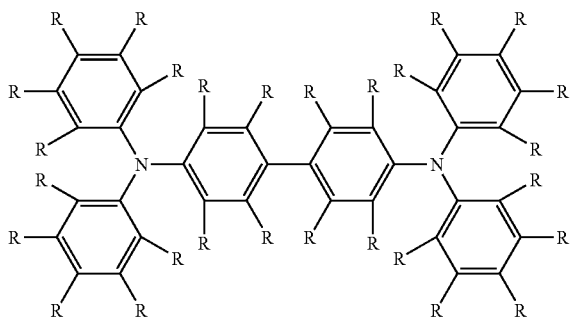
(H-2)
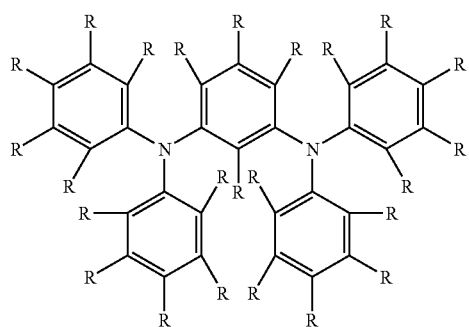
(H-3)
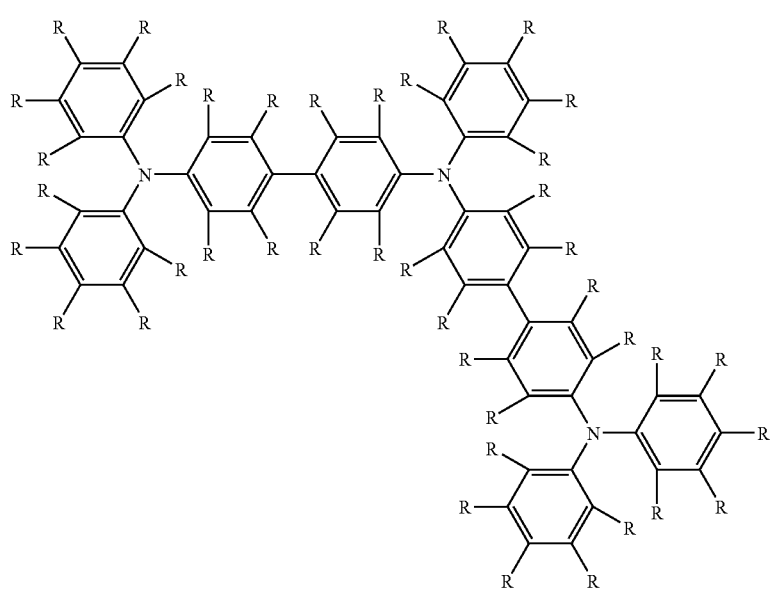
(H-4)

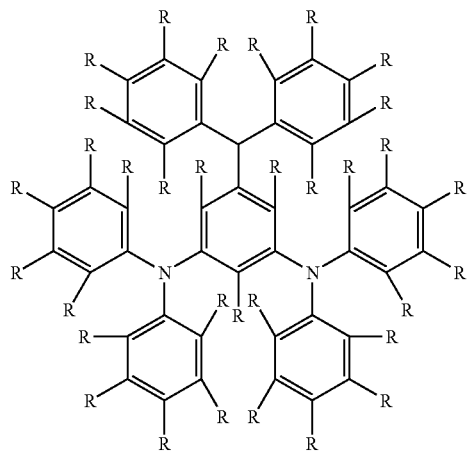
(H-5)
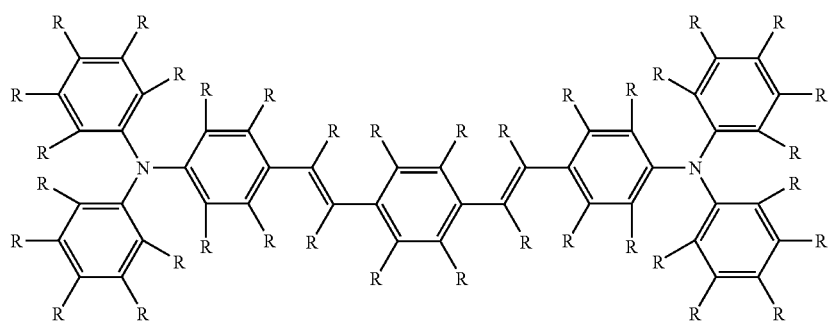
(H-6)
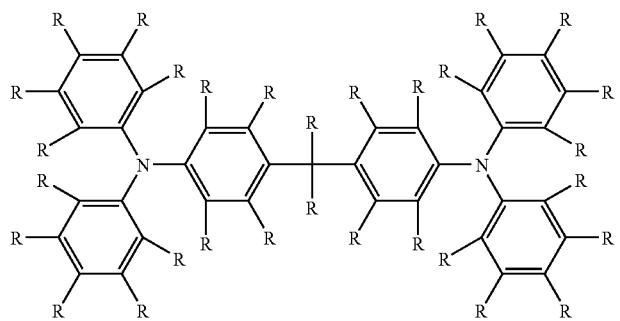
(H-7)
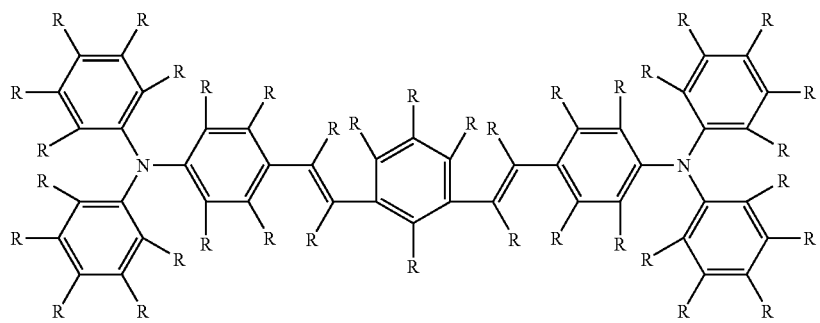
(H-8)

-continued
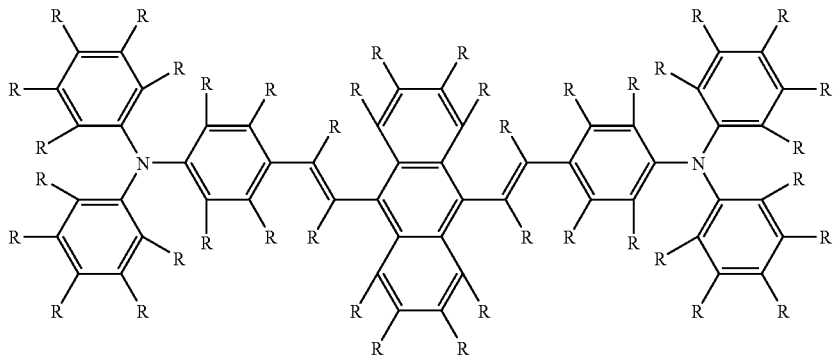
(H-9)
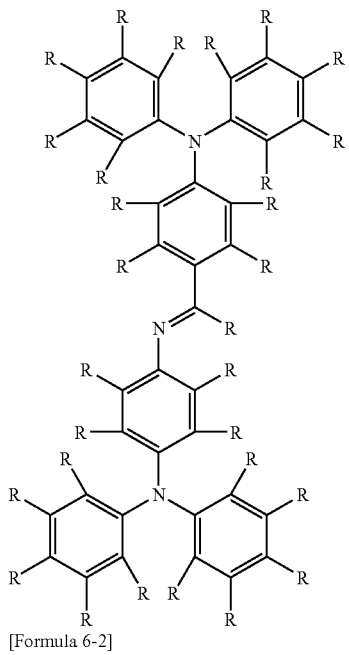
(H-10)
[Formula 6-2]
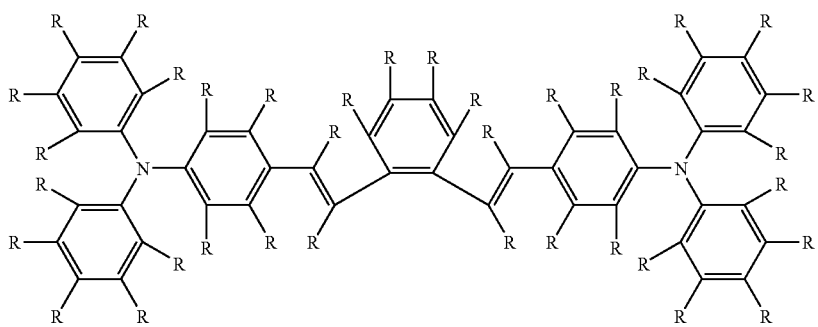
(H-11)
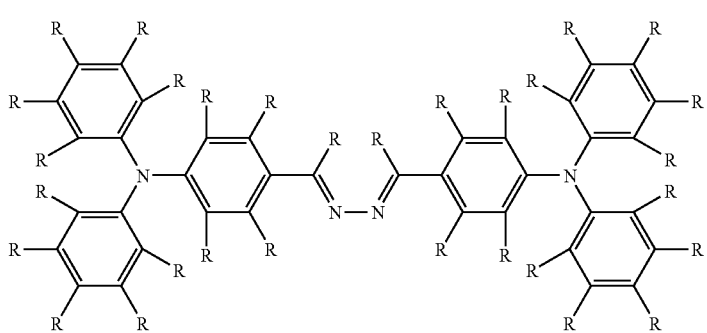
(H-12)

-continued
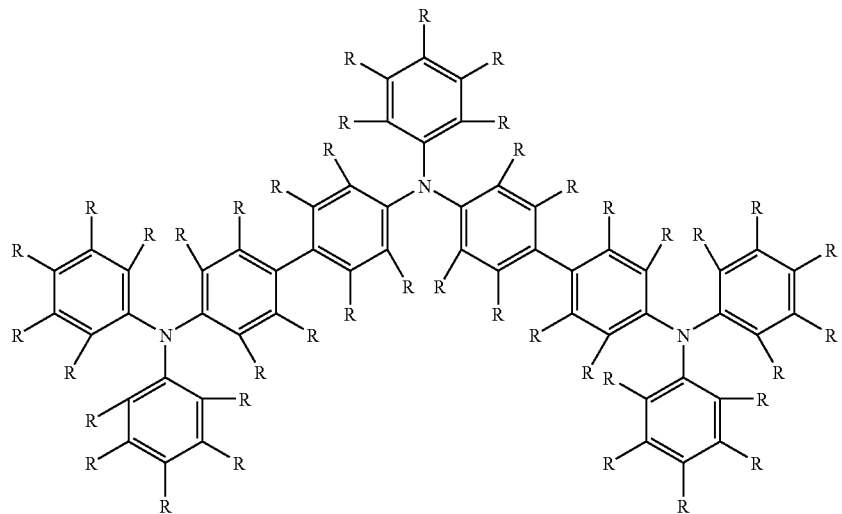
(H-13)
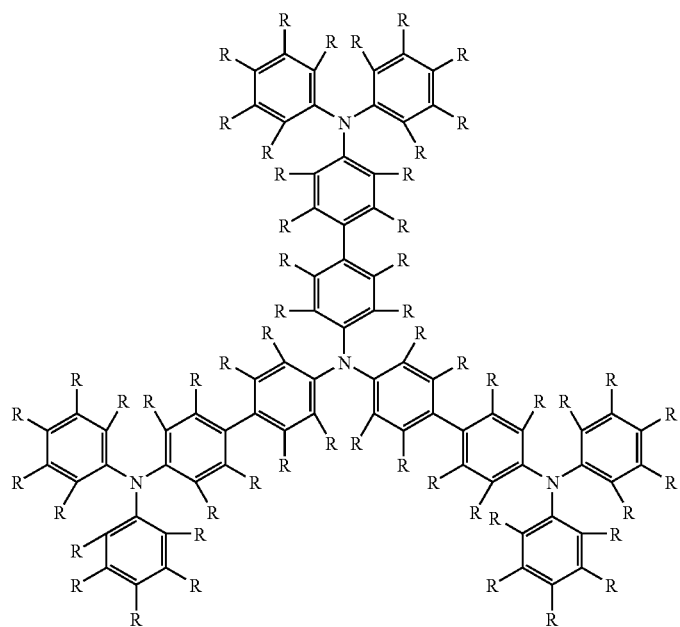
(H-14)
[Formula 7]
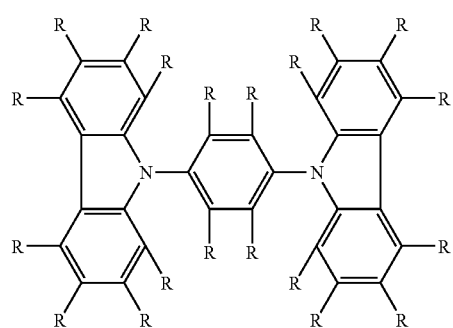
(H-15)
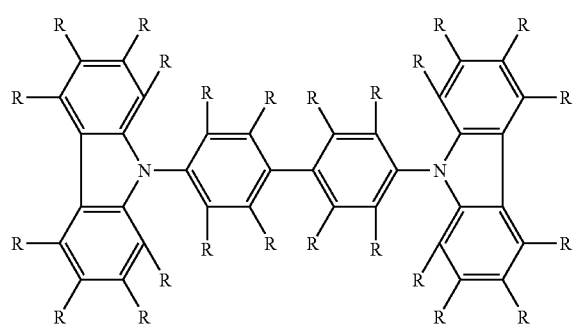
(H-16)

-continued
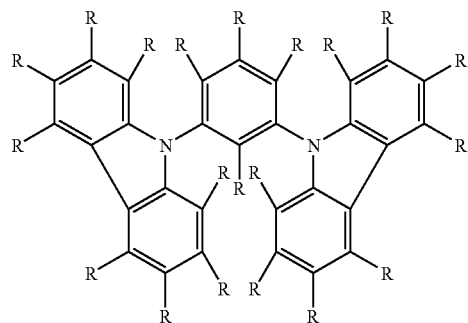
(H-17)
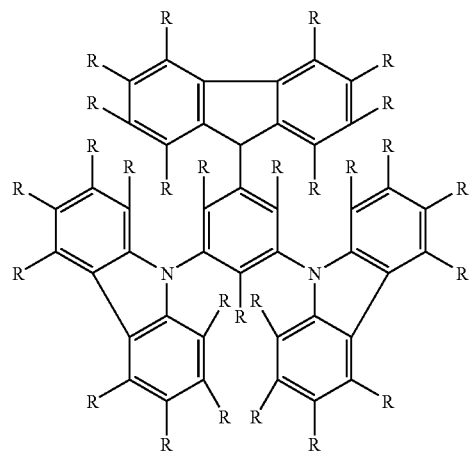
(H-18)
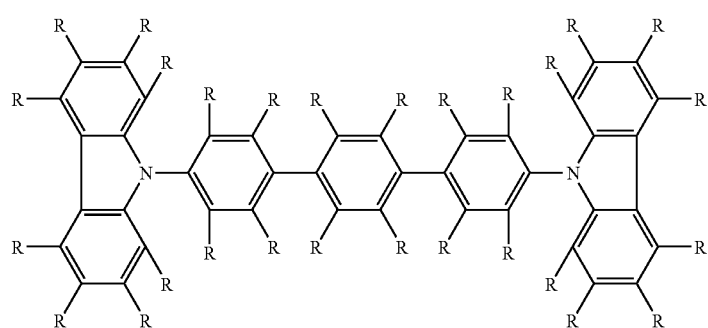
(H-19)
[Formula 8]
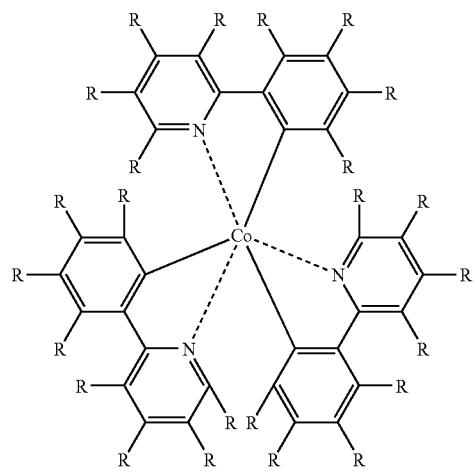
(H-20)
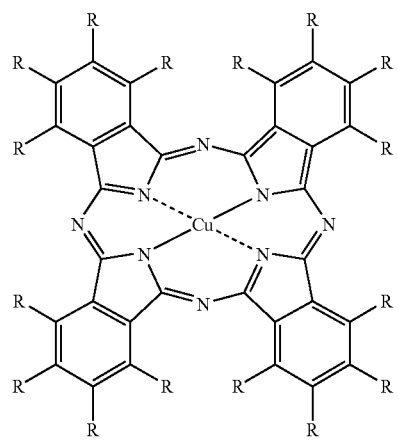
(H-21)

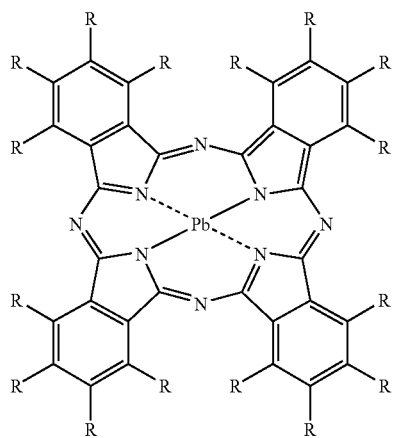
(H-22)
[Formula 9]
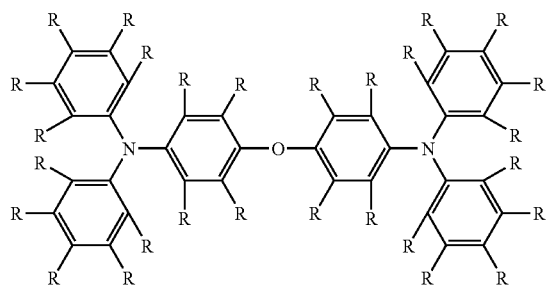
(H-23)
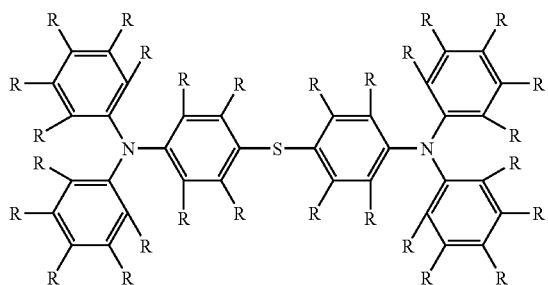
(H-24)
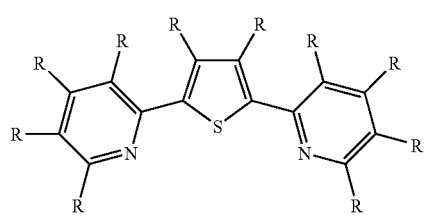
(H-25)
[Formula 10]
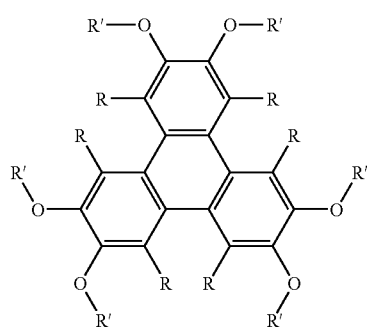
(H-26)
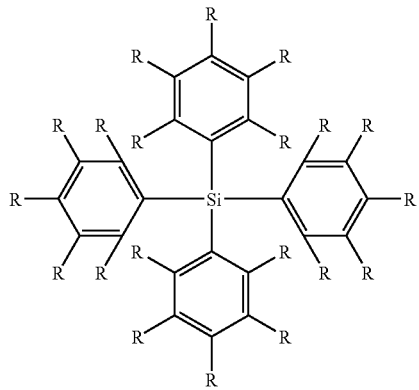
(H-27)

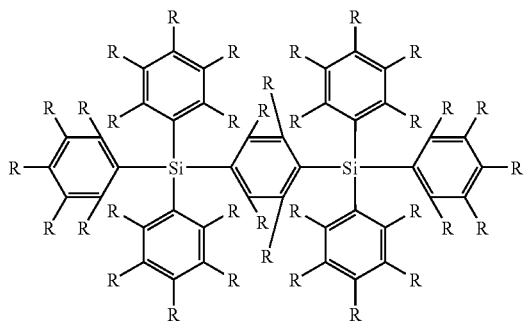
(H-28)

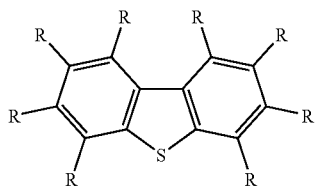
(H-29)

In the formulas (H-1) to (H-29), R is preferably selected from the group consisting of a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group and nitro group.

Examples of the alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imido group, monovalent heterocyclic group, carboxyl group and substituted carboxyl group are the same as those defined in the formula (1).

In the formula (H-26), R' is preferably selected from the group consisting of a hydrogen atom, alkyl group, aryl group, arylalkyl group, arylalkoxy group, arylalkylthio group, arylalkenyl group, arylalkynyl group and monovalent heterocyclic group.

Examples of the alkyl group, aryl group, arylalkyl group, arylalkoxy group, arylalkylthio group, arylalkenyl group, arylalkynyl group and monovalent heterocyclic group are the same as those defined in the formula (1).

The hole injection/transport group may be an oligomer or a polymer.

Specific examples thereof may include the residue obtained by removing a single R or a hydrogen atom on R from a compound in which not less than two compounds that may be same or different in type, are joined by carbon-to-carbon bound to R, as shown in the aforementioned formulas (H-1) to (H-29).

Examples of the electron injection/transport group containing at least one hetero atom other than a nitrogen atom or at least two nitrogen atoms include a monovalent Al or Zn complex containing at least one hetero atom other than a nitrogen atom;

a monovalent complex of a metal except Al and Zn containing at least one hetero atom except a nitrogen atom and an element selected from the group consisting of elements of the second to fourth period of the periodic table;

a monovalent group containing at least one hetero atom other than a nitrogen atom and at least one nitrogen atom;

a monovalent group containing at least one sulfur atom alone as a hetero atom; and a monovalent group containing two or more nitrogen atoms alone as a hetero atom.

Examples of the monovalent Al or Zn complex containing at least one hetero atom other than a nitrogen atom include those represented by the following formulas (E-1) to (E-10);

examples of the monovalent complex of a metal except Al and Zn containing at least one hetero atom except a nitrogen atom and an element selected from the group consisting of elements of the second to fourth period of the periodic table include those represented by the following formulas (E-11) to (E-16);

examples of the monovalent group containing at least one hetero atom other than a nitrogen atom and at least one nitrogen atom include the residues obtained by removing a single R or a hydrogen atom on R from the following formulas (E-17) to (E-27);

examples of the monovalent group containing at least one sulfur atom alone as a hetero atom include the residues obtained by removing a single R or a hydrogen atom on R from the following formulas (E-28) to (E-31); and examples of the monovalent group containing two or more nitrogen atoms alone as a hetero atom include the residues obtained by removing a single R or a hydrogen atom on R from the following formulas (E-32) to (E-40).

[Formula 11]

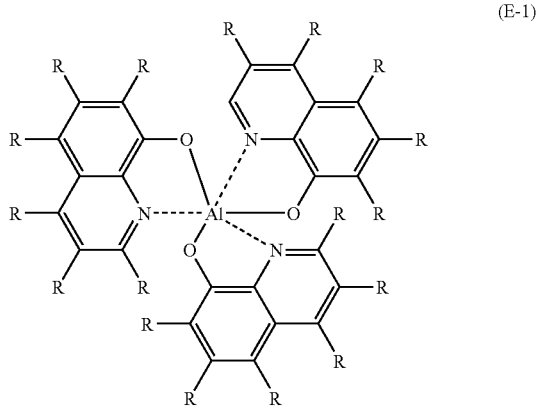
(E-1)

-continued
(E-2)
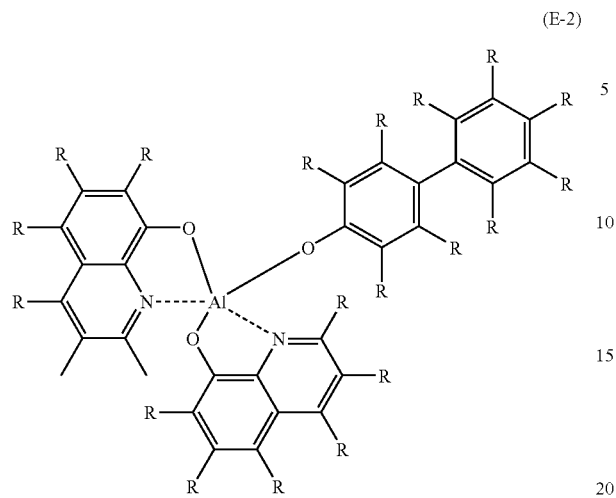
(E-3)
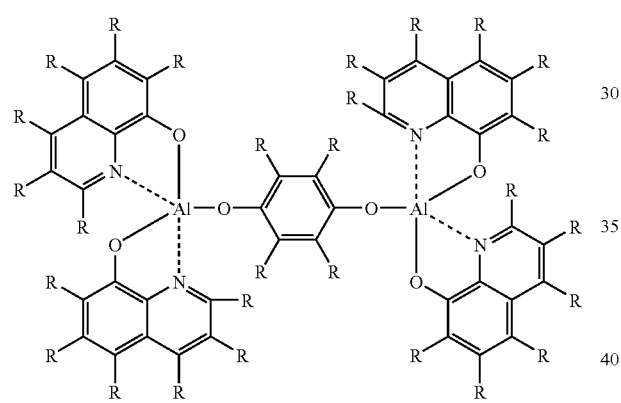
(E-4)
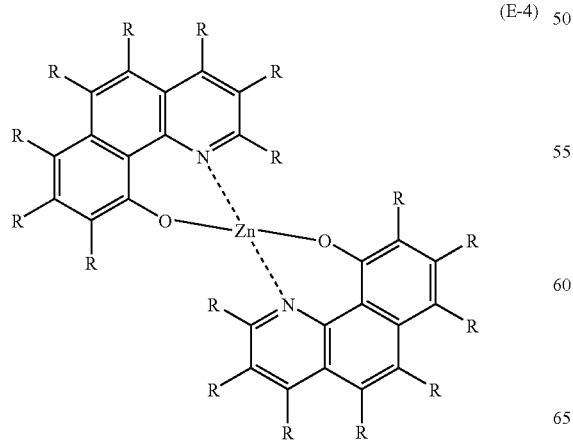
(E-5)
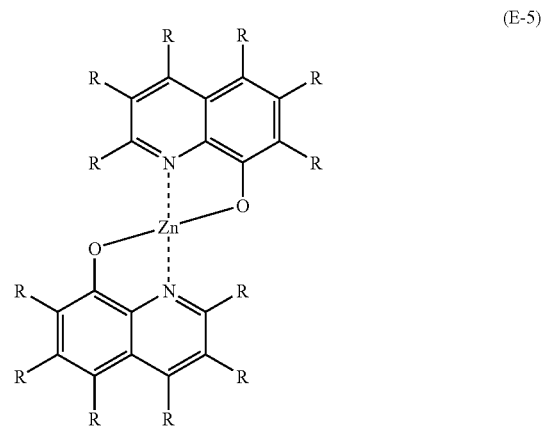
(E-6)
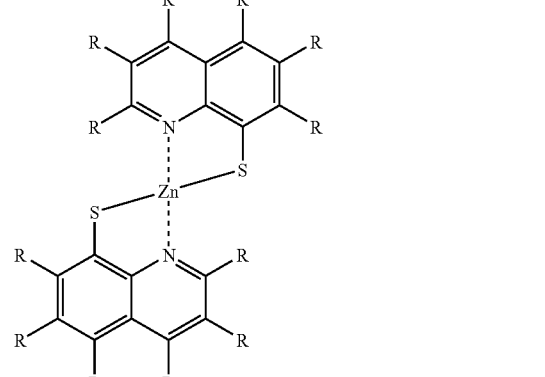
(E-7)
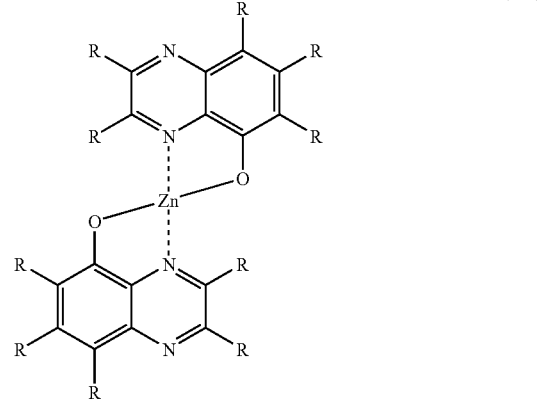
(E-8)
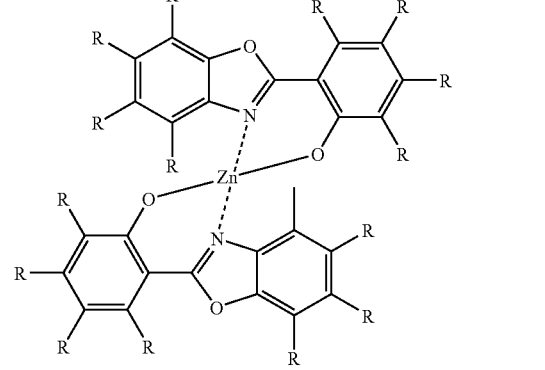

(E-9) 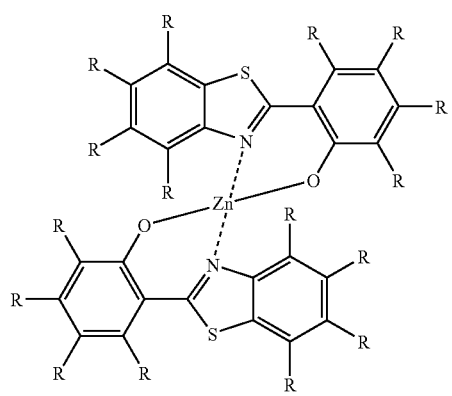
(E-10) 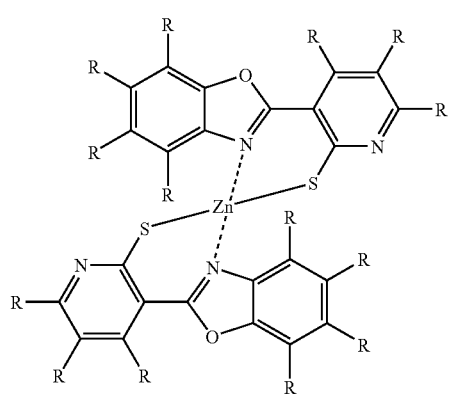
[Formula 12]
(E-11) 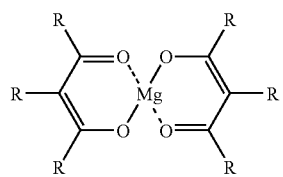
(E-12) 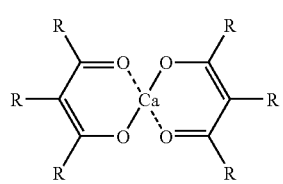
(E-13) 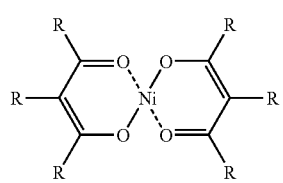
(E-14) 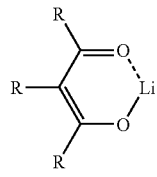
(E-15) 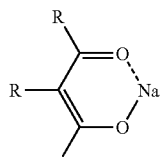
(E-16) 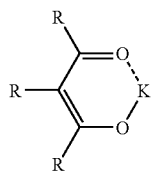
[Formula 13]
(E-17) 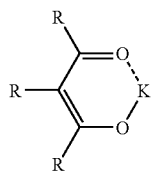
(E-18) 
(E-19) 
(E-20) 

-continued
(E-21)
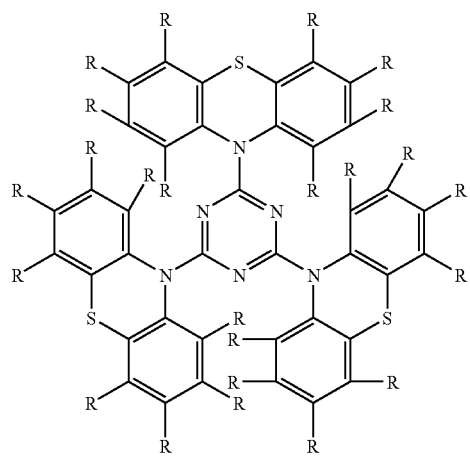
(E-22)
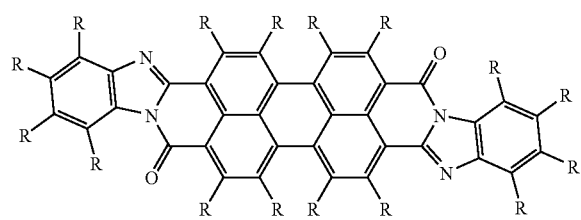
(E-23)
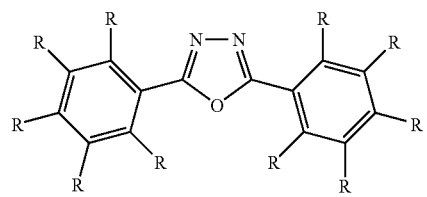
(E-24)
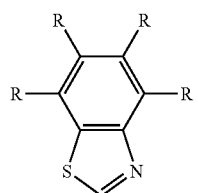
-continued
(E-25)
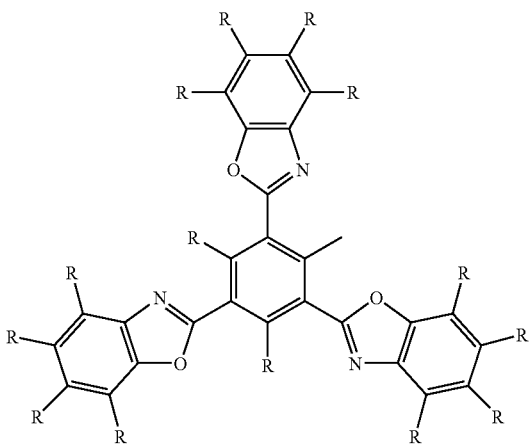
(E-26)
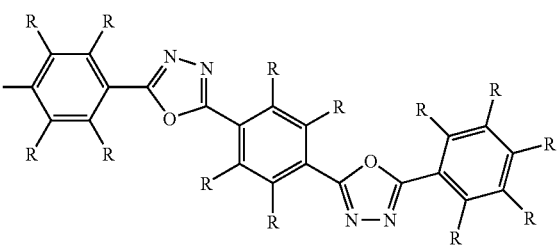
(E-26-1)
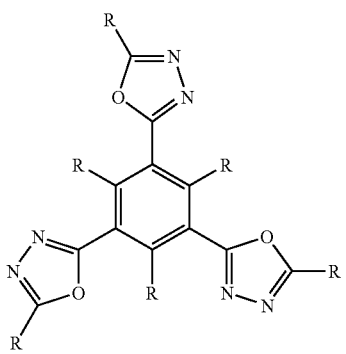
(E-27)
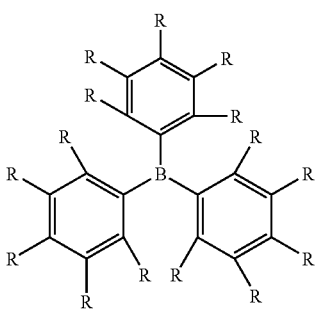
[Formula 14]
(E-28)
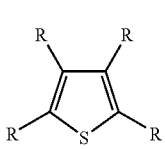

(E-29)
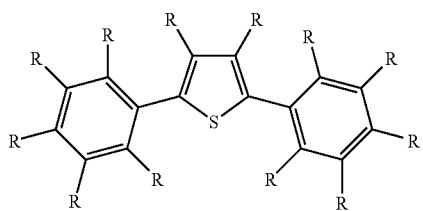
(E-30)
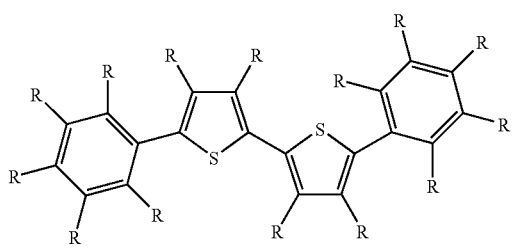
(E-31)
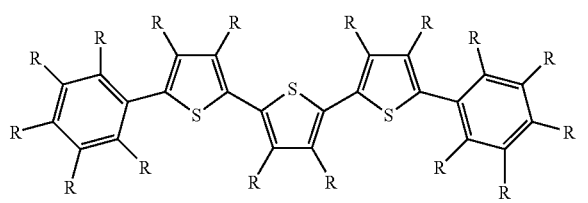
[Formula 15]
(E-32)
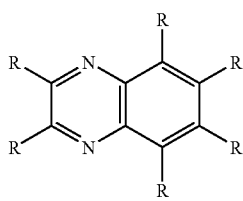
(E-33)
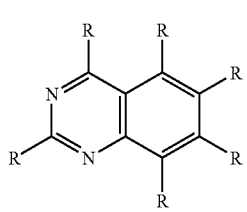
(E-34)
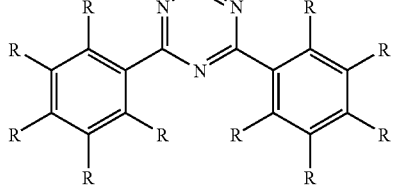
(E-35)
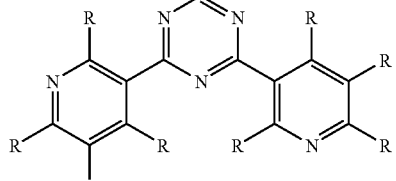
(E-36)
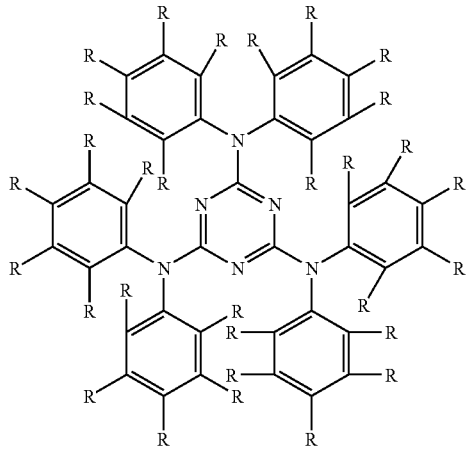
(E-37)
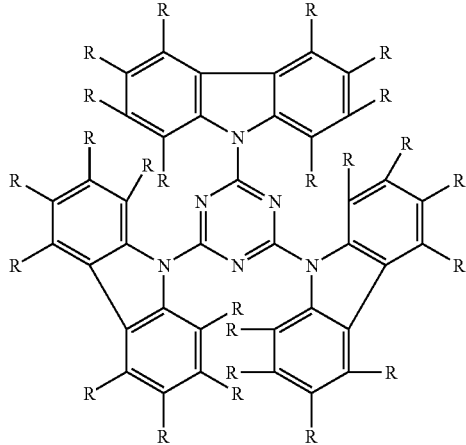

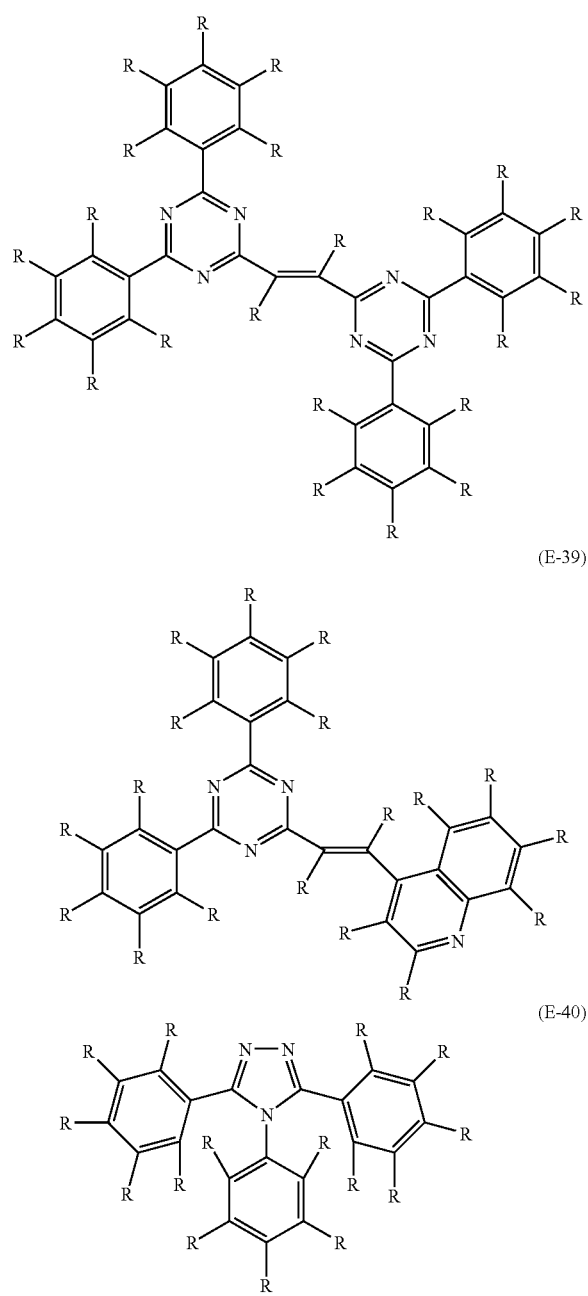

examples of the monovalent complex of a metal except Al and Zn containing at least one hetero atom except a nitrogen atom and an element selected from the group consisting of elements of the second to fourth period of the periodic table include those represented by the following formulas (E-11) to (E-16);

examples of the monovalent group containing at least one hetero atom other than a nitrogen atom and at least one nitrogen atom include those represented by the following formulas (E-17) to (E-27);

examples of the monovalent group containing at least one sulfur atom alone as a hetero atom include those represented by the following formulas (E-28) to (E-31); and examples of the monovalent group containing two or more nitrogen atoms alone as a hetero atom include those represented by the following formulas (E-32) to (E-40).

Examples of the light emitting group containing a condensed polycyclic aromatic hydrocarbon or a heterocyclic ring include a monovalent condensed polycyclic aromatic hydrocarbon group, a monovalent group having two or more condensed polycyclic aromatic hydrocarbon groups joined therein, a monovalent heterocyclic group containing at least one nitrogen atom and/or oxygen atom alone as a hetero atom, and a monovalent heterocyclic group containing at least one sulfur atom as a hetero atom.

Examples of the monovalent condensed polycyclic aromatic hydrocarbon group include the residues obtained by removing a single R or a hydrogen atom on R from the following formulas (L-1) to (L-5);

examples of the monovalent group having two or more condensed polycyclic aromatic hydrocarbon groups joined therein include the residues obtained by removing a single R or a hydrogen atom on R from the following formulas (L-6) to (L-8);

examples of the monovalent heterocyclic group containing at least one nitrogen atom and/or oxygen atom alone as a hetero atom include the residues obtained by removing a single R or a hydrogen atom on R from the following formulas (L-9) to (L-15); and examples of the monovalent heterocyclic group containing at least one sulfur atom as a hetero atom include the residues obtained by removing a single R or a hydrogen atom on R from the following formulas (L-16) to (L-22).

In the formulas (E-1) to (E-40), R can be defined as the same as mentioned with respect to the formulas (H-1) to (H-29).

The electron injection/transport group may be an oligomer or a polymer.

Specific examples thereof may include the residue obtained by removing a single R or a hydrogen atom on R from a compound in which not less than two compounds that may be same or different in type, are joined by carbon-to-carbon to which R is bound, as shown in the aforementioned formulas (E-1) to (E-40).

Examples of the monovalent Al or Zn complex containing at least one hetero atom other than a nitrogen atom include those represented by the following formulas (E-1) to (E-10);

[Formula 16]

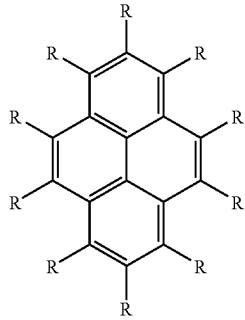

(L-1)

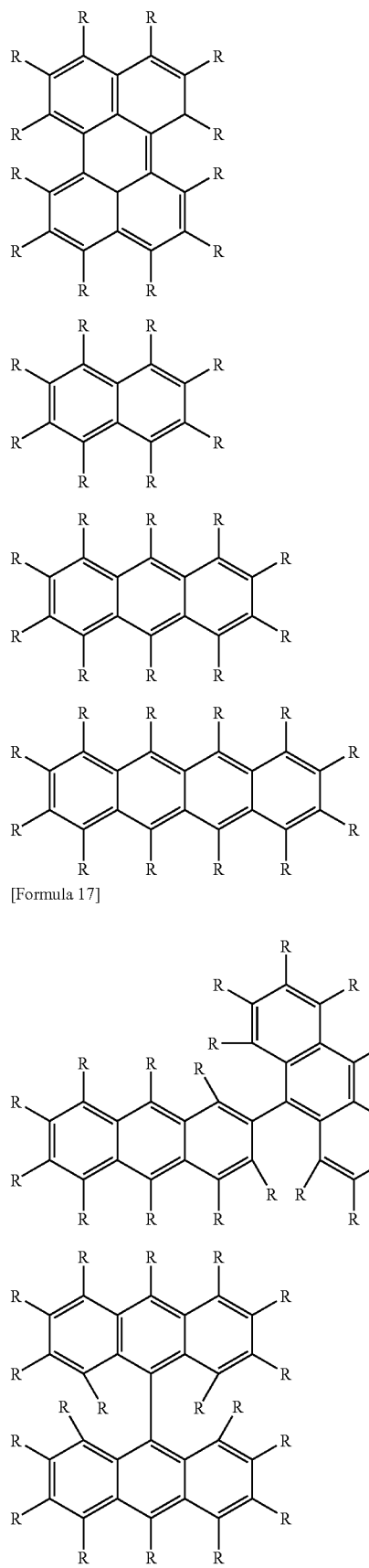
[Formula 17]
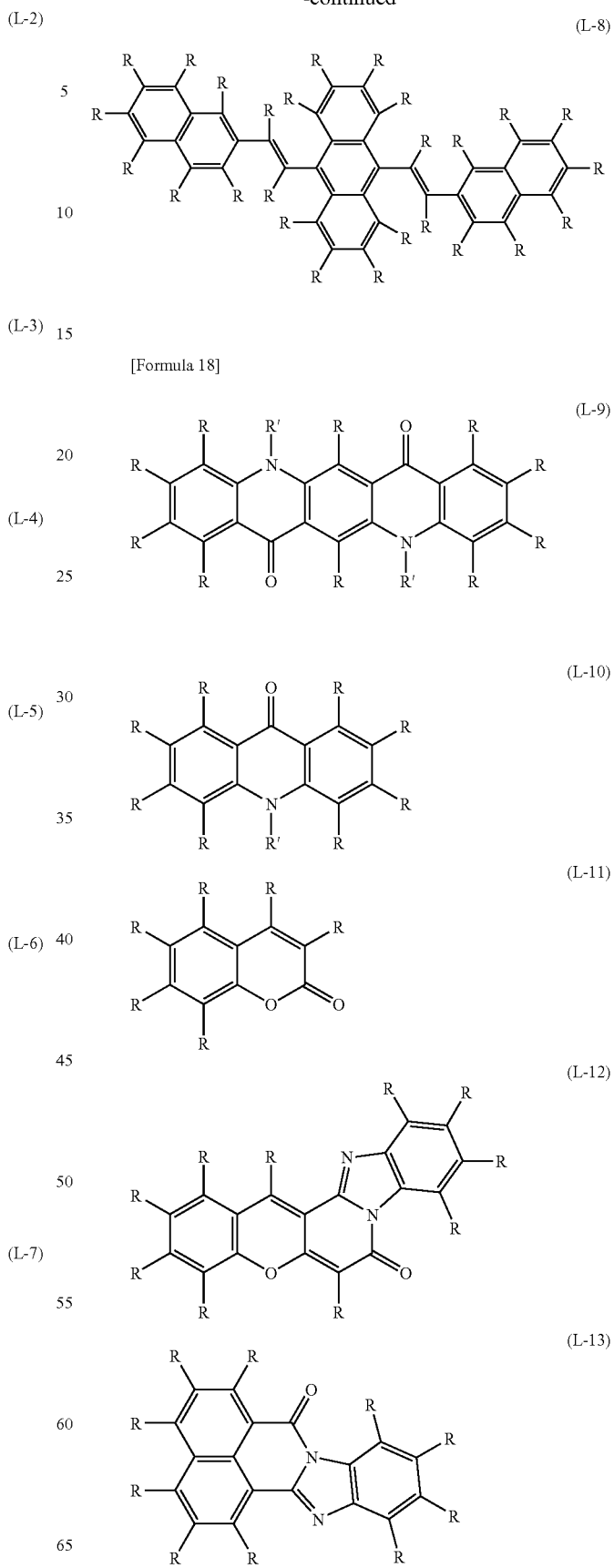
[Formula 18]

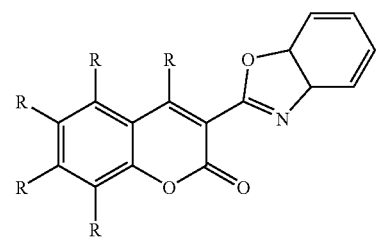
(L-14)

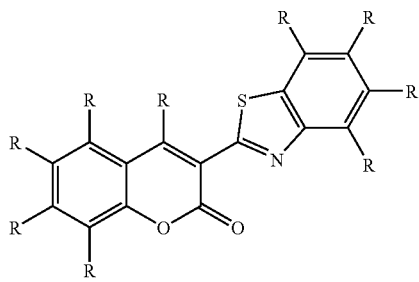
(L-18)

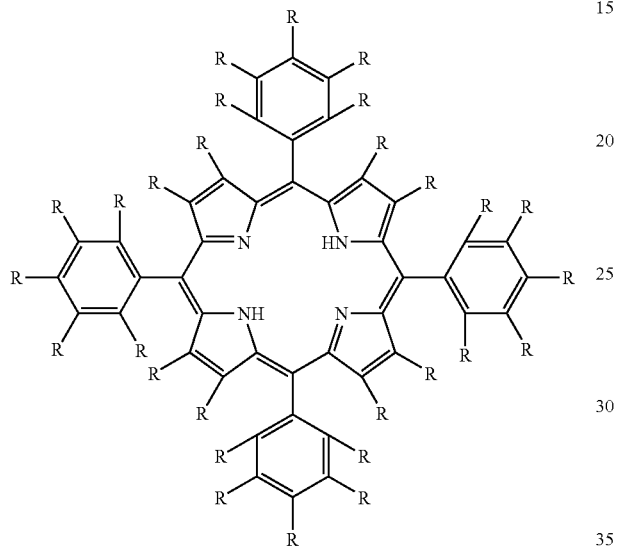
(L-15)

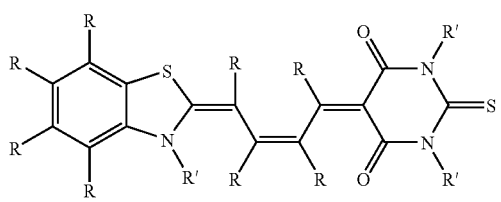
(L-19)

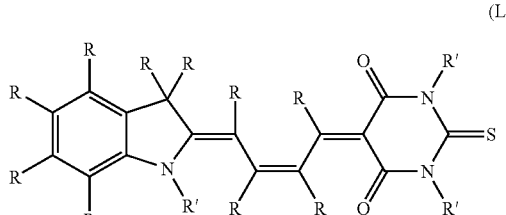
(L-20)

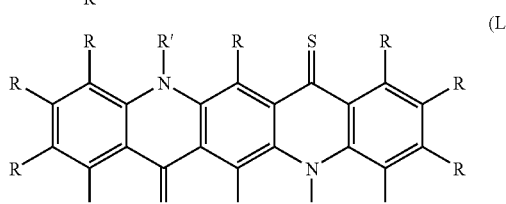
(L-21)

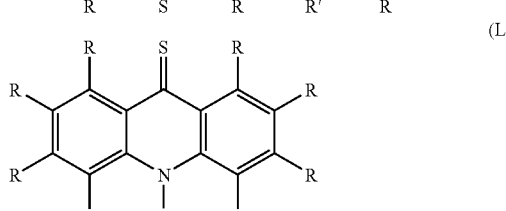
(L-22)

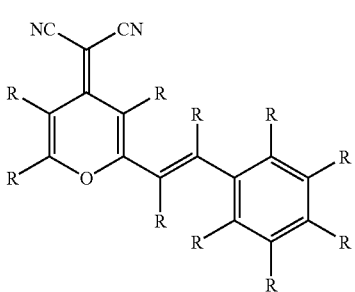
(L-16)

[Formula 19]

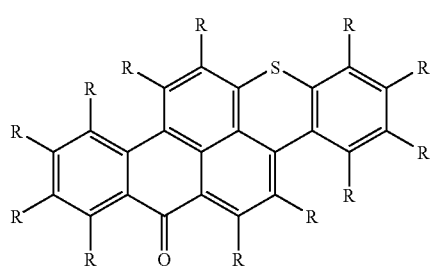
(L-17)

In the formulas (L-1) to (L-22), R can be defined as the same as mentioned with respect to the formulas (H-1) to (H-29).

In the formulas (L-9), (L-10), (L-19) and (L-20), R' can be defined as the same as mentioned with respect to the formula (H-26).

The light-emitting group may be an oligomer and a polymer.

Specific examples thereof may include the residue obtained by removing a single R or a hydrogen atom on R from a compound in which not less than two compounds that may be same or different in type, are joined by carbon-to-carbon to which R is bound, as shown in the aforementioned formulas (L-1) to (E-22).

The functional side chain may be present singly or two or more different functional side chains may be present.

In view of improving hole transportability, the functional side chain is preferably a hole injection/transport group; more preferably a monovalent aromatic amine containing two or more nitrogen atoms, a monovalent carbazole derivative containing two or more nitrogen atoms, a monovalent metal complex containing two or more nitrogen atoms, or a monovalent group containing at least one nitrogen atom and at least one hetero atom other than the nitrogen atom(s); further preferably, a monovalent aromatic amine containing two or more nitrogen atoms, a monovalent carbazole derivative containing two or more nitrogen atoms, or a monovalent metal complex containing two or more nitrogen atoms; and most preferably, a monovalent aromatic amine containing two or more nitrogen atoms, or a monovalent carbazole derivative containing two or more nitrogen atoms.

In view of improving hole injectability/transportability, the functional side chain is preferably a monovalent group represented by the following formula (H-A).

[Formula 20]

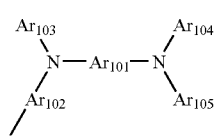
(H-A)

In the formula (H-A), $Ar_{101}$ and $Ar_{102}$ each independently represent an arylene group and a divalent heterocyclic group or a divalent group having a metal complex structure; $Ar_{103}$, $Ar_{104}$ and $Ar_{105}$ each independently represent an aryl group and a monovalent heterocyclic group; $Ar_{102}$, and $Ar_{103}$, and $Ar_{104}$ and $Ar_{105}$ may be mutually jointed to form a ring.

The aryl group and monovalent heterocyclic group are the same as defined above.

The arylene group used herein refers to an atom group obtained by removing two hydrogen atoms from an aromatic hydrocarbon and includes an arylene group having a condensed ring, and an aryl group having two or more independent benzene rings or condensed rings directly joined thereto or joined via a group such as vinylene. The arylene group may have a substituent.

The type of substituent is not particularly limited. In view of solubility, fluorescent properties, ease of synthesis and characteristics of the resultant device, preferable examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group and nitro group.

The number of carbon atoms of the arylene group except a substituent is generally about 6 to 60, and preferably 6 to 20. The total number of carbon atoms of the arylene group including that of a substituent is generally about 6 to 100.

Examples of the arylene group include a phenylene group (for example, the following formulas 1 to 3), naphthalene-diyl group (the following formulas 4 to 13), anthracene-diyl group (the following formulas 14 to 19), biphenyl-diyl group (the following formulas 20 to 25), fluorene-diyl group (the following formulas 36 to 38), terphenyl-diyl group (the following formulas 26 to 28), condensed ring compound group (the following formulas 29 to 35) and indenonaphthalene-diyl (the following formulas G to N).

[Formula 21]

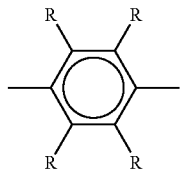
1

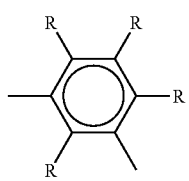
2

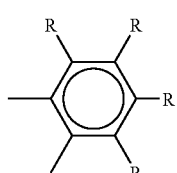
3

4

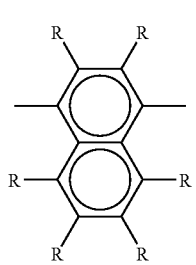
5

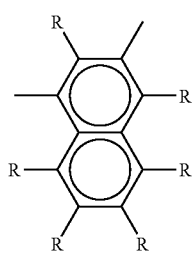
6

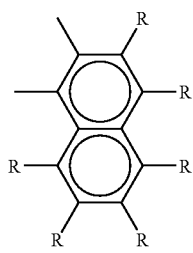

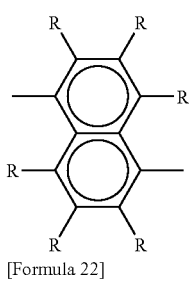
[Formula 22]
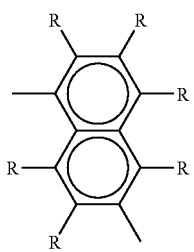
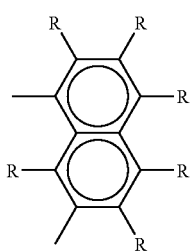
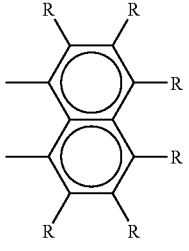
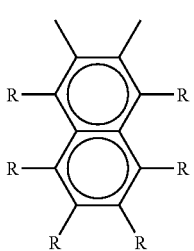
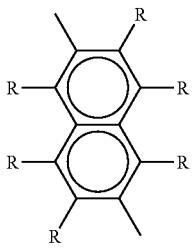
7
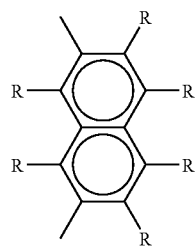
8
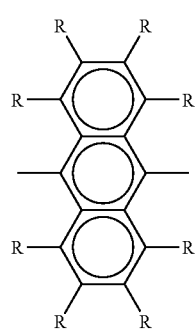
9
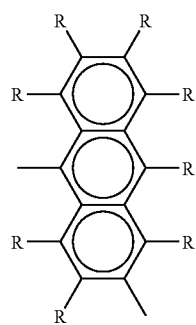
10
[Formula 23]
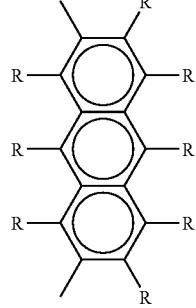
11
12
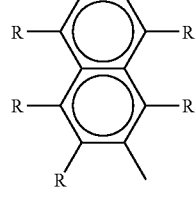

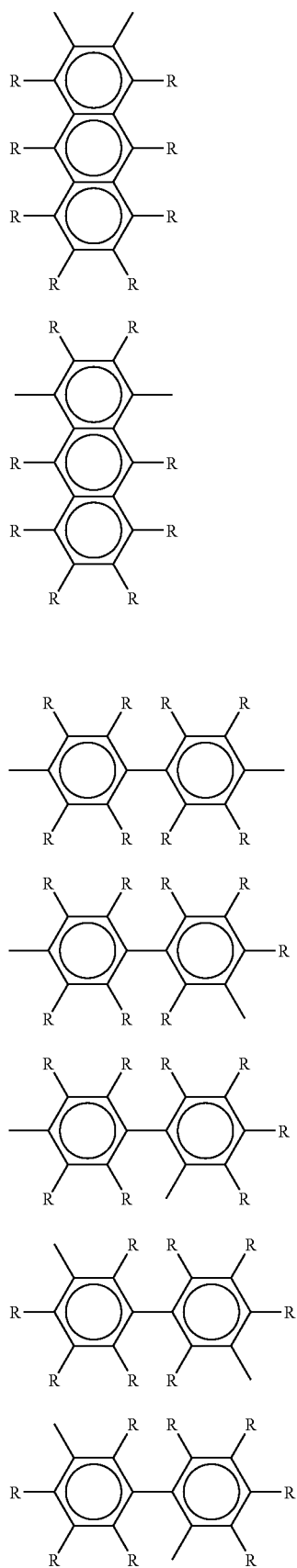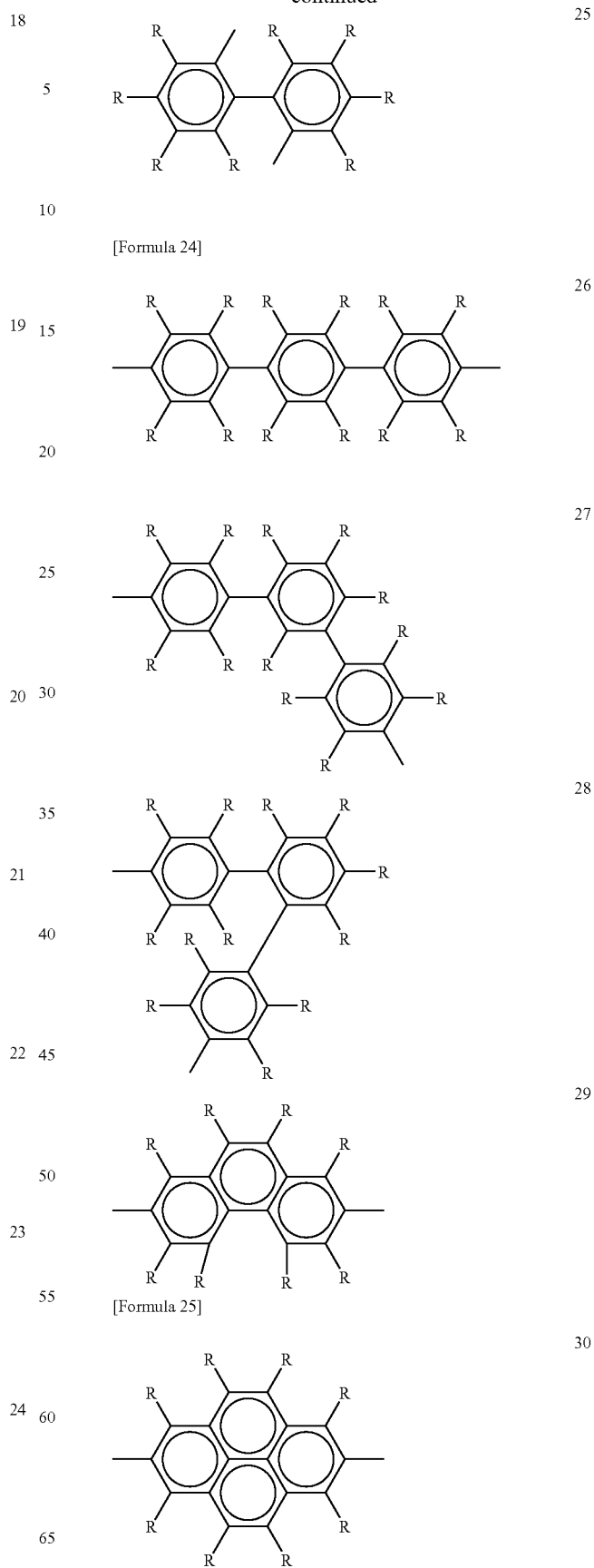
[Formula 24]
[Formula 25]

31
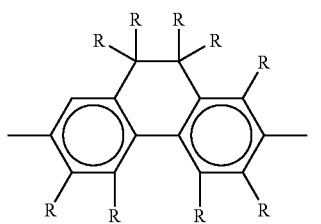
32
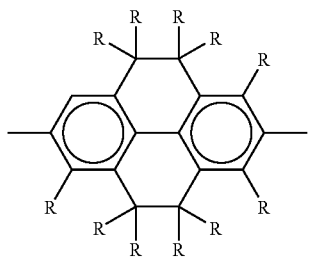
33
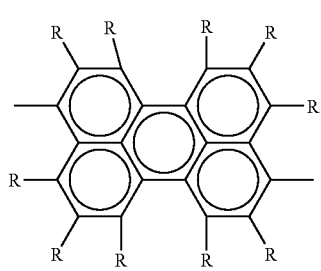
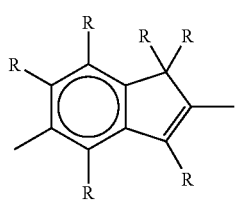
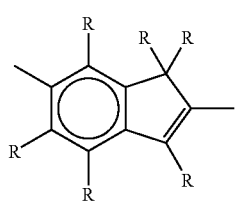
36
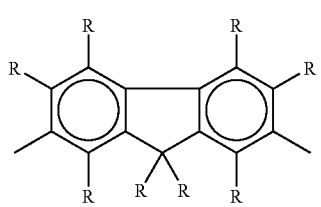
37
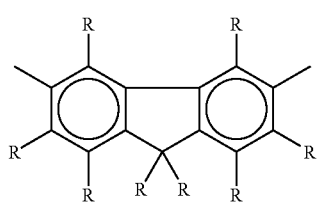
38
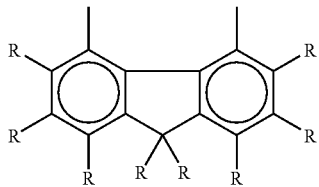
[Formula 26]
G
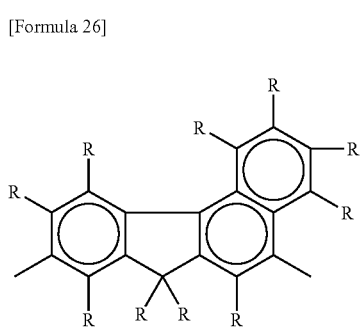
H
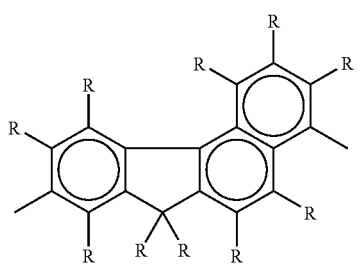
I
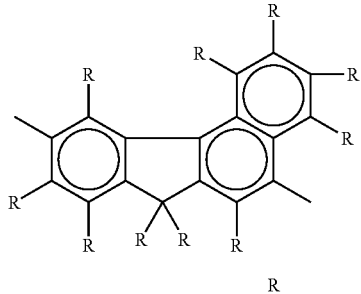
J
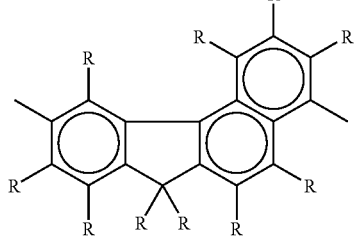
K
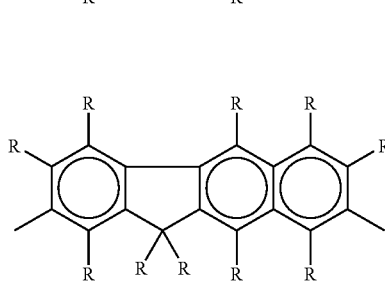

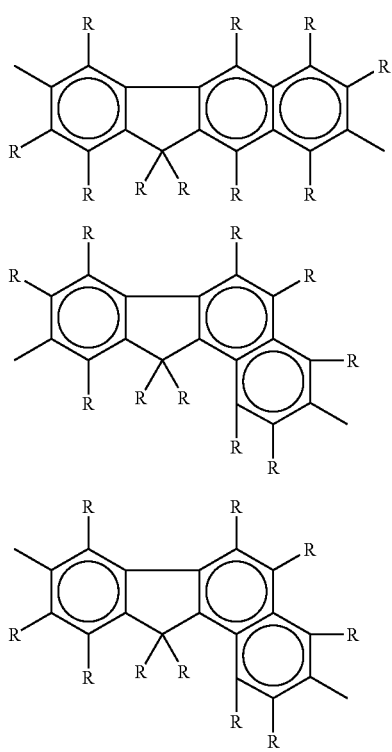

The divalent heterocyclic group refers to the remaining atom group obtained by removing two hydrogen atoms from a heterocyclic compound and may have a substituent.

The heterocyclic compound refers to an organic compound having a ring structure which may not be necessarily constituted of carbon atoms alone and may include a hetero atom such as oxygen, sulfur, nitrogen, phosphorus, boron or arsenic. Of the divalent heterocyclic groups, an aromatic heterocyclic group is preferable. The type of substituent is not particularly limited; however, in view of solubility, fluorescent properties, ease of synthesis and characteristics of the resultant device, preferable examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group and nitro group.

The number of carbon atoms of the divalent heterocyclic group except that of a substituent is generally about 3 to 60. The total number of carbon atoms of the divalent heterocyclic group including that of a substituent is generally about 3 to 100.

Examples of the divalent heterocyclic group include divalent pyridine-diyl groups (the following formulas 39 to 44),
  diazaphenylene groups (the following formulas 45 to 48), quinolinediyl groups (the following formulas 49 to 63), quinoxalinediyl groups (the following formulas 64 to 68), acridinediyl groups (the following formulas 69 to 72),
  bipyridyldiyl groups (the following formulas 73 to 75), andphenanthrolinediyl groups (the following formulas 76 to 78) containing nitrogen as a hetero atom;

groups having a fluorene structure and containing oxygen, silicon, nitrogen or selenium, etc., as a hetero atom (the following formulas 79 to 93);

5-membered heterocyclic groups containing oxygen, silicon, nitrogen, sulfur, selenium, boron or phosphorus, etc., as a hetero atom (the following formulas 94 to 98, O to Z, and AA to AC);

5-membered condensed heterocyclic groups containing oxygen, silicon, nitrogen, sulfur or selenium, etc., as a hetero atom (the following formulas 99 to 110);

dimmers or oligomers formed of 5-membered heterocyclic groups containing oxygen, silicon, nitrogen, sulfur or selenium, etc., as a hetero atom and joined at the α-position of the hetero atom the following formulas 111 and 112);

5-membered heterocyclic groups containing oxygen, silicon, nitrogen, sulfur or selenium, etc., as a hetero atom and joined to a phenyl group at the α-position of the hetero atom (the following formulas 113 to 119);

5-membered condensed heterocyclic groups containing oxygen, silicon, nitrogen, sulfur or selenium, etc., as a hetero atom and substituted with a phenyl group, furyl group, thienyl group (the following formulas 120 to 125); and 6-membered heterocyclic groups (the following formulas AD to AG) containing oxygen and nitrogen as hetero atoms.

[Formula 27]

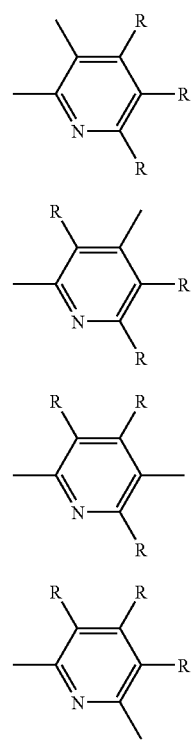

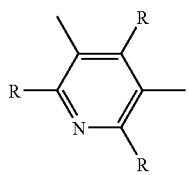 44
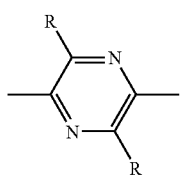 45
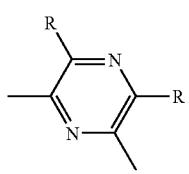 46
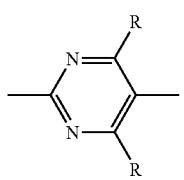 47
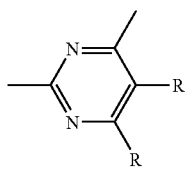 48
[Formula 28]
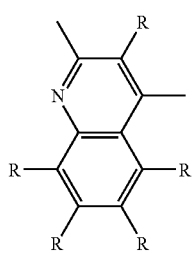 49
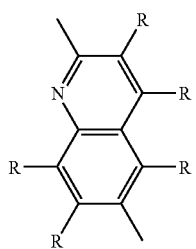 50
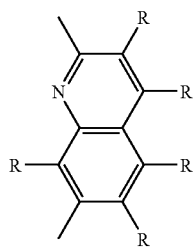 51
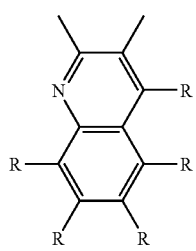 52
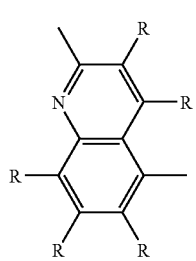 53
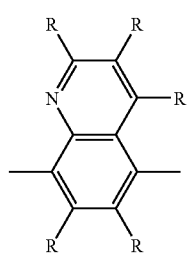 54
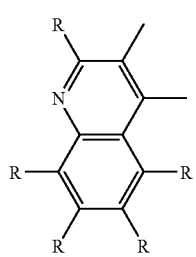 55
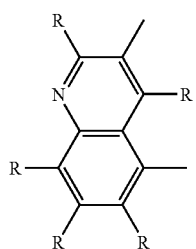 56

-continued
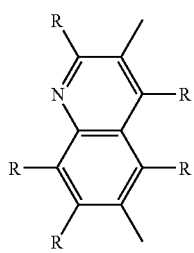
57
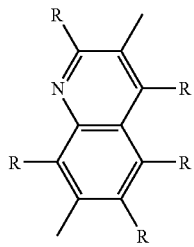
58
[Formula 29]
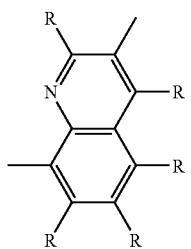
59
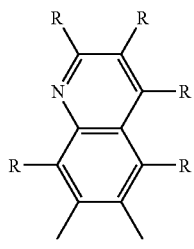
60
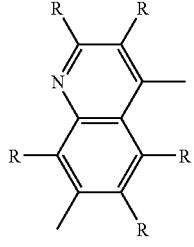
61
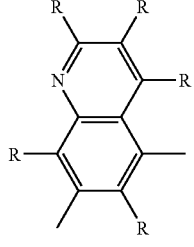
62
-continued
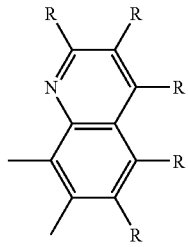
63
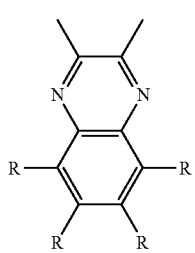
64
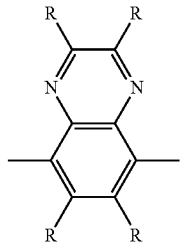
65
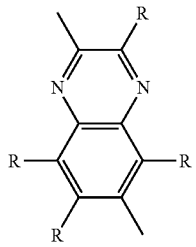
66
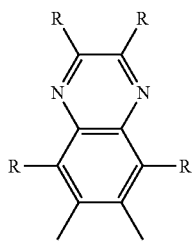
67
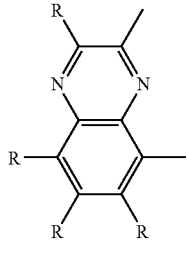
68

[Formula 30]
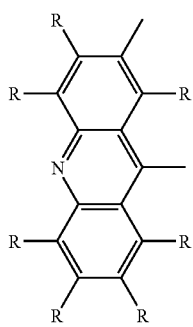
69
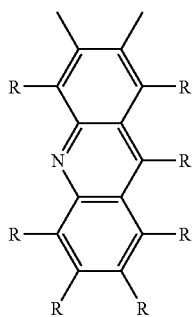
70
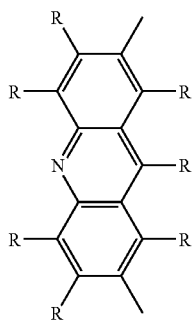
71
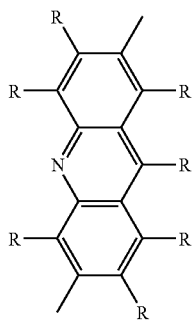
72
[Formula 31]
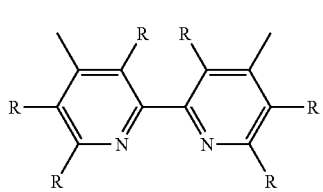
73
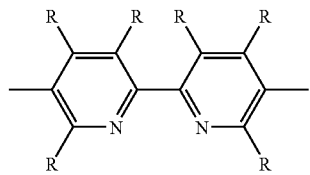
74
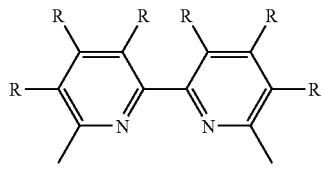
75
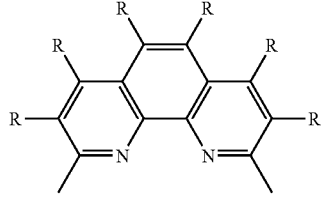
76
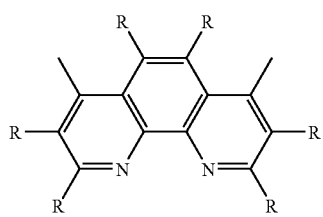
77
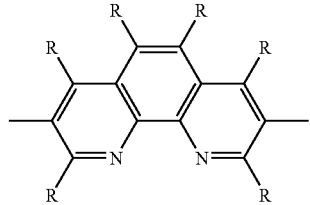
78
[Formula 32]
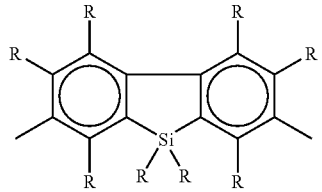
79
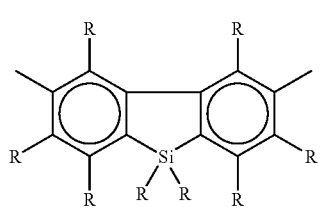
80
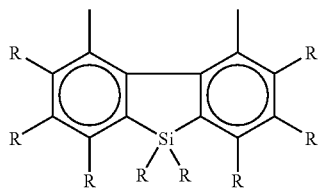
81

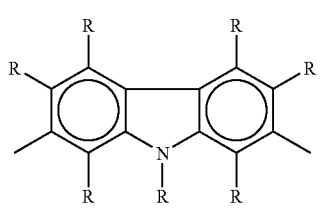
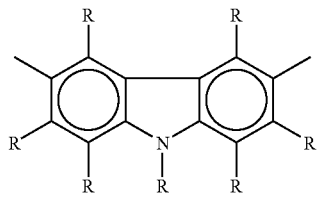
[Formula 33]
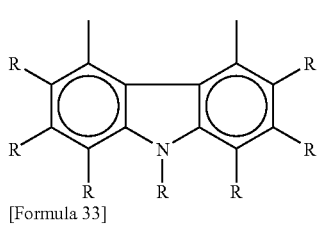
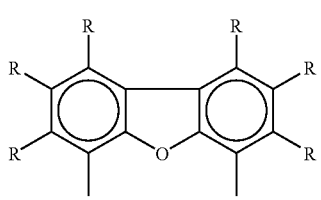
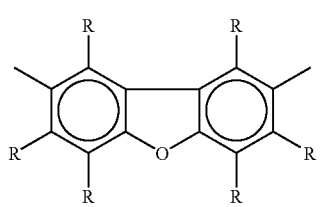
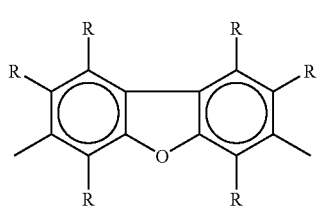
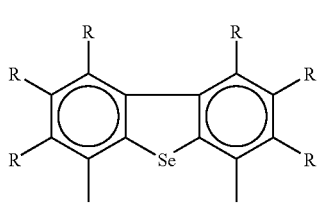
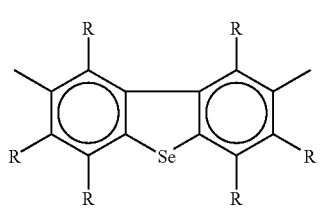
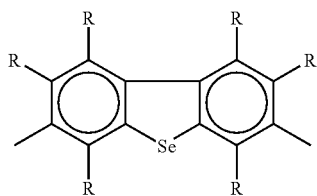
[Formula 34]
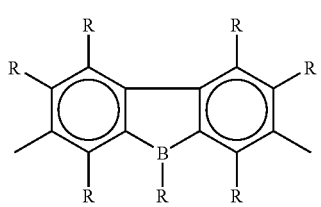
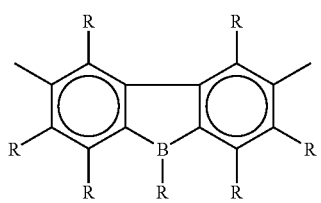
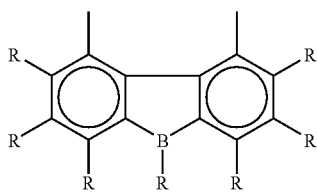
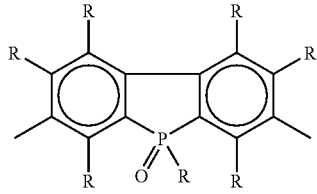
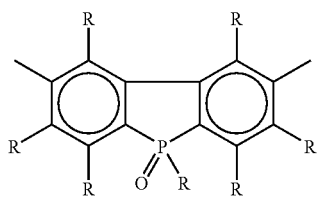

[Formula 35]
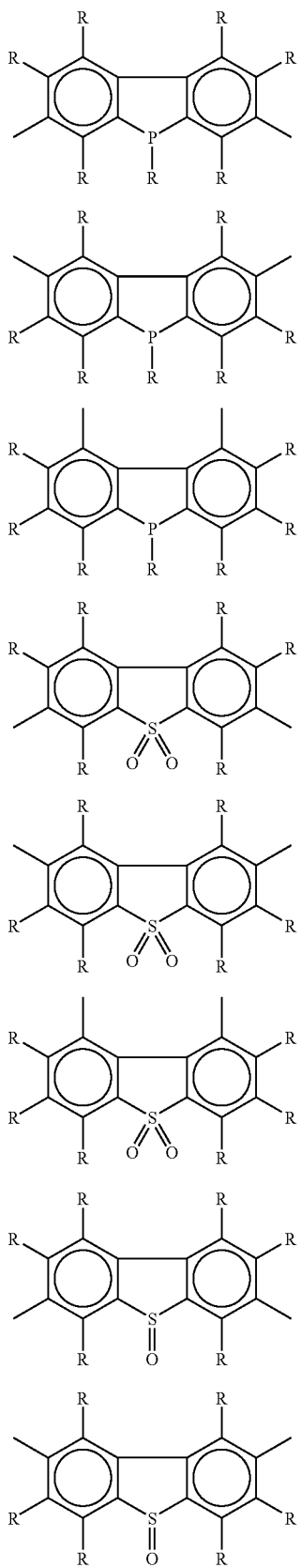
[Formula 36]
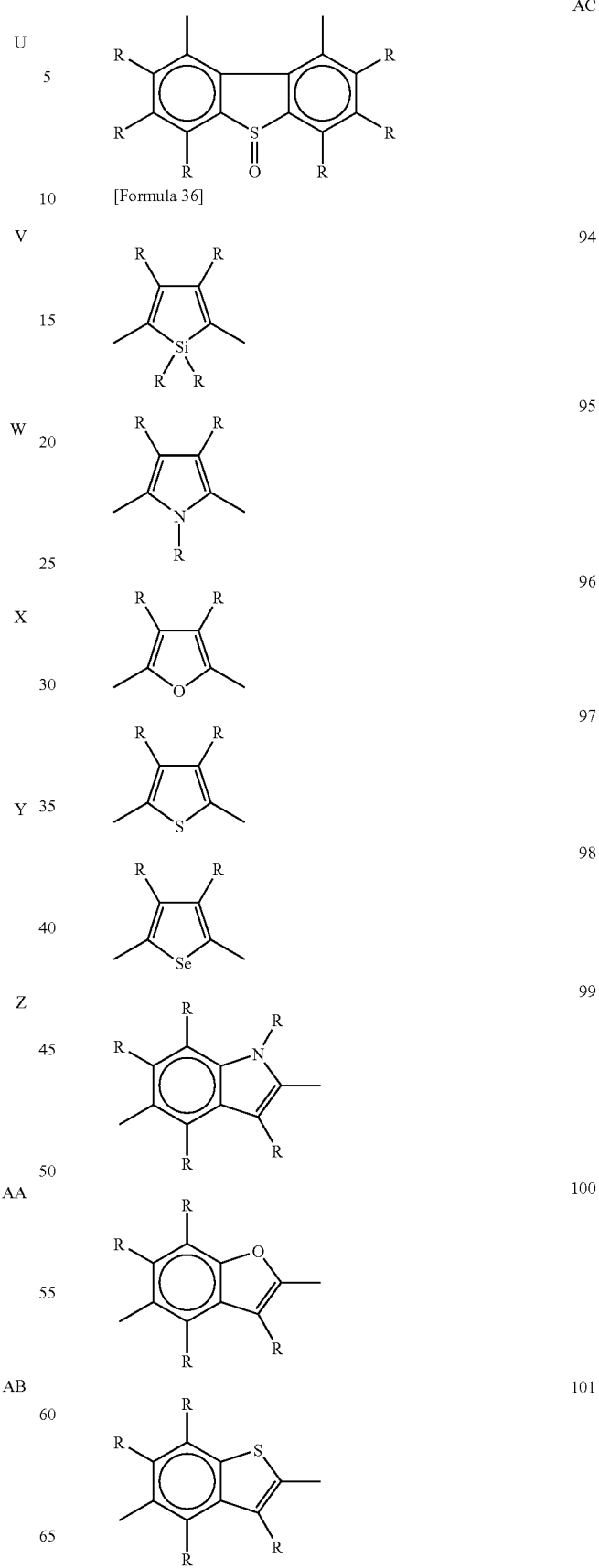

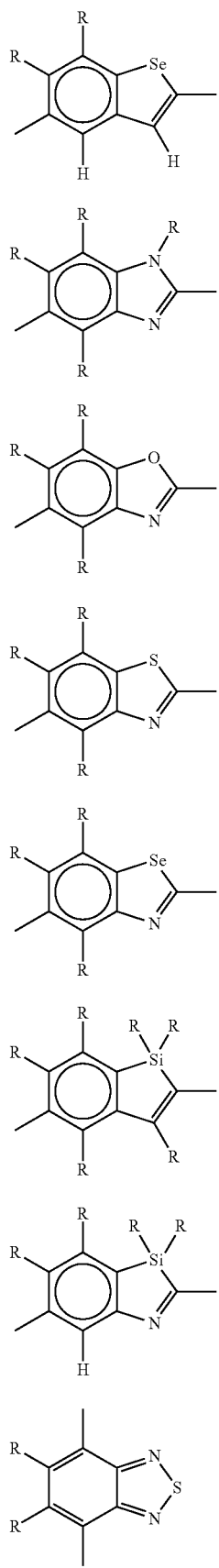
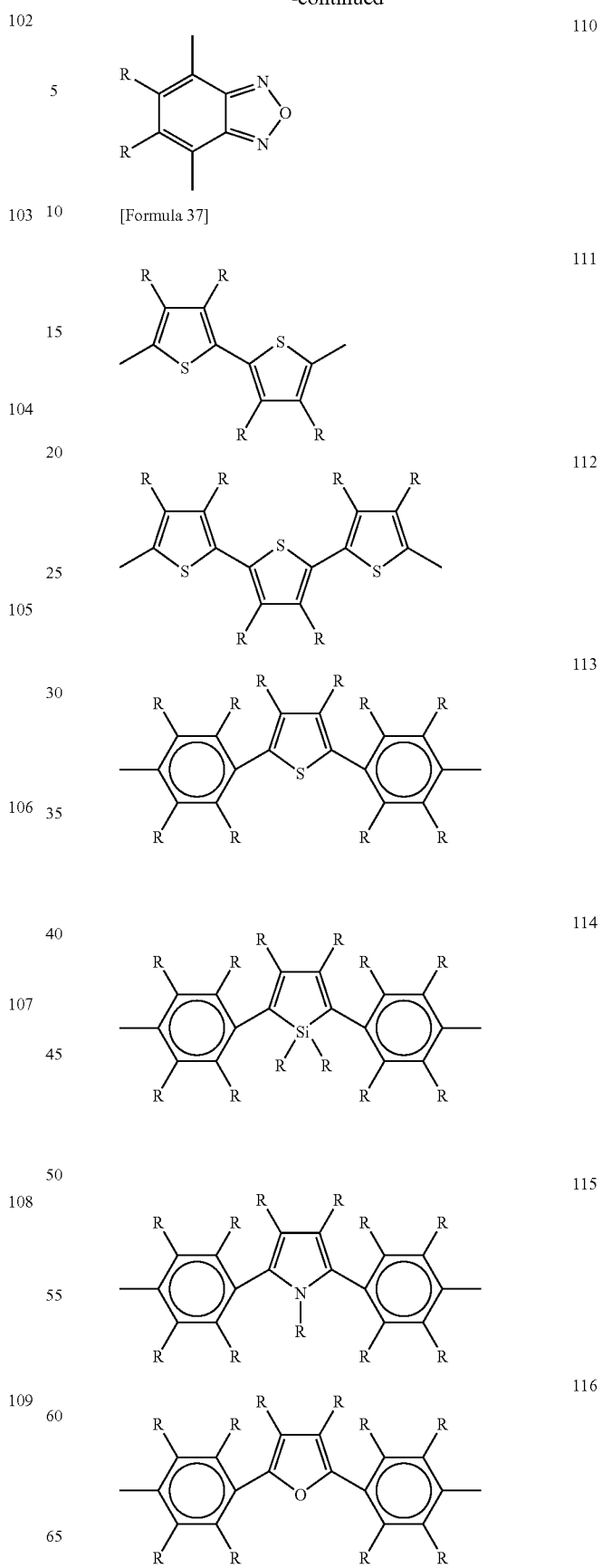
[Formula 37]

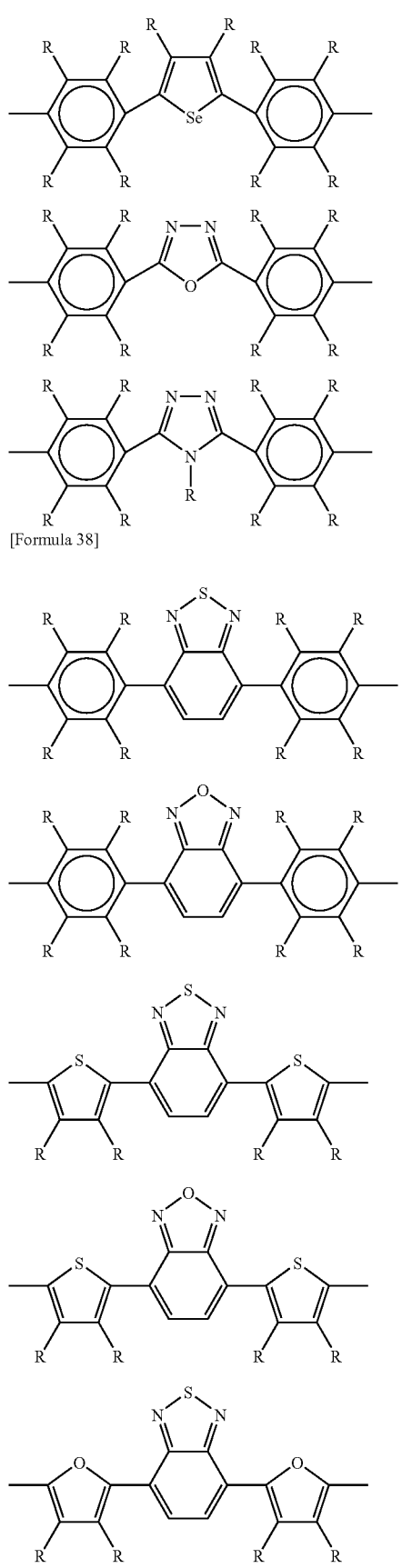

[Formula 38]

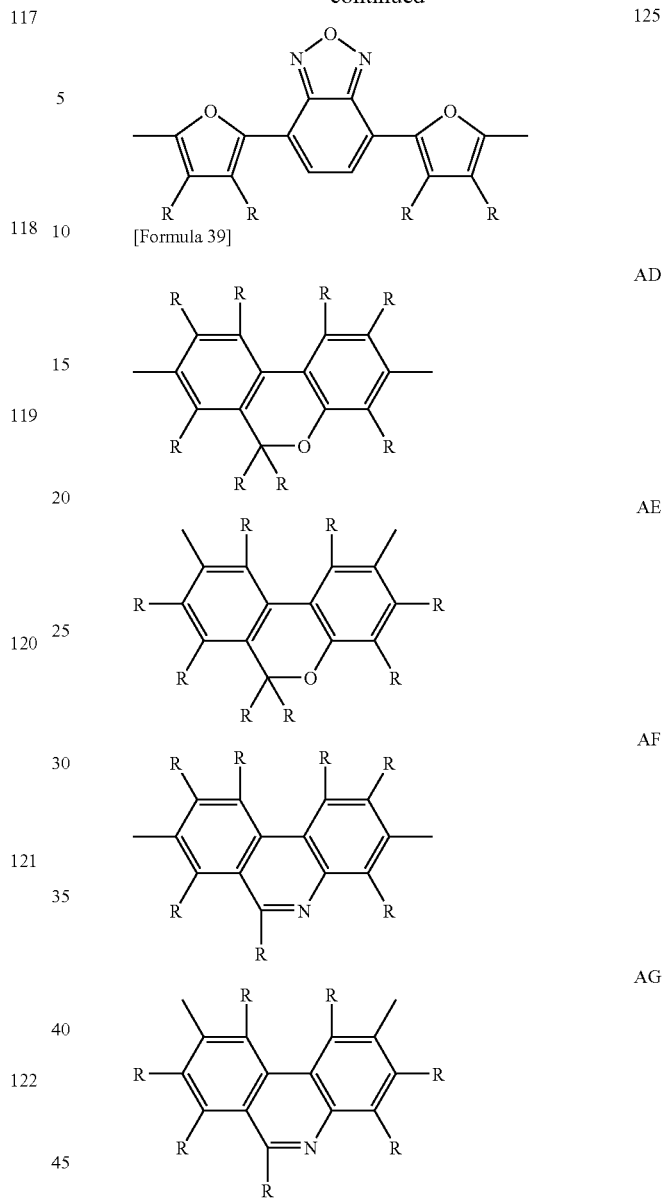

[Formula 39]

The divalent group having a metal complex structure in $Ar_1$ refers to a divalent group obtained by removing two hydrogen atoms from an organic ligand of a metal complex having the organic ligand.

The number of carbon atoms of the organic ligand is generally about 4 to 60. Examples thereof include 8-quinolinol and a derivative thereof, benzoquinolinol and a derivative thereof, 2-phenyl-pyridine and a derivative thereof, 2 phenyl-benzothiazole and a derivative thereof, 2 phenyl-benzoxazole and a derivative thereof, and porphyrin and a derivative thereof.

Examples of the core metal of the complex include aluminum, zinc, beryllium, iridium, platinum, gold, europium and terbium.

Examples of the metal complex having an organic ligand include metal complexes known as a low-molecular weight fluorescent material and phosphorescent material and triplet light-emitting complexes.

Specific examples of the divalent group having a metal complex structure include those represented by the following formulas 126 to 132.
[Formula 40]
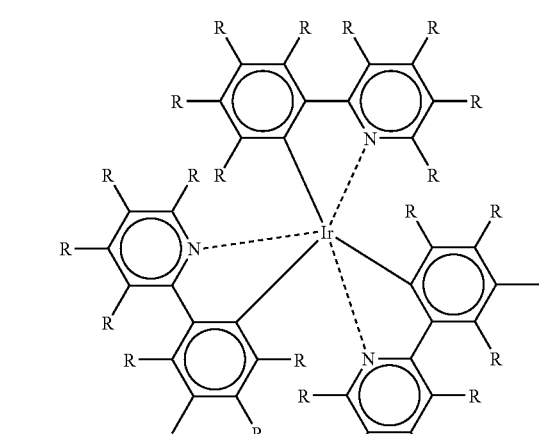
126
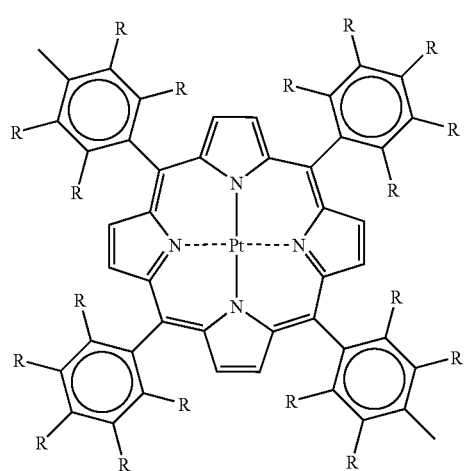
127
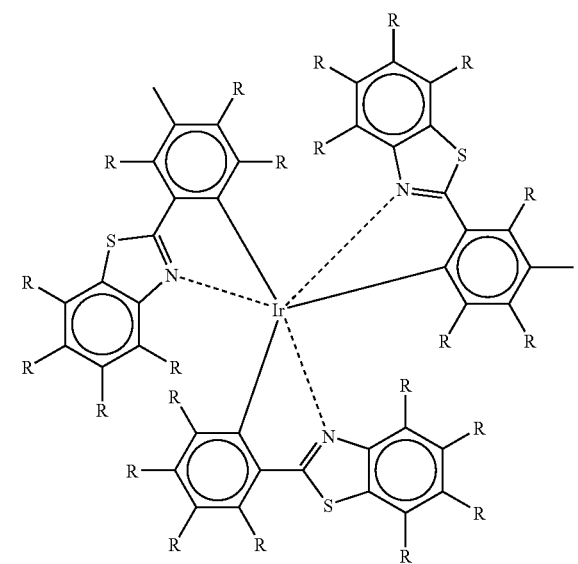
128
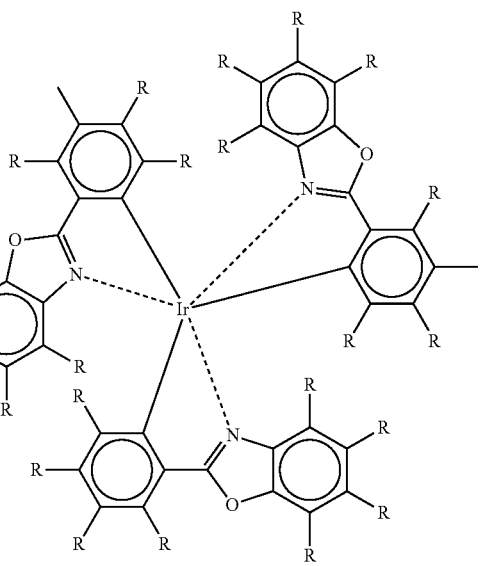
129
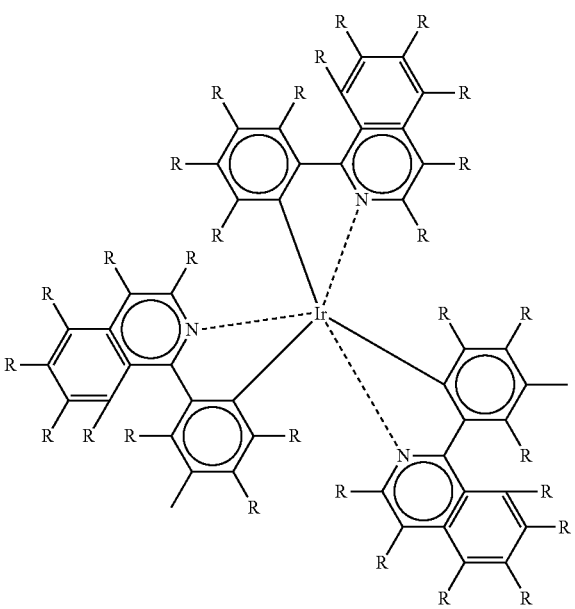
130

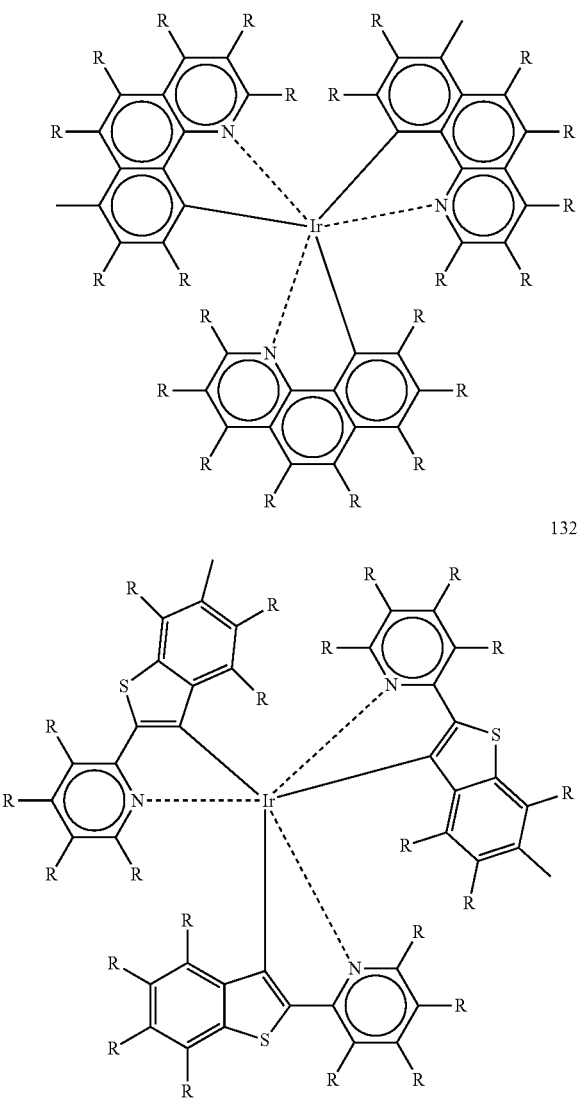

In the aforementioned formulas 1 to 132, R can be defined as the same as mentioned with respect to the formulas (H-1) to (H-29).

In view of synthesis, $Ar_{102}$ preferably an arylene group, and further preferably, a group represented by any one of the formulas 1 to 19.

In view of synthesis, $Ar_{103}$, $Ar_{104}$, and $Ar_{105}$ are preferably each independently an aryl group, and further preferably, a phenyl group, 1-naphthyl group, 2-naphthyl groups, 1-anthracenyl group, 2-anthracenyl group or 9-anthracenyl group.

In view of synthesis, $Ar_{101}$ is preferably an arylene group.

When $Ar_{102}$ and $Ar_{103}$, and $Ar_{104}$ and $Ar_{105}$ each form a ring, the ring is preferably formed via -JJ-(-JJ- represents direct bonding, —O—, —S— and —CH$_2$—).

In view of improving electron transportability, a functional side chain is preferably an electron injection/transport group; more preferably a monovalent Al or Zn complex containing at least one hetero atom other than a nitrogen atom;

a monovalent complex except Al and Zn complexes containing at least one hetero atom except a nitrogen atom and en element selected from the group consisting of the elements of the second to fourth period of the periodic table;

a monovalent group containing at least one sulfur atom alone as a hetero atom; or a monovalent group containing two or more nitrogen atoms alone as a hetero atom; and further preferably a monovalent Al or Zn complex containing at least one hetero atom other than a nitrogen atom;

a monovalent group containing at least one sulfur atom alone as a hetero atom; or a monovalent group containing two or more nitrogen atoms alone as a hetero atom.

Furthermore, in view of improving electron transportability, a functional side chain is preferably a monovalent group represented by any one of the following formulas (E-A) to (E-C).

[Formula 41]

 (E-A)

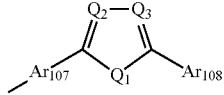 (E-B)

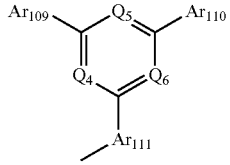 (E-C)

In the formulas (E-A) to (E-C), $Ar_{107}$ to $Ar_{111}$ are each independently an arylene group, a divalent heterocyclic group or a divalent group having a metal complex structure; $Ar_{106}$, $Ar_{108}$, $Ar_{109}$ and $Ar_{110}$ are each independently an aryl group and a monovalent heterocyclic group; $Q_1$ is an oxygen atom, sulfur atom or —N($R_{101}$)—; $Q_2$, $Q_3$, $Q_4$ $Q_5$, and $Q_6$ represents a nitrogen atom or —C($R_{102}$)—; and $R_{101}$ and $R_{102}$ are the same groups as those defined above in the case of R.

The arylene group, divalent heterocyclic group, divalent group having a metal complex structure, aryl group and monovalent heterocyclic group are the same as defined above.

In view of improving electron injectability/transportability, $Ar_{106}$ of the aforementioned formula (E-A) is preferably a monovalent heterocyclic group.

In view of synthesis, $Ar_{107}$ of the aforementioned formula (E-B) is preferably a divalent heterocyclic group and any one of the groups represented by the formulas 39 to 72 and 111 to 125.

Furthermore, in view of synthesis, $Ar_{108}$ of the aforementioned formula (E-B) is preferably a monovalent heterocyclic group.

Furthermore, in view of synthesis, $Ar_{109}$ and $Ar_{110}$ of the aforementioned formula (E-C) are preferably each independently an aryl group, and further preferably, a phenyl group, 1-naphthyl group, 2-naphthyl group, 1-anthracenyl group, 2-anthracenyl group, or 9-anthracenyl group.

Furthermore, in view of synthesis, $A_{111}$ is preferably an arylene group, and further preferably, any one of the groups represented by the formulas 1 to 19.

In view of improving an electron injectability/transportability, of the formulas (E-A) to (E-C), the formulas (E-A) and (E-B) are preferable and the formula (E-B) is further preferable.

In view of improving light emission efficiency, a functional side chain is preferably a light-emitting group;
more preferably,
a monovalent condensed polycyclic aromatic hydrocarbon group,
a monovalent group having two or more condensed polycyclic aromatic hydrocarbon groups joined therein, or
a monovalent heterocyclic group containing at least one nitrogen atom and/or oxygen atom alone as a hetero atom; and further preferably,
a monovalent group having two or more condensed polycyclic aromatic hydrocarbon groups joined therein, or
a monovalent heterocyclic group containing at least one nitrogen atom and/or oxygen atom alone as a hetero atom.

In view of improving light emission efficiency, a functional side chain is preferably a monovalent group containing a partial structure represented by (L-A) or (L-B).

[Formula 42]

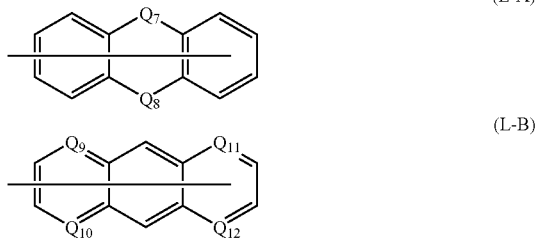

In the formula (L-A) or (L-B), $Q_7$ and $Q_8$ represent an oxygen atom, sulfur atom, $-C(R_{103}R_{104})-$, $-Si(R_{105}R_{106})-$, $-N(R_{107})-$, $-C(=O)-$, or $-S(=O)-$; $Q_9$, $Q_{10}$, $Q_{11}$ and $Q_{12}$ represent a nitrogen atom or $-C(R_{108})-$; and $R_{103}$ to $R_{108}$ represent the same groups as those defined above in the case of R.

In view of improving light emission efficiency, $Q_7$ and $Q_8$ represent an oxygen atom, $-C(R_{103}R_{104})-$, $-N(R_{107})-$ and $-C(=O)-$; and further preferably, an oxygen atom, $-N(R_{107})-$, and $-C(=O)-$.

In view of improving light emission efficiency, $Q_9$, $Q_{10}$, $Q_{11}$ and $Q_{12}$ are preferably $-C(R_{108})-$.

A polymer compound according to the present invention is characterized in that a functional group contained in a functional side chain is directly bonded to a saturated carbon of a fluorenediyl group or bonded to the fluorenediyl group via $-R_k-X-$ ($R_k$ represents an alkylene group and X represents a direct bond or bonding group) at X.

The "functional group is directly bonded to a saturated carbon of a fluorenediyl group" means that a functional group of the functional side chain is directly bonded to the 9th carbon atom of the fluorenediyl group shown in the following formula.

[Formula 43]

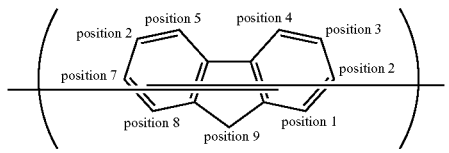

When a functional group is bonded to the fluorenediyl group via $-R_k-X-$ at X, $R_k$ represents an alkylene group.

The alkylene group may have a substituent and generally has about 1 to 12 carbon atoms. Examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group and cyano group. Note that the number of carbon atoms of the alkylene group does not include the number of a substituent(s).

Preferable examples of the alkylene group include $-C_3H_6-$, $-C_4H_8-$, $-C_6H_{10}-$, $-C_6H_{12}-$, $-C_8H_{16}-$, and $-C_{10}H_{20}-$.

Furthermore, X represents a bonding group. Examples of the bonding group include $-O-$, $-S-$, $-CO-$, $-CO_2-$, $-SO-$, $-SO_2-$, $-SiR^1R^2-$, $-BR^4-$, $-PR^5-$ and $-P(=O)(R^6)-$. Bonding groups $-O-$, $-S-$ and $-NR^3-$ are preferable and $-O-$ and $-NR^3-$ are more preferable.

$R^1$ to $R^6$ herein represent a hydrogen atom, alkyl group, aryl group, arylalkyl group or a monovalent heterocyclic group.

In view of synthesis, the 9th position of a fluorenediyl group is preferably substituted with a functional group.

In view of synthesis, a functional group is preferably directly bonded to the 9th position of a fluorenediyl group and further preferably has two functional substituents at the 9th position of a fluorenediyl group.

One of the desirable characteristics of a polymer compound for a polymer LED is hole injectability. The hole injectability generally depends upon the energy value of the highest occupied molecular orbital (HOMO) of a polymer compound. The smaller the absolute value of the HOMO energy, the better the hole injectability. In a polymer compound according to the present invention, in view of hole injectability, the absolute value of the HOMO energy is preferably 5.6 eV or less; further preferably, 5.5 eV or less; and most preferably, 5.4 eV or less.

The HOMO energy is obtained by measuring the oxidation potential of a polymer compound by use of cyclic voltammetry (CV) and calculating the energy based on the value of oxidation potential. In the case of a polymer compound according to the present invention, the oxidation potential takes a negative value. The lower the oxidation potential (the larger the absolute value of the oxidation potential), the smaller the absolute value of HOMO energy. Thus, the hole injectability is improved.

One of the desirable characteristics of a polymer compound for a polymer LED is electron injectability. The electron injectability generally depends upon the energy value of the lowest unoccupied molecular orbital (LUMO) of a polymer compound. The larger the absolute value of the LUMO energy value, the better the electron injectability. In a polymer compound according to the present invention, in view of electron injectability, the absolute value of the LUMO energy is preferably 2.2 eV or more; further preferably, 2.4 eV or more; and most preferably, 2.5 eV or more.

Similarly to the case of the HOMO energy calculation, the LUMO energy is obtained by measuring the reduction potential of a polymer compound by use of cyclic voltammetry (CV) and calculating the energy based on the value of reduction potential. In the case of a polymer compound according to the present invention, the reduction potential takes a negative value. The higher the reduction potential (the smaller the absolute value of the reduction potential), the larger the absolute value of LUMO energy. Thus, the electron injectability is improved.

A polymer compound according to the present invention, in view of life property of a device, the number average molecular weight in terms of polystyrene is preferably $10^3$ to $10^8$; more preferably, $10^3$ to $10^7$; and most preferably, $10^4$ to $10^7$.

The number average molecular weight and the weight average molecular weight used herein were obtained in terms of polystyrene in accordance with size exclusion chromatography (SEC)(LC-10Avp manufactured by Shimadzu Corporation). The polymer to be measured was dissolved in tetrahydrofuran so as to obtain a concentration of about 0.5 wt %. 50 µl of the resultant solution was poured in GPC. Tetrahydrofuran was used as the mobile phase of the GPC and supplied at a flow rate of 0.6 mL/min. The column was prepared by serially connecting two columns of TSKgel SuperHM-H (manufactured by Tosoh Corporation) directly to a single column of TSKgel Super H2000 (manufactured by Tosoh Corporation). As a detector, a differential refractive index detector (RID-10A, manufactured by Shimadzu Corporation) was used.

Preferable examples of the polymer compound to be used in the present invention will be described herein.

In view of light emission efficiency, durability of a device and ease of synthesis, the repeat unit of the main chain is the following formulas (1-1-1), to (1-1-6) or (1-2-1) to (1-2-6) are preferable.

The polymers represented by the formulas (1-1-1) to (1-1-6) and (1-2-1) to (1-2-6) may have a substituent.

Examples of the substituent may be the same as mentioned above.

[Formula 44]

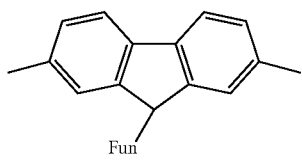
(1-1-1)

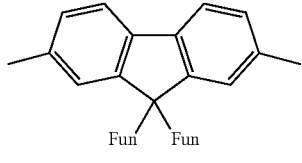
(1-1-2)

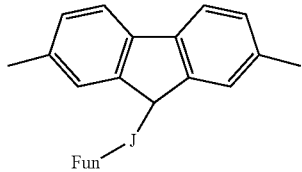
(1-1-3)

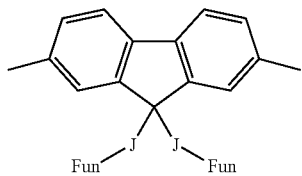
(1-1-4)

-continued

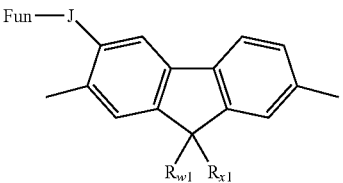
(1-1-5)

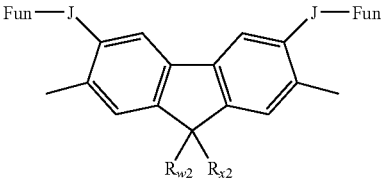
(1-1-6)

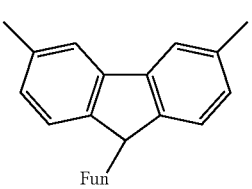
(1-2-1)

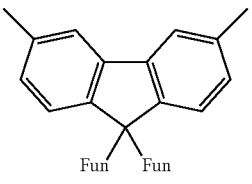
(1-2-2)

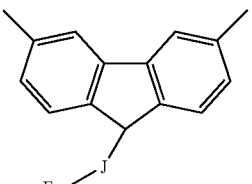
(1-2-3)

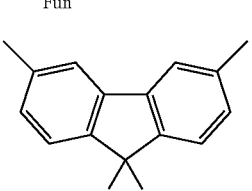
(1-2-4)

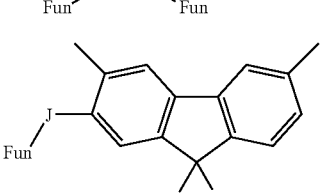
(1-2-5)

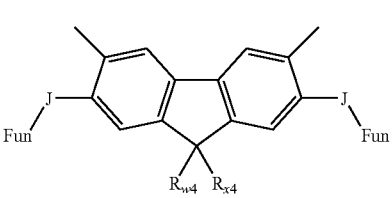
(1-2-6)

where, -J- represents —$R_k$—X—; $R_k$ and X are the same as defined above; $R_k$ is bonded to Fun; Fun represents a functional side chain containing a hole injection/transport group containing at least one hetero atom other than a nitrogen atom or at least two nitrogen atoms, (and/or)

an electron injection/transport group containing at least one hetero atom other than a nitrogen atom or at least two nitrogen atoms, and/or a light emitting group containing a condensed polycyclic aromatic hydrocarbon or a heterocyclic ring;

$R_{w1}$ to $R_{w4}$ and $R_{x1}$ to $R_{x4}$ each independently represent a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group or nitro group; and Rw and Rx may be mutually bound to form a ring.

$R_k$ and X are the same as those defined above.

In view of light emission efficiency, durability of a device and ease of synthesis, in the aforementioned formulas (1-1-1) to (1-1-6) and (1-2-1) to (1-2-6), when the alkylene group represented by $R_k$ in J has a substituent, the substituent is preferably an alkyl group, alkoxy group, alkylthio group, aryl group, aryloxy group, arylthio group, arylalkyl group, arylalkoxy group, arylalkylthio group, arylalkenyl group, arylalkynyl group and a monovalent heterocyclic group; more preferably an alkyl group, alkoxy group, alkylthio group, aryl group, aryloxy group, arylthio group, arylalkyl group, arylalkoxy group and a monovalent heterocyclic group; further preferably an alkyl group, alkoxy group, aryl group and a monovalent heterocyclic group; and most preferably an alkyl group, alkoxy group and aryl group.

In view of light emission efficiency, durability of an element, and ease of synthesis, when X is a bonding group, X is preferably —O—, —S—, —CO—, —, —SiR$^1$R$^2$—, —NR$^3$—, or —BR$^4$—, and more preferably —O—, —S— and —SiR$^1$R$^2$—, or —NR$^3$—, further preferably, —O—, —S— or —NR$^3$—, and most preferably, —O—, or —NR$^3$—.

Examples of the hole injection/transport group containing at least one hetero atom other than a nitrogen atom or at least two nitrogen atoms, and/or the electron injection/transport group containing at least one hetero atom other than a nitrogen atom or at least two nitrogen atoms, and/or the light emitting group containing a condensed polycyclic aromatic hydrocarbon or a heterocyclic ring, are the same as defined above.

In view of light emission efficiency, durability of a device and ease of synthesis, in the aforementioned formulas (1-1-1) to (1-1-6) and (1-2-1) to (1-2-6), when Fun is a hole injection/transport group, the residues obtained by removing a single R or a hydrogen atom on R from the formulas (H-1) to (H-29) are preferable;

the residues obtained by removing a single R or a hydrogen atom on R from the formulas (H-1) to (H-3), (H-5) and (H-15) to (H-17) are more preferable; and the residue obtained by removing a single R or a hydrogen atom on R from the formulas (H-1), (H-2), (H-15) and (H-16) are further preferable.

In view of light emission efficiency, durability of a device and ease of synthesis, in the aforementioned formulas (1-1-1) to (1-1-6) and (1-2-1) to (1-2-6), when Fun is an electron injection/transport group, the residues obtained by removing a single R or a hydrogen atom on R from the formulas (E-1) to (E-40) are preferable, the residues obtained by removing a single R or a hydrogen atom on R from the formulas (E-1) to (E-10) and (E-28) to (E-31) are more preferable;

the residues obtained by removing a single R or a hydrogen atom on R from the formulas (E-1), (E-2), (E-4) to (E-6) (E-28) and (E-31) are further preferable; and the residues obtained by removing a single R or a hydrogen atom on R from the formulas (E-1), (E-2), (E-28) and (E-31) are most preferable.

In view of light emission efficiency, durability of a device and ease of synthesis, in the aforementioned formulas (1-1-1) to (1-1-6) and (1-2-1) to (1-2-6), when Fun is a light-emitting group, the residues obtained by removing a single R or a hydrogen atom on R from the formulas (L-1) to (L-22) are preferable;

the residues obtained by removing a single R or a hydrogen atom on R from the formulas (L-6) to (L-8) and (L-9) to (L-16) are more preferable;

the residues obtained by removing a single R or a hydrogen atom on R from the formulas (L-6), (L-7), and (L-9) to (L-14) are further preferable; and the residues obtained by removing a single R or a hydrogen atom on R from the formulas (L-6), (L-7) and (L-9) to (L-14) are most preferable.

In view of light emission efficiency, durability of a device and ease of synthesis, in the aforementioned formulas (H-1) to (H-29), (E-1) to (E-40) and (L-1) to (L-22), R is preferably a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group or a monovalent heterocyclic group; more preferably a hydrogen atom, alkyl group, alkoxy group, alkylthio group, aryl group, aryloxy group, arylthio group, arylalkyl group, arylalkoxy group or a monovalent heterocyclic group; further preferably, a hydrogen atom, alkyl group, alkoxy group, aryl group or a monovalent heterocyclic group; and most preferably, a hydrogen atom, alkyl group, alkoxy group or aryl group.

In view of light emission efficiency, durability of a device and ease of synthesis, of the aforementioned formulas (1-1-1) to (1-1-6) and (1-2-1) to (1-2-6), the repeat unit of the main chain is, preferably the formulas (1-1-1) to (1-1-4) or (1-2-1) to (1-2-4); and more preferably the formulas (1-1-2), (1-1-4), (1-2-2) or (1-2-4).

In view of light emission efficiency, durability of a device and ease of synthesis, when the groups represented by the formulas (1-1-1) to (1-1-6) and (1-2-1) to (1-2-6) have a substituent, the substituent is preferable an alkyl group, alkoxy group, alkylthio group, aryl group, aryloxy group, arylthio group, arylalkyl group, arylalkoxy group, arylalkylthio group, arylalkenyl group, arylalkynyl group or a monovalent heterocyclic group;

more preferable an alkyl group, alkoxy group, alkylthio group, aryl group, aryloxy group, arylthio group, arylalkyl group, arylalkoxy group or a monovalent heterocyclic group; and further preferable an alkyl group, alkoxy group, aryl group or a monovalent heterocyclic group; and most preferably, an alkyl group, alkoxy group or aryl group.

Specific examples of a polymer compound according to the present invention will be described herein.

When a side chain has a hole injection/transport group, those represented by (5-1-1) to (5-4-2) are mentioned as examples.

When a side chain has an electron injection/transport group, those represented by (6-1) to (6-4-2) are mentioned as examples.

When a side chain has a light emitting group, those represented by (7-1) to (7-4-2) are mentioned as examples.

[Formula 45-1]

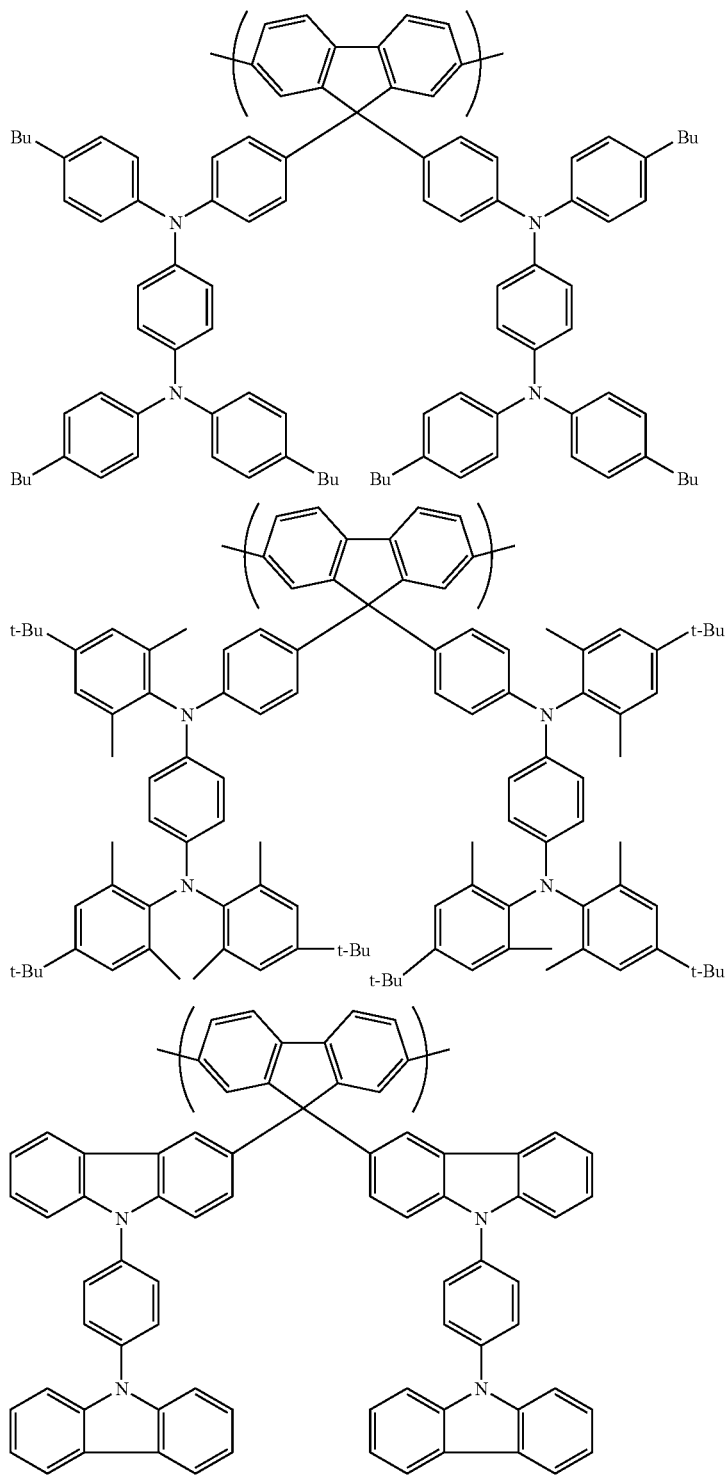

(5-1-1)

-continued
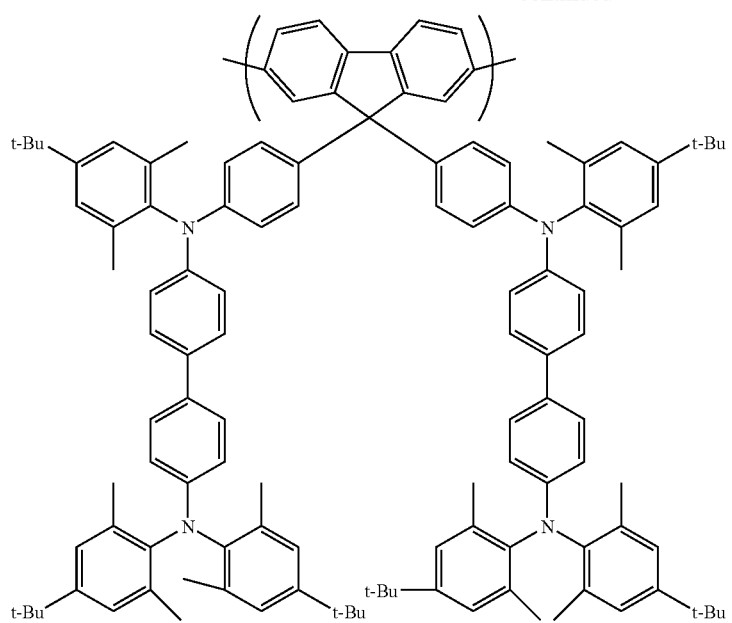
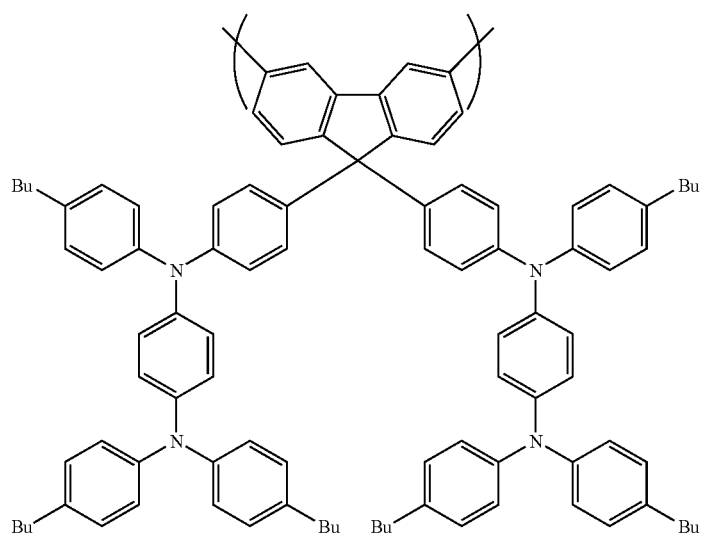
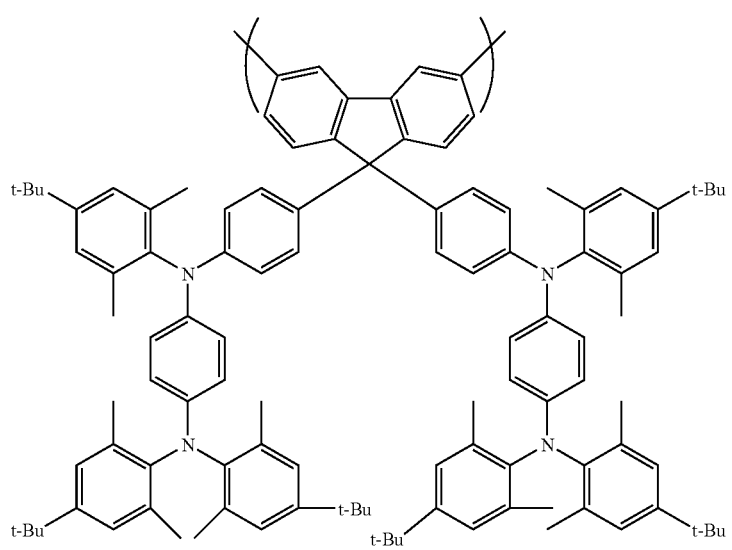

[Formula 45-2]
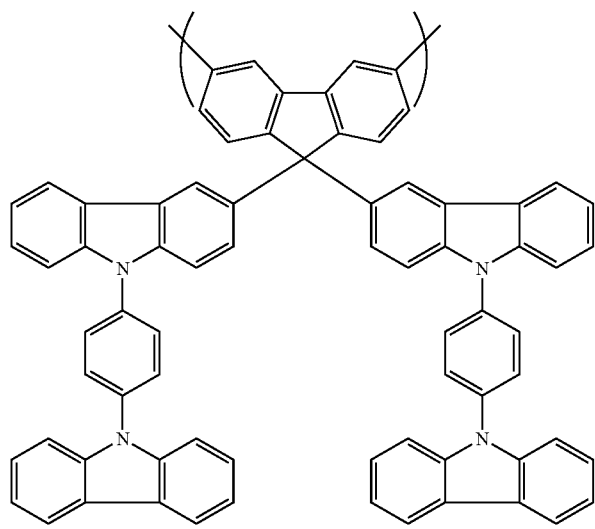
(5-1-2)
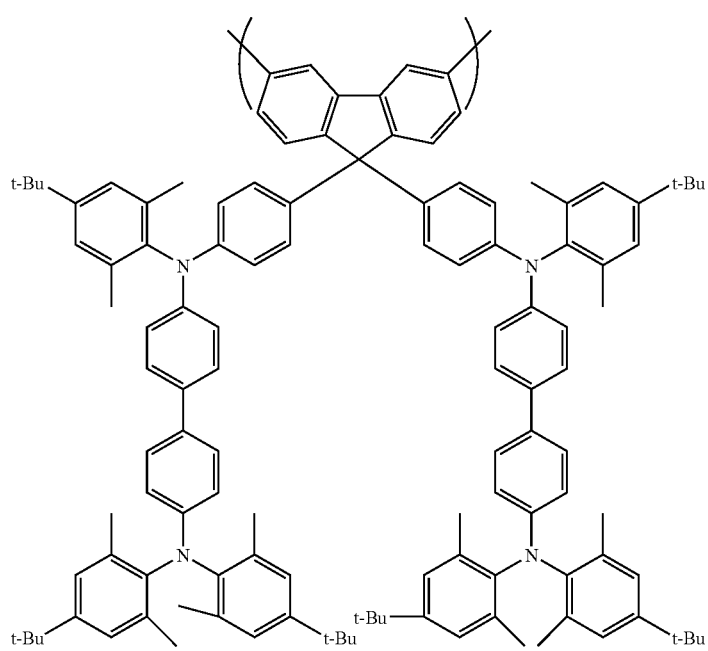

[Formula 46-1]
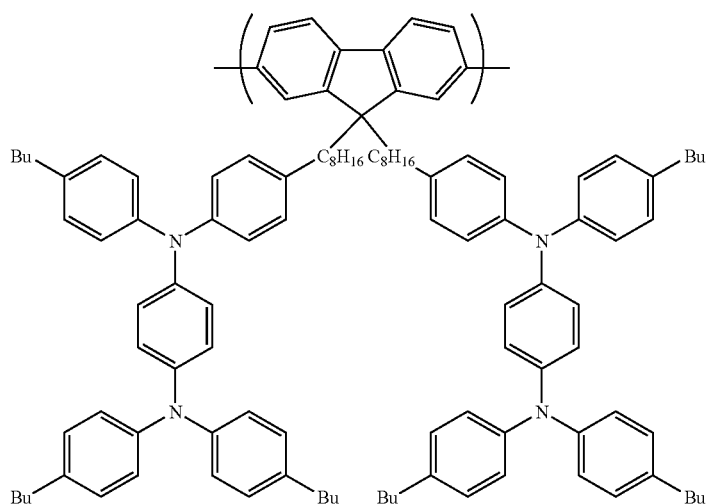
(5-2-1)
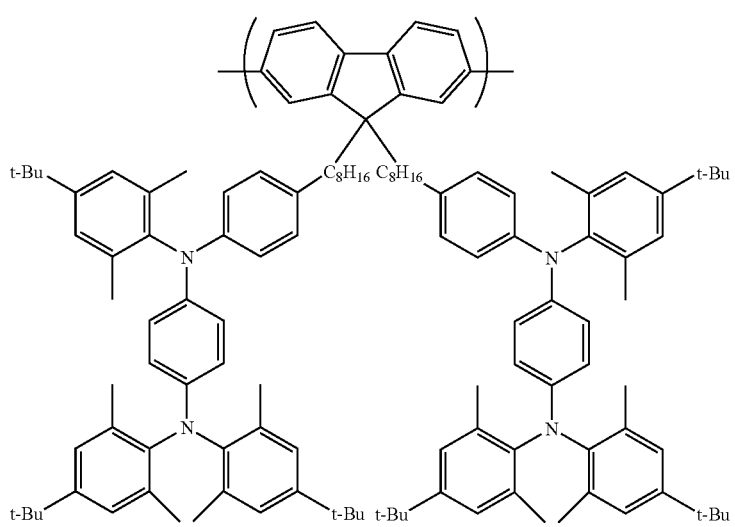
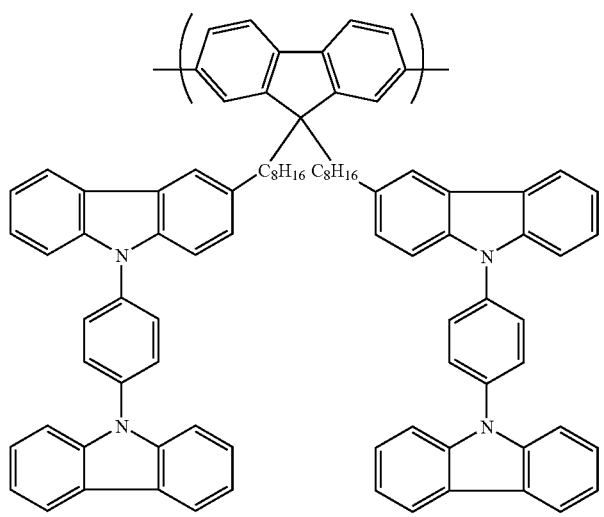

-continued
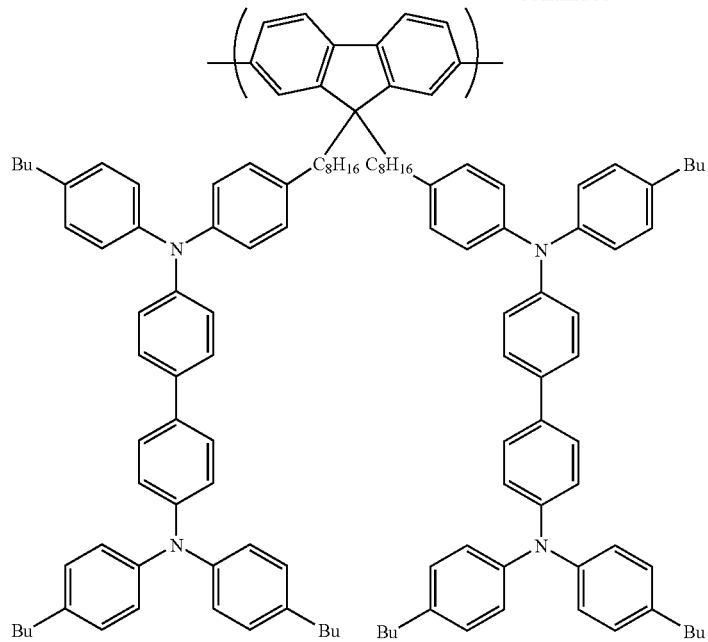
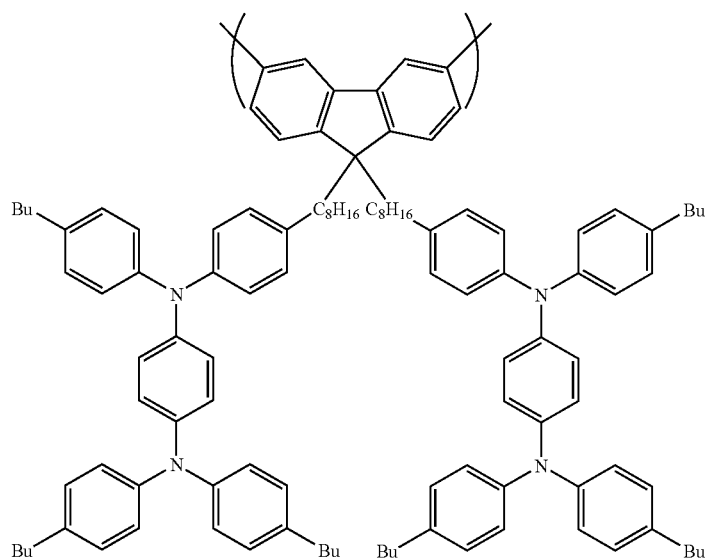

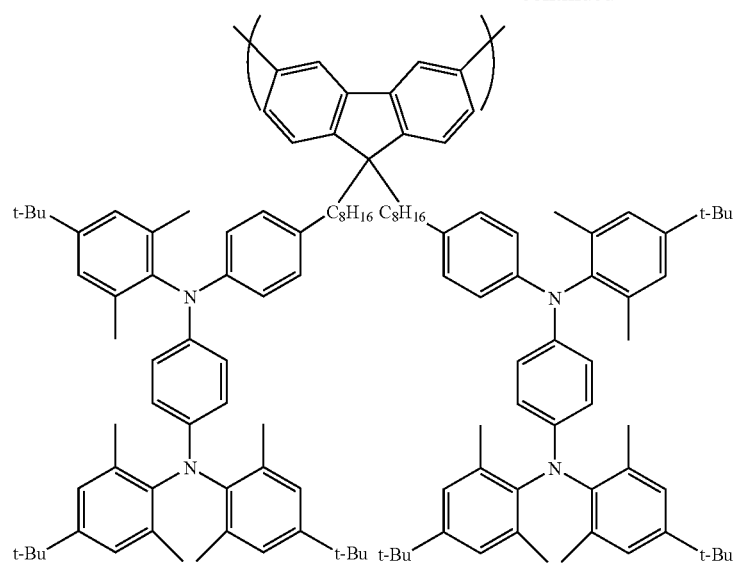
[Formula 46-2]
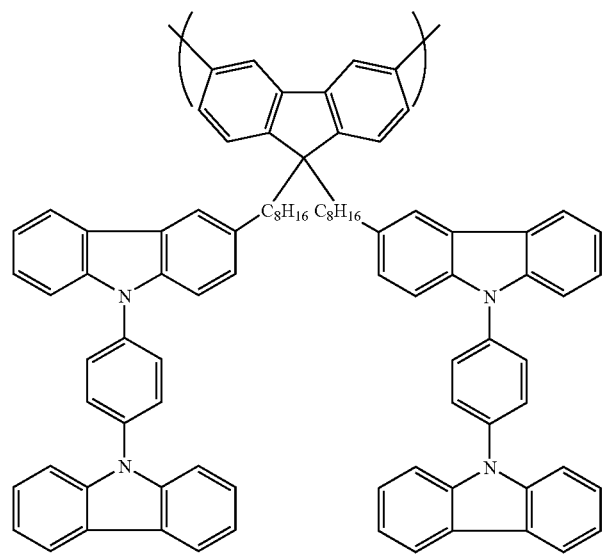
(5-2-2)

-continued
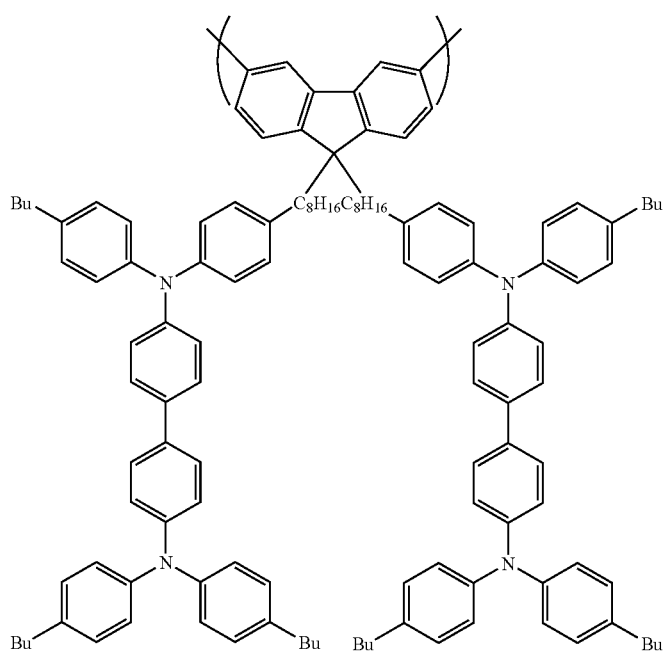
[Formula 47-1]
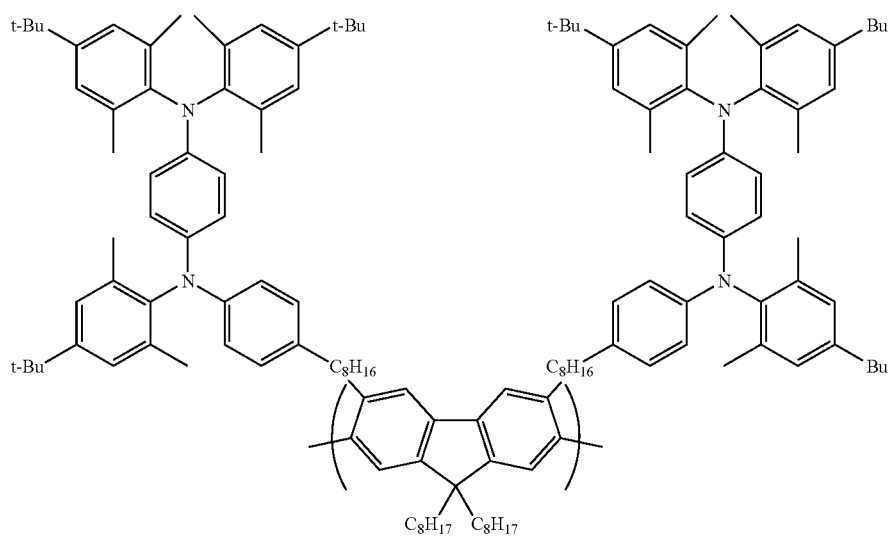
(5-3-1)

-continued
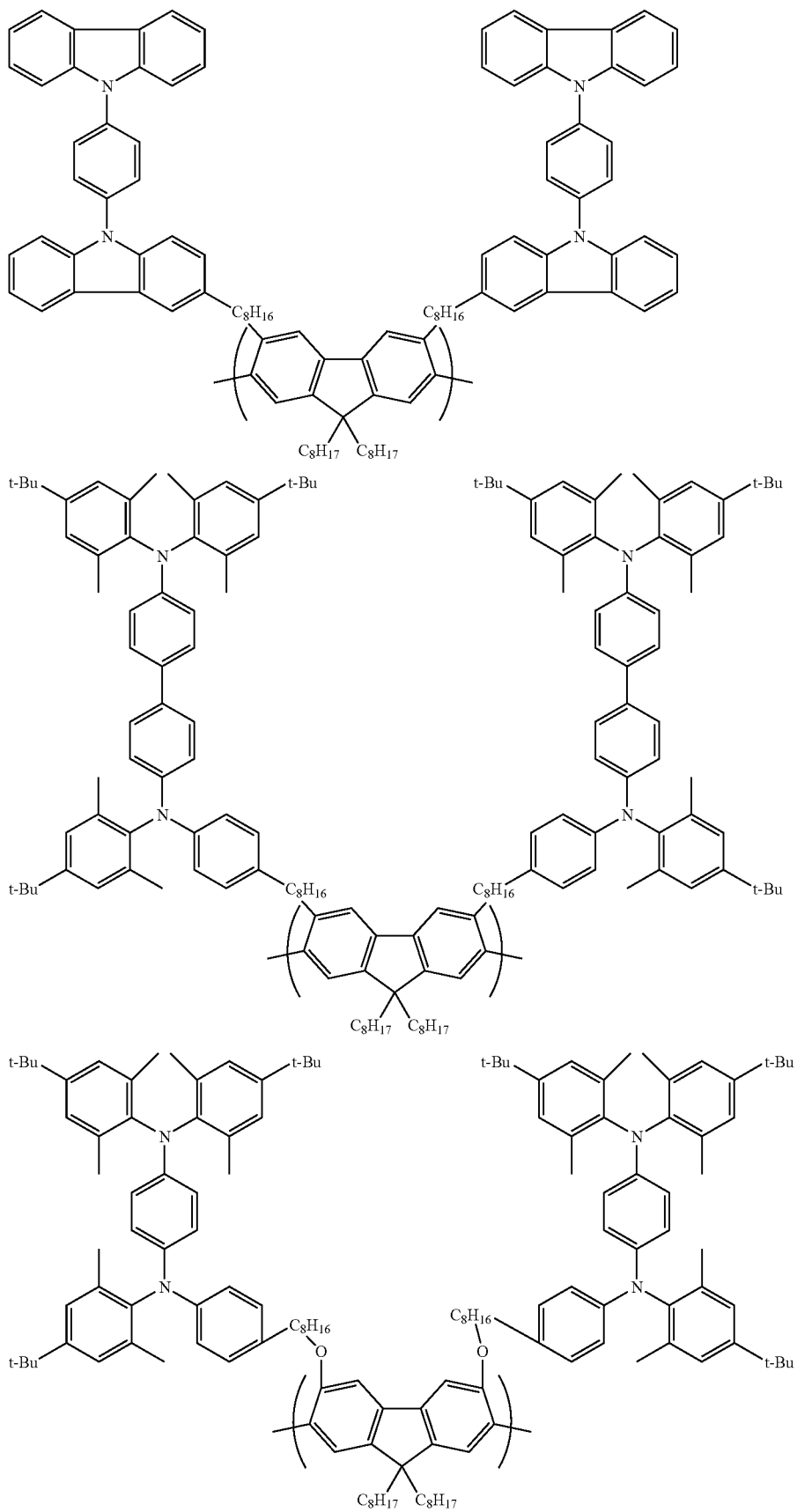

-continued
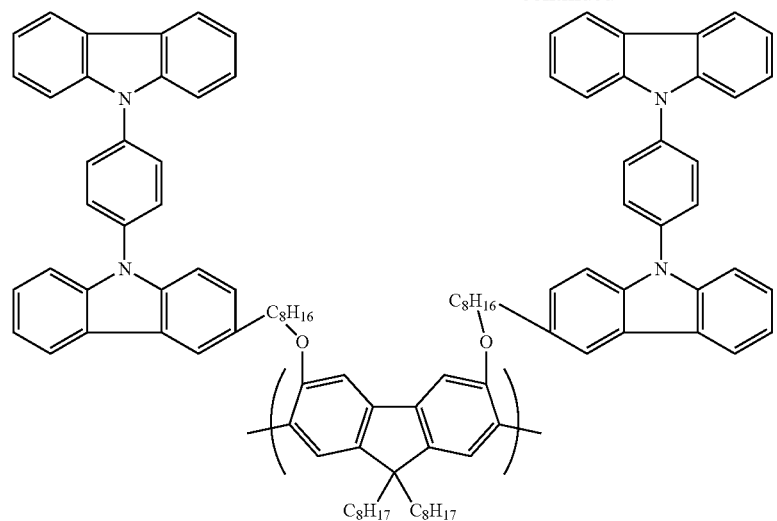
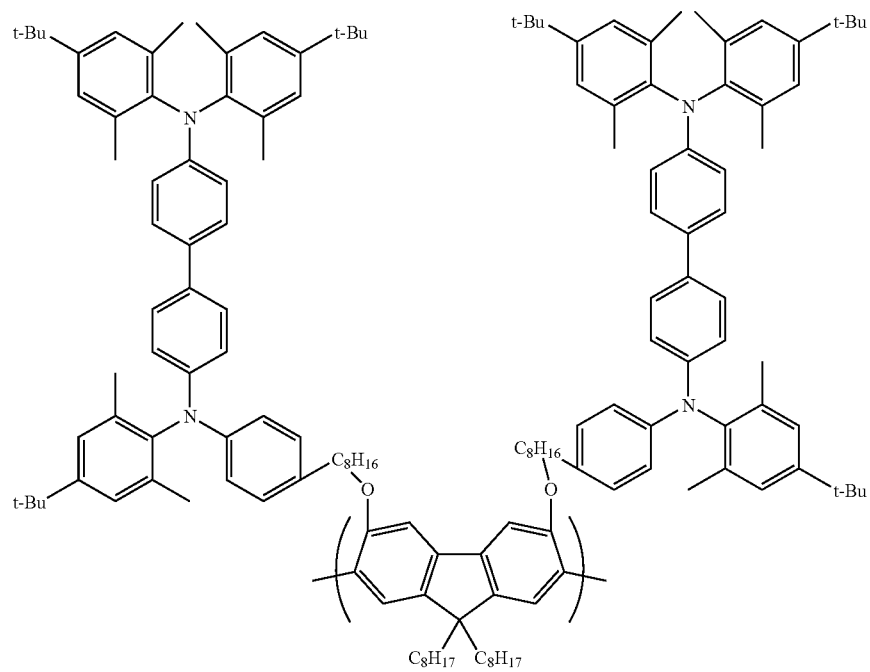

[Formula 47-2]
(5-3-2)
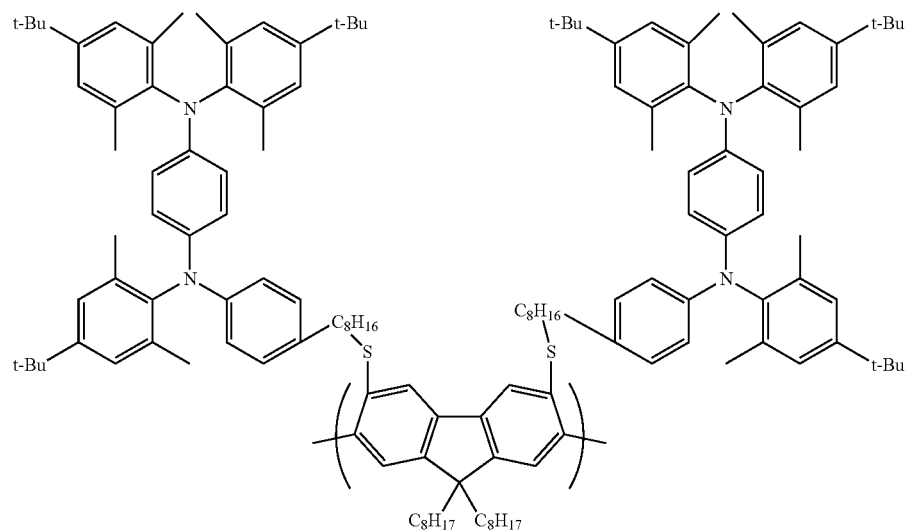
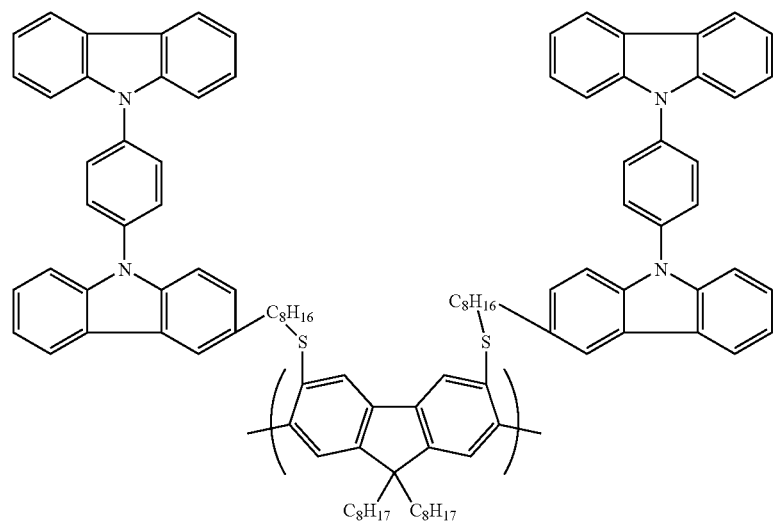

-continued
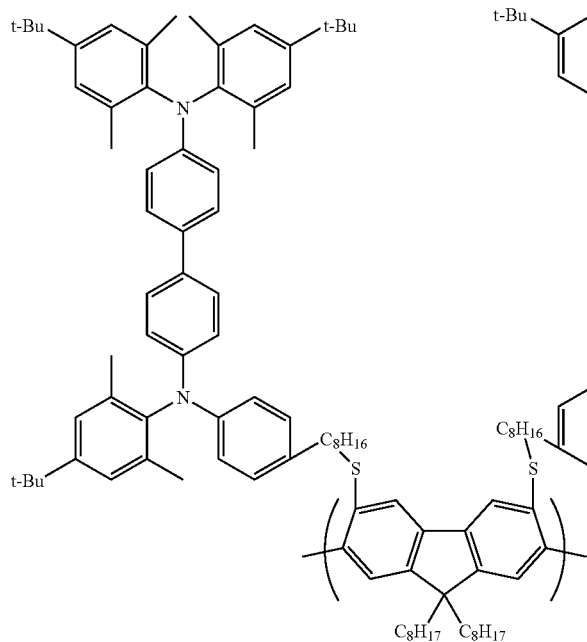
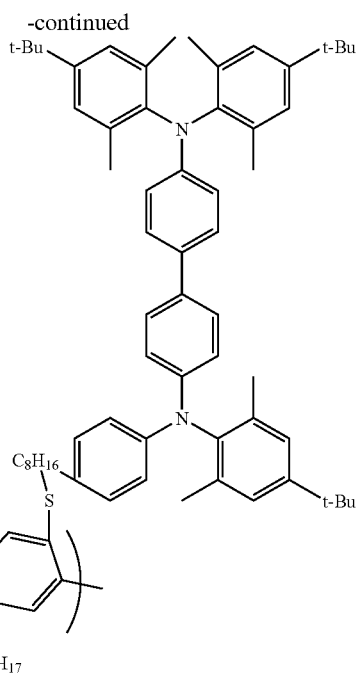
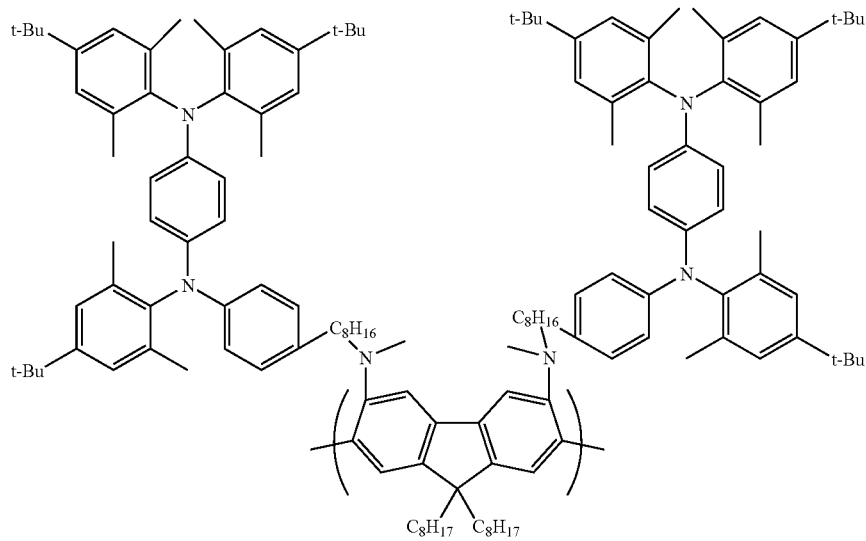
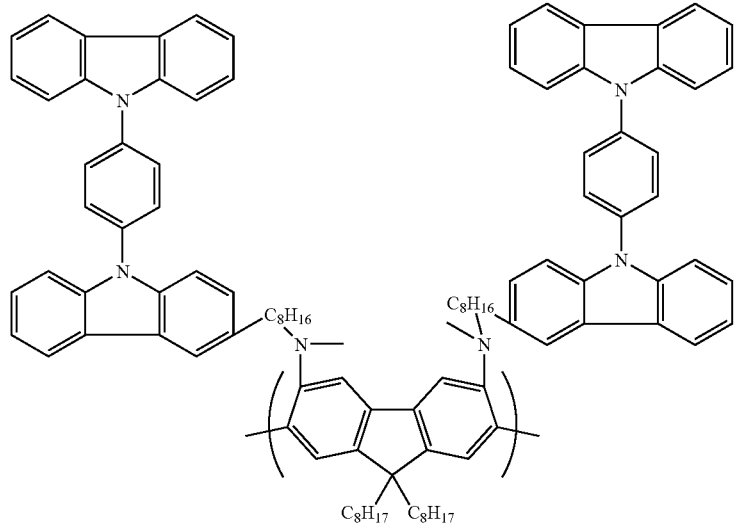

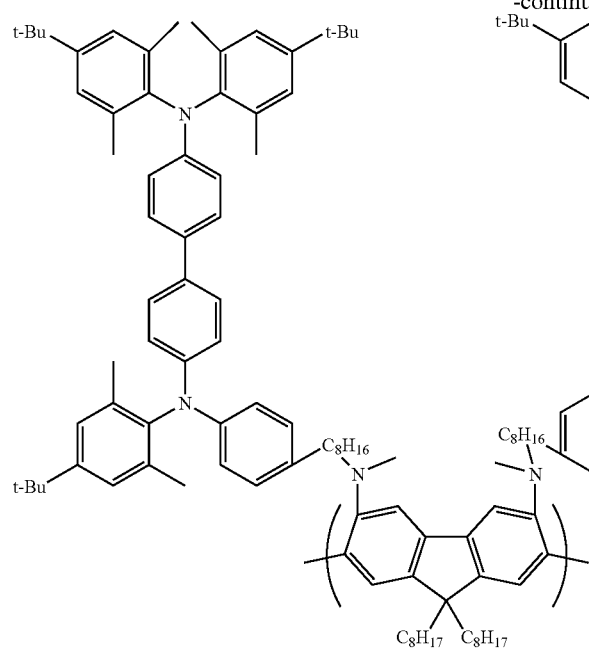
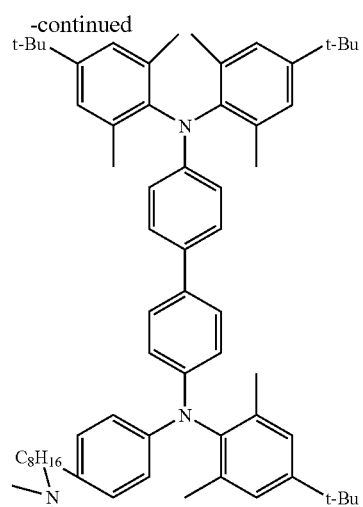
-continued
[Formula 48-1]
(5-4-1)
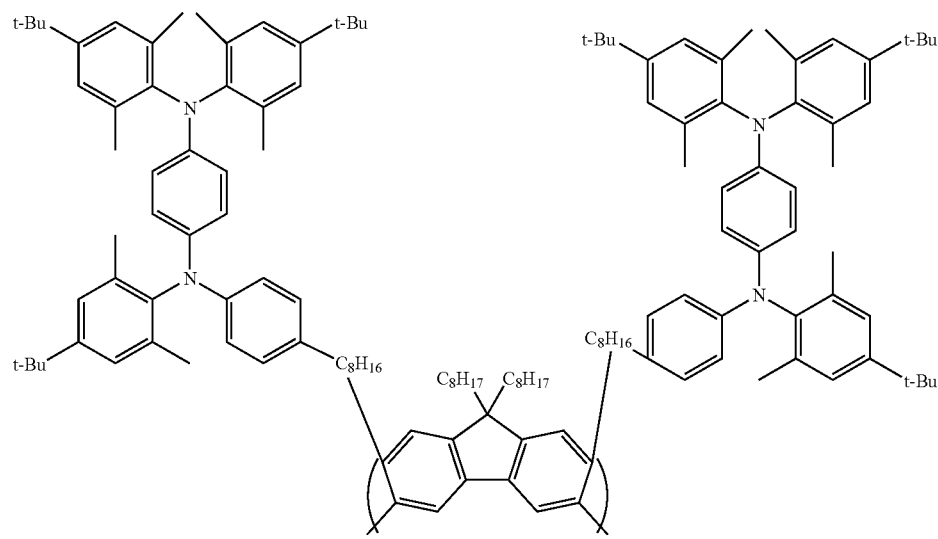

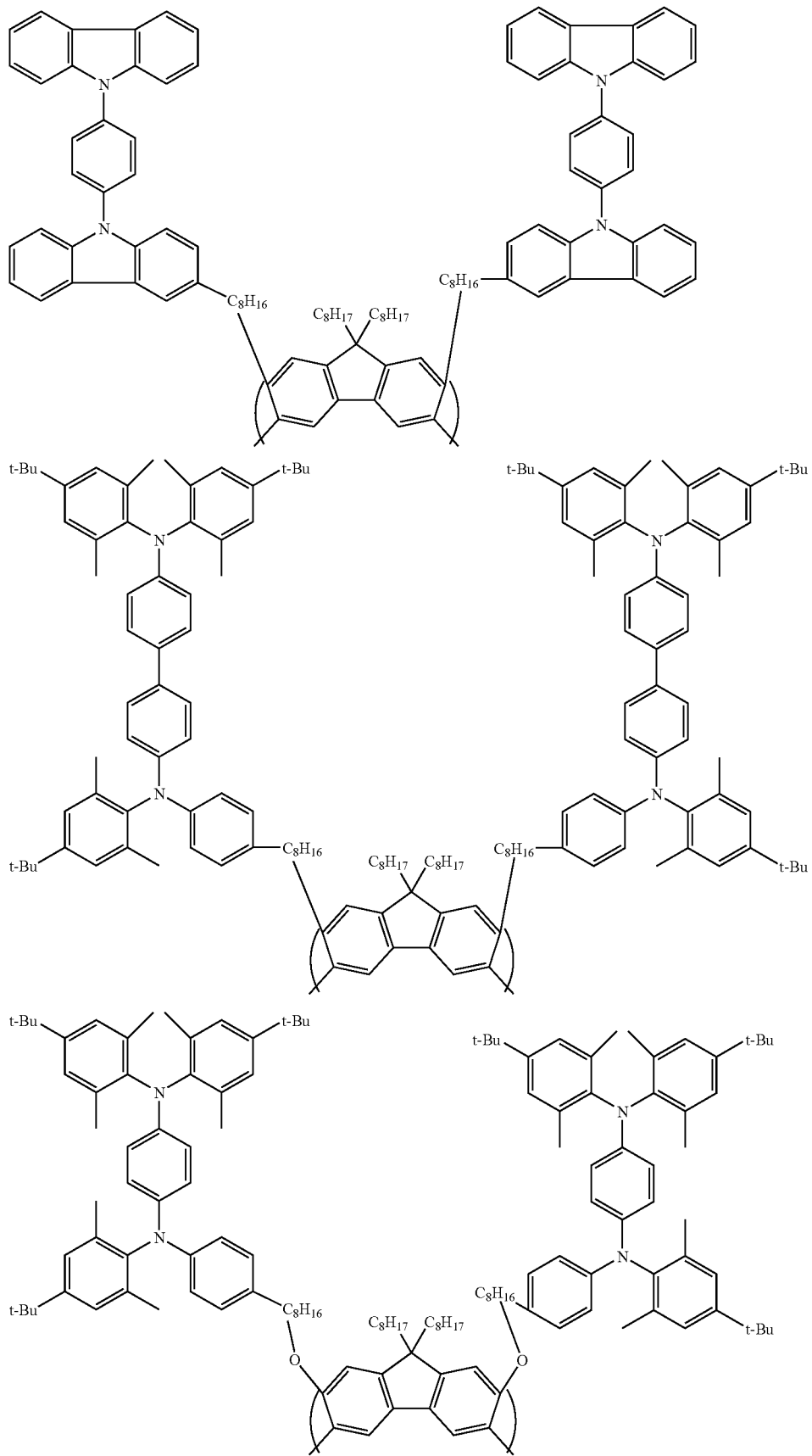

-continued
99
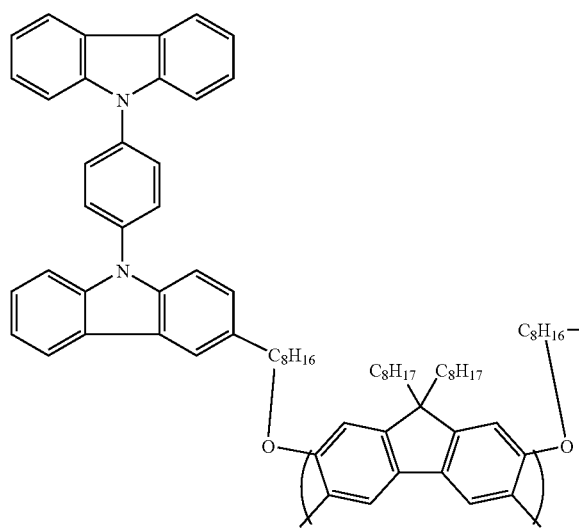
100
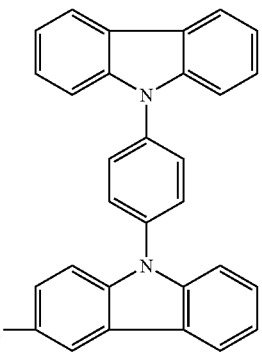
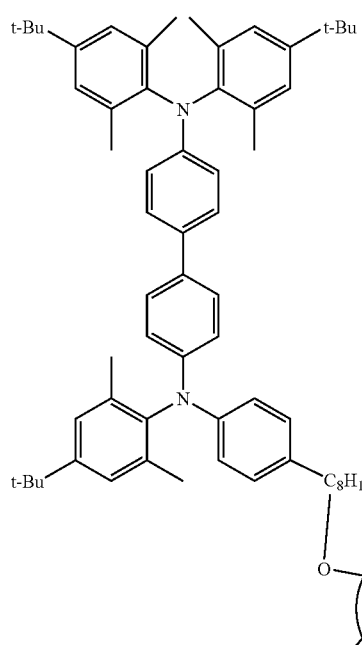
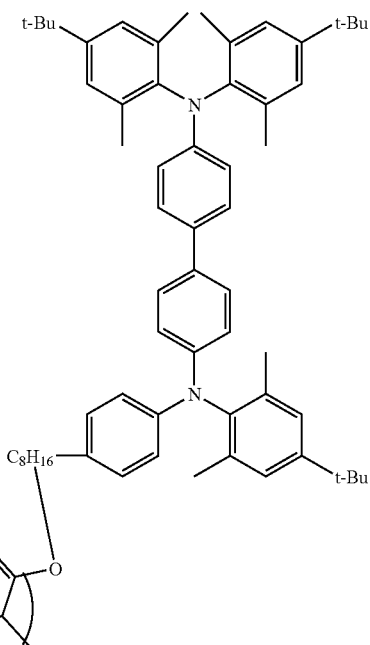

[Formula 48-2]
(5-4-2)
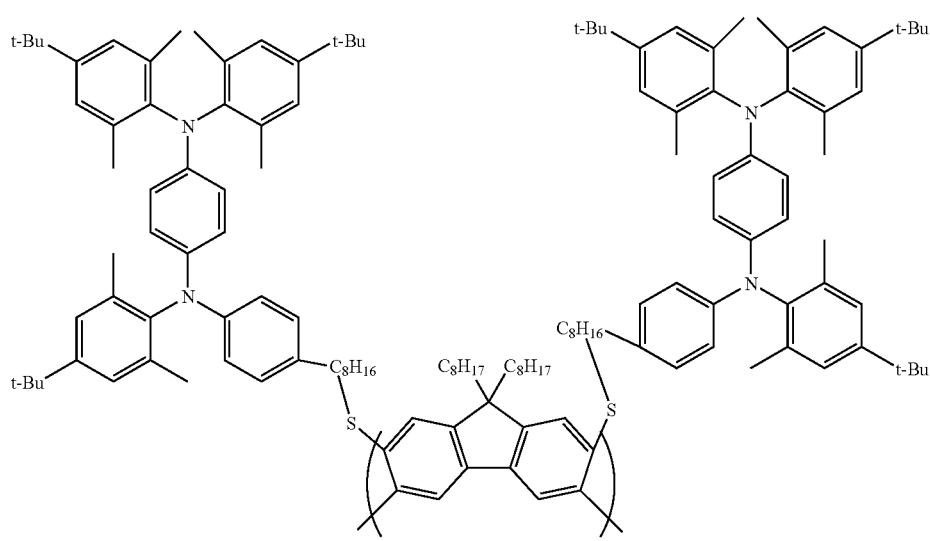
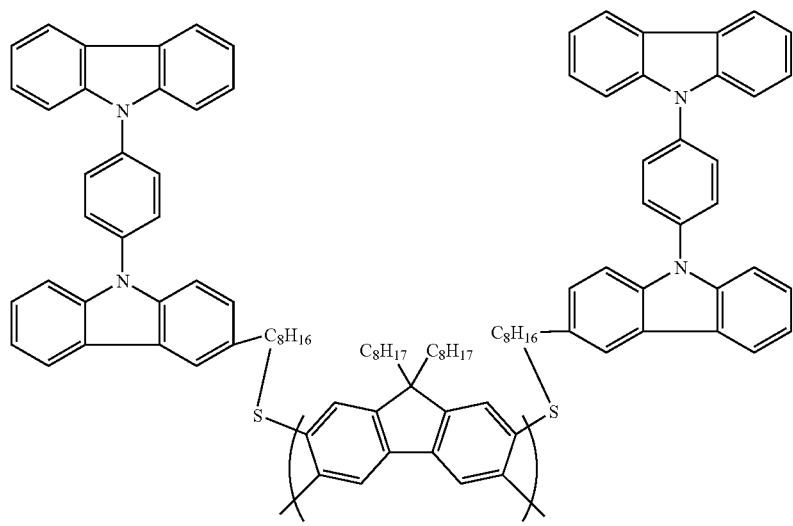

103
104
-continued
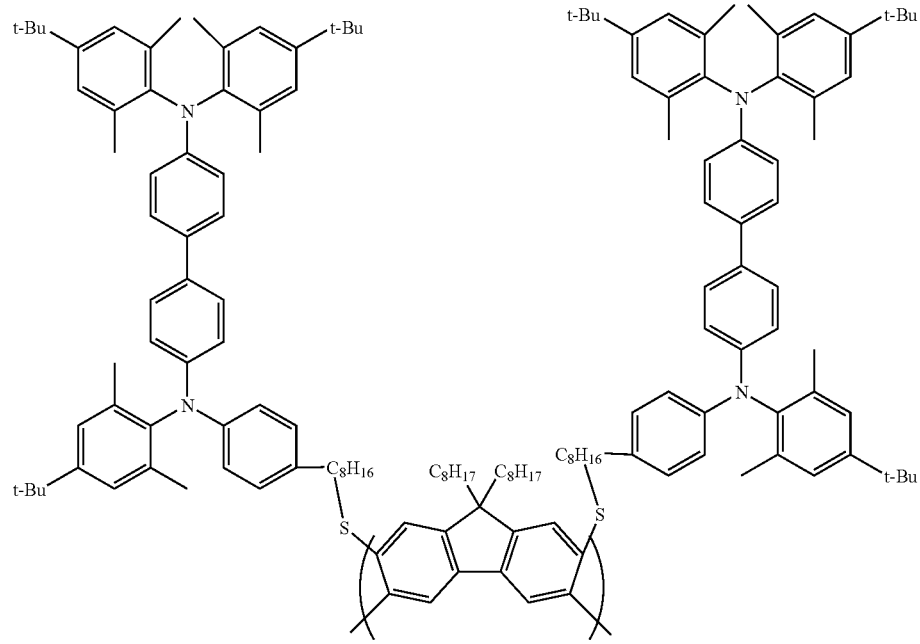
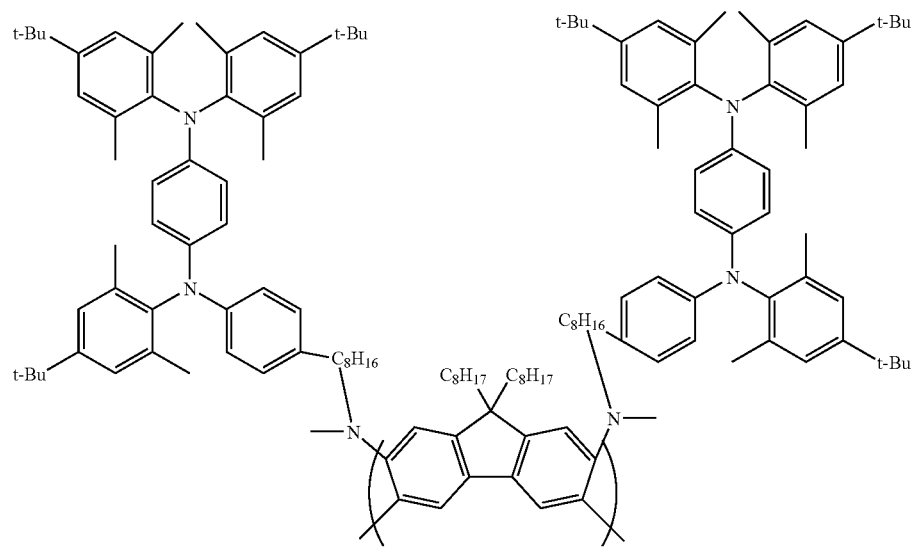
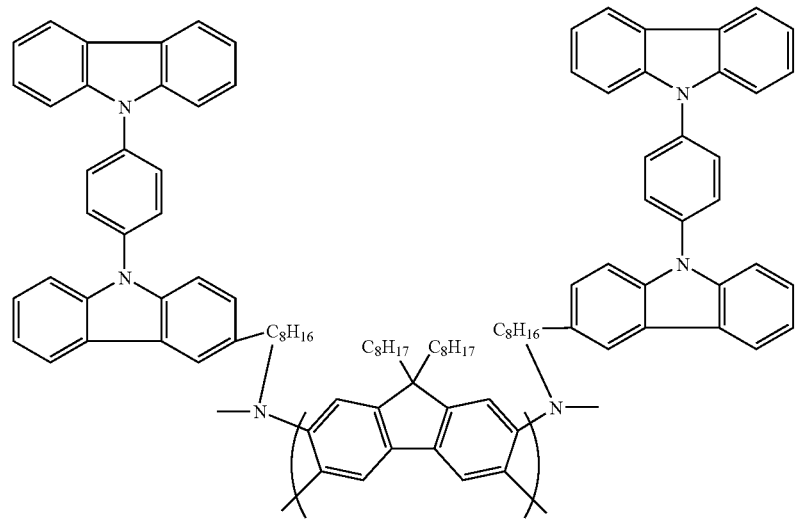

105
106
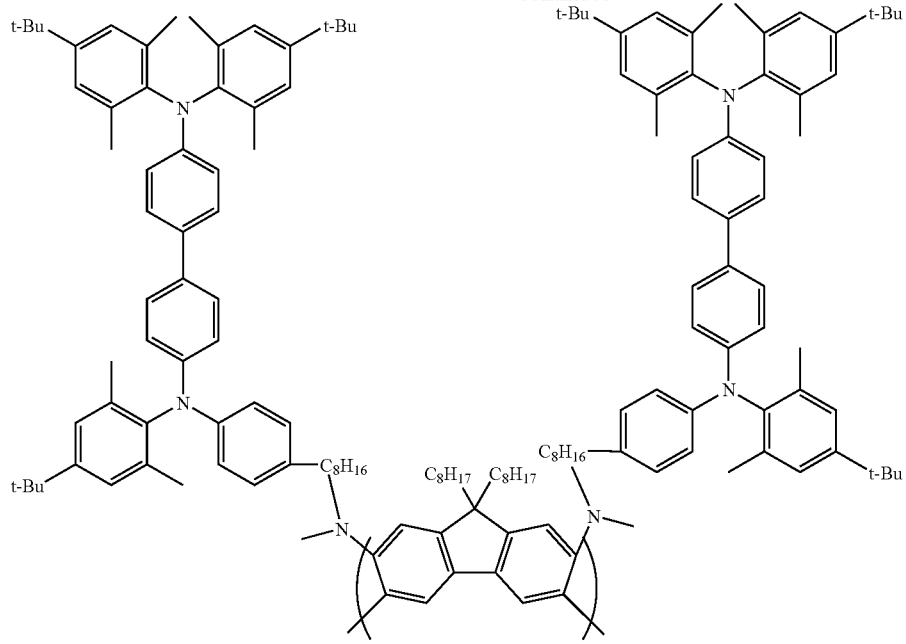
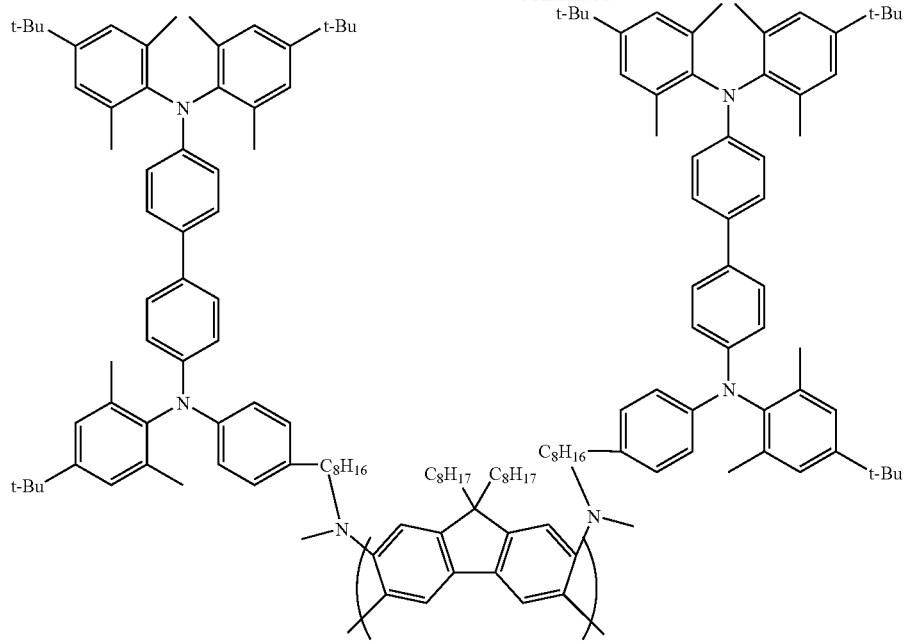
[Formula 49]
(6-1)
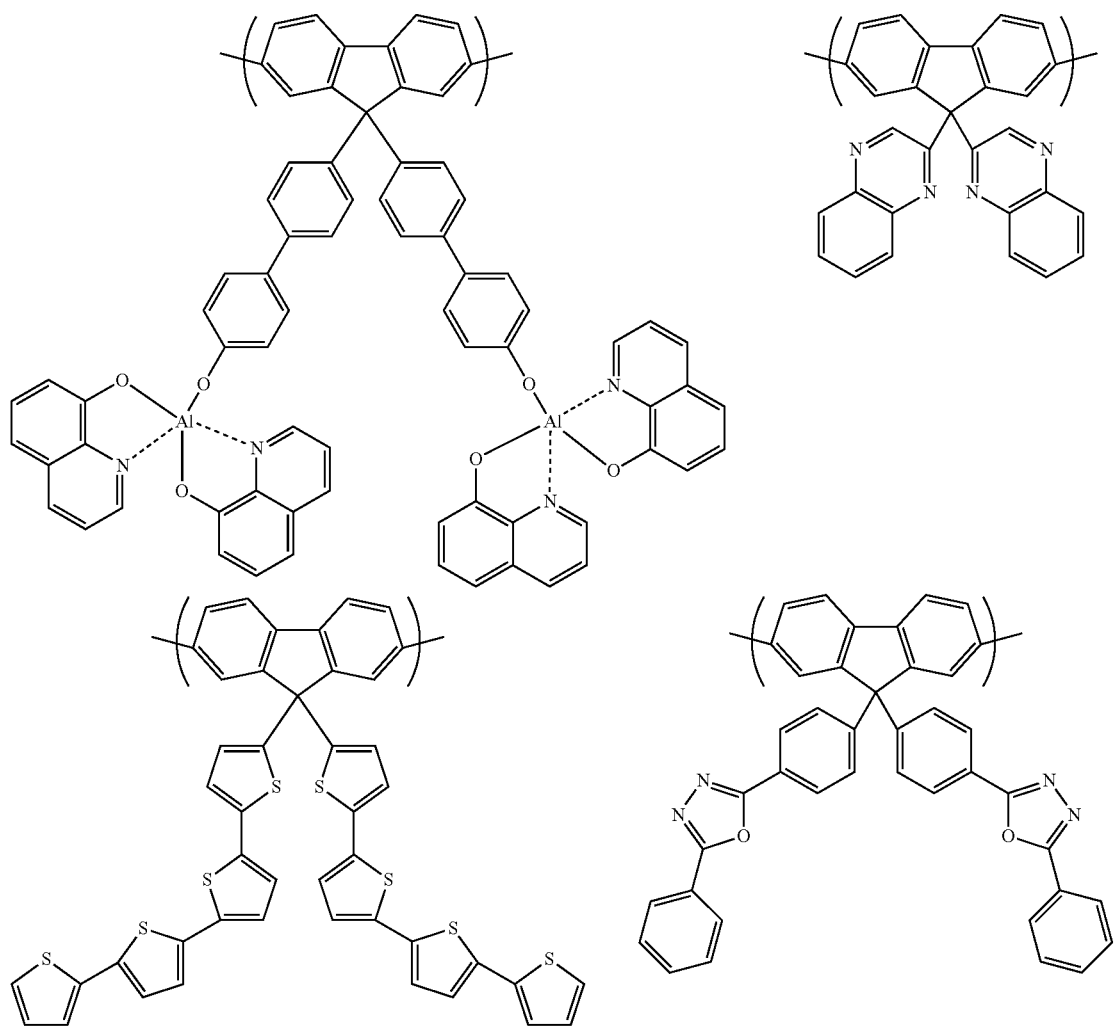

107 108
-continued
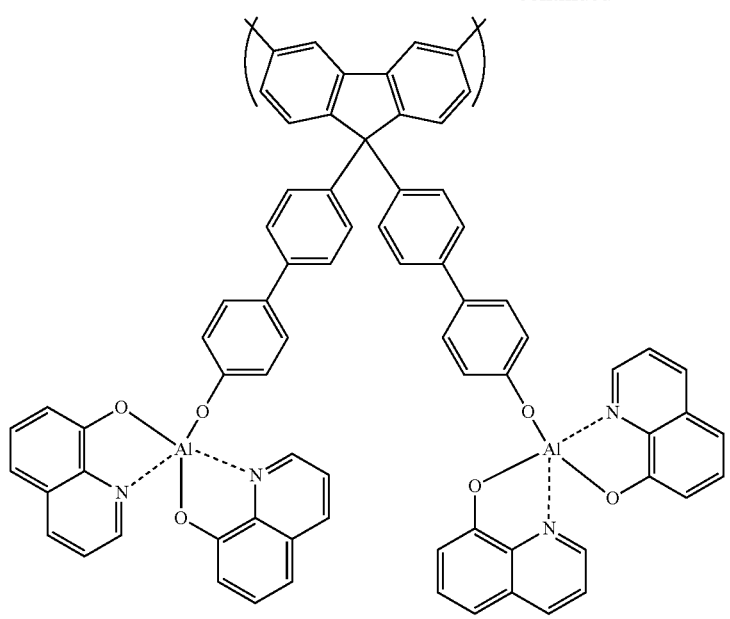
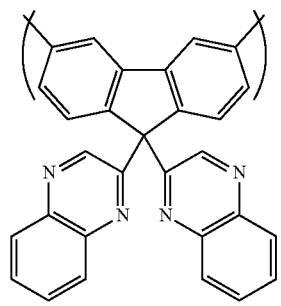
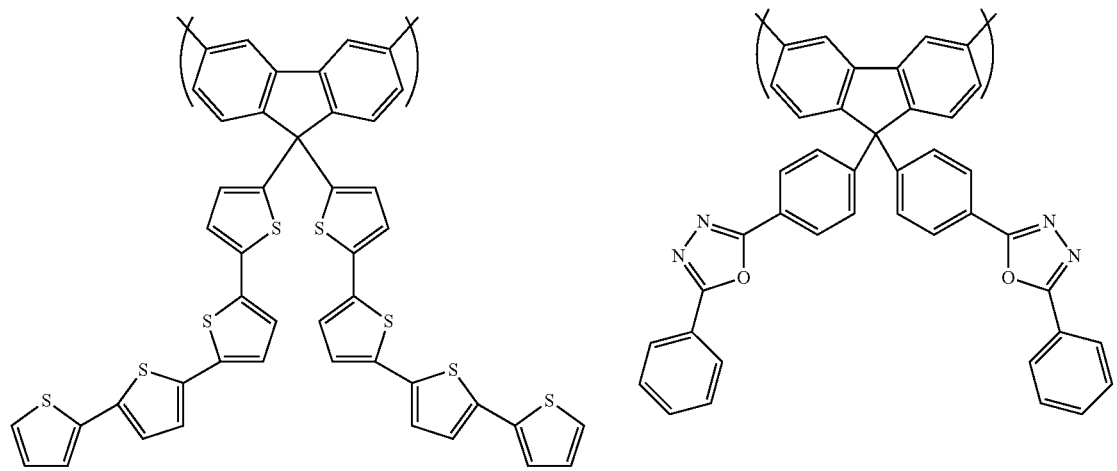

-continued
[Formula 50]
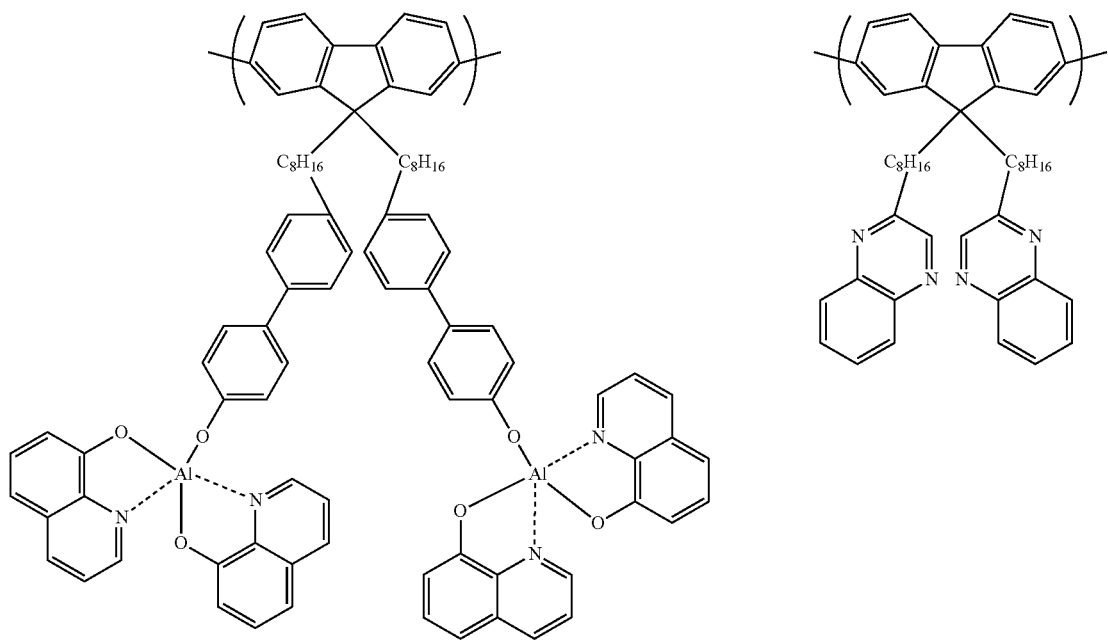
(6-2)
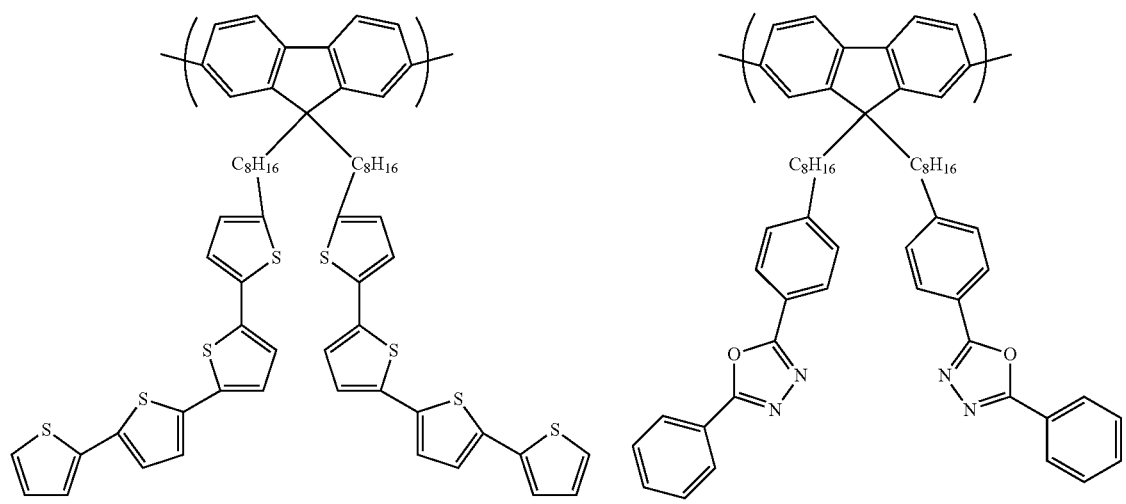

111
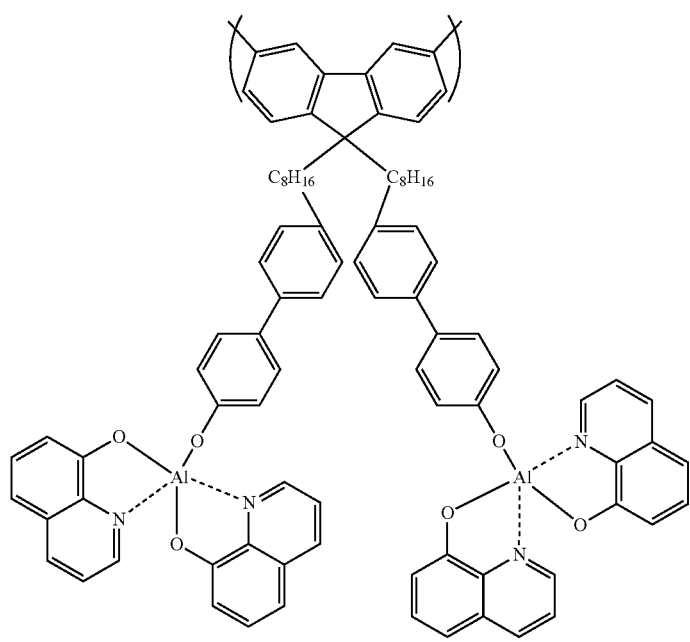
112
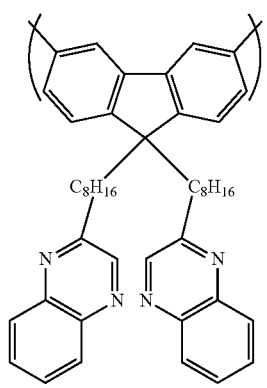
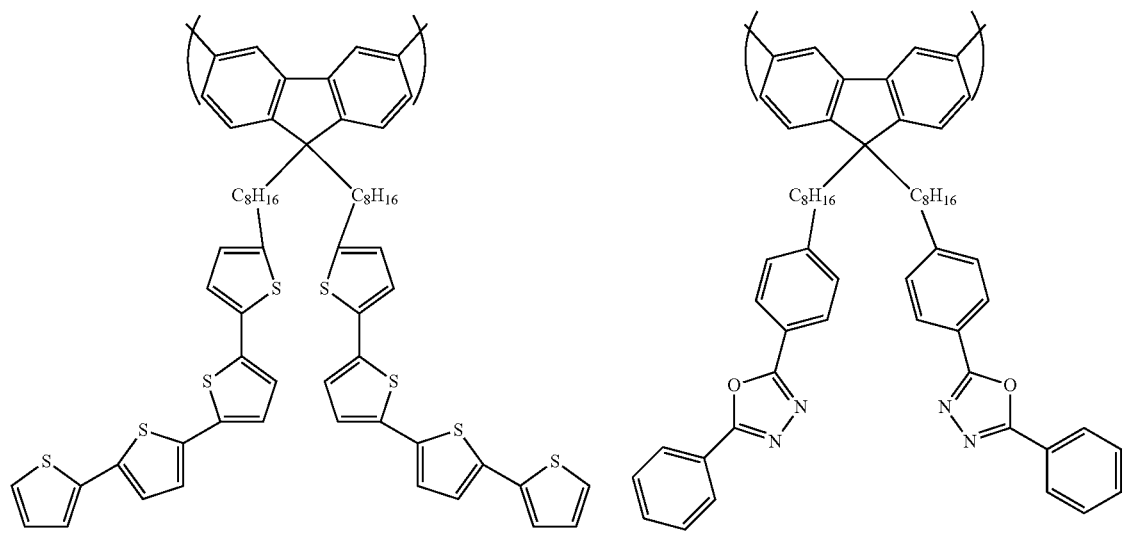

[Formula 51-1]
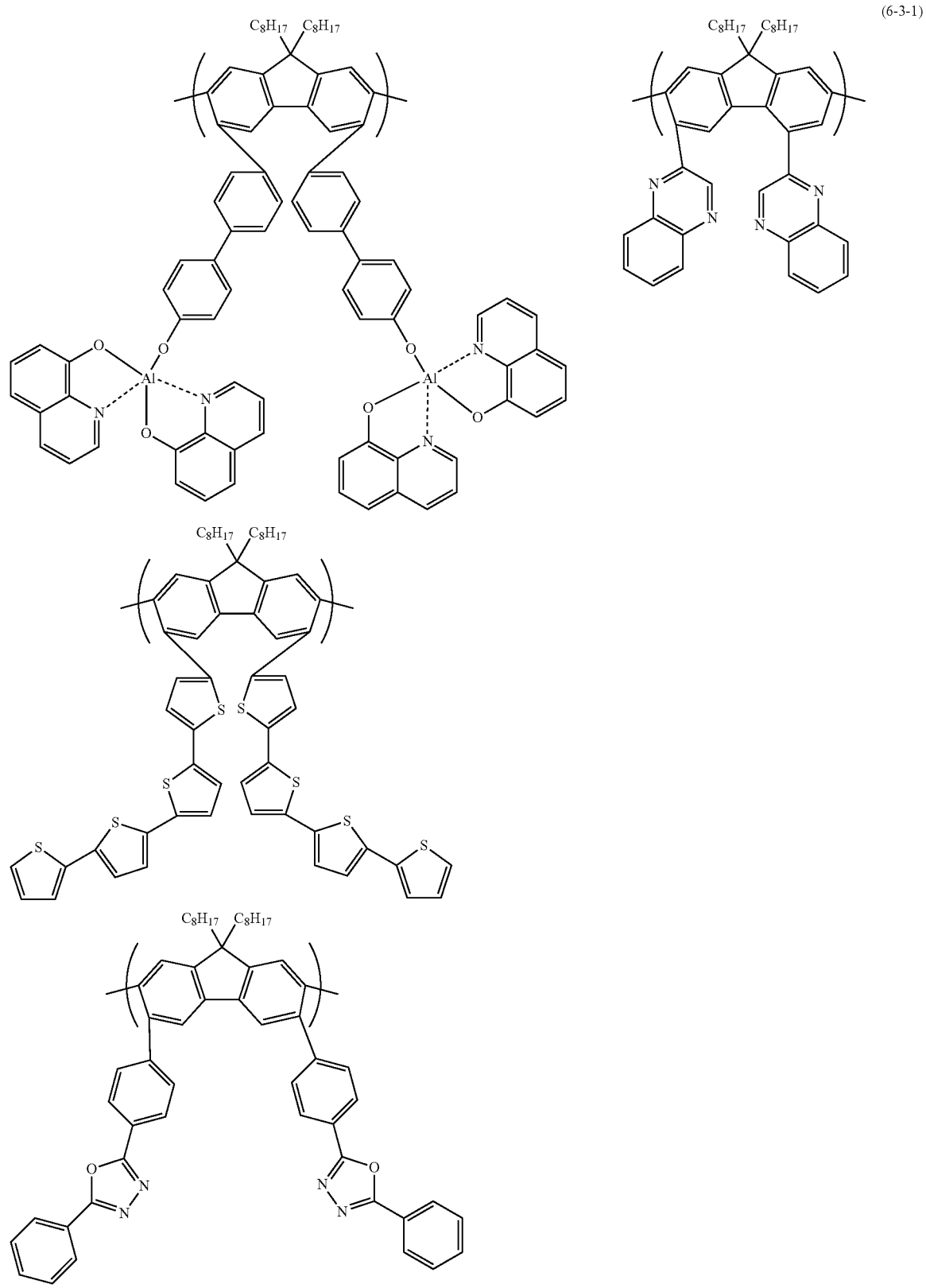

-continued
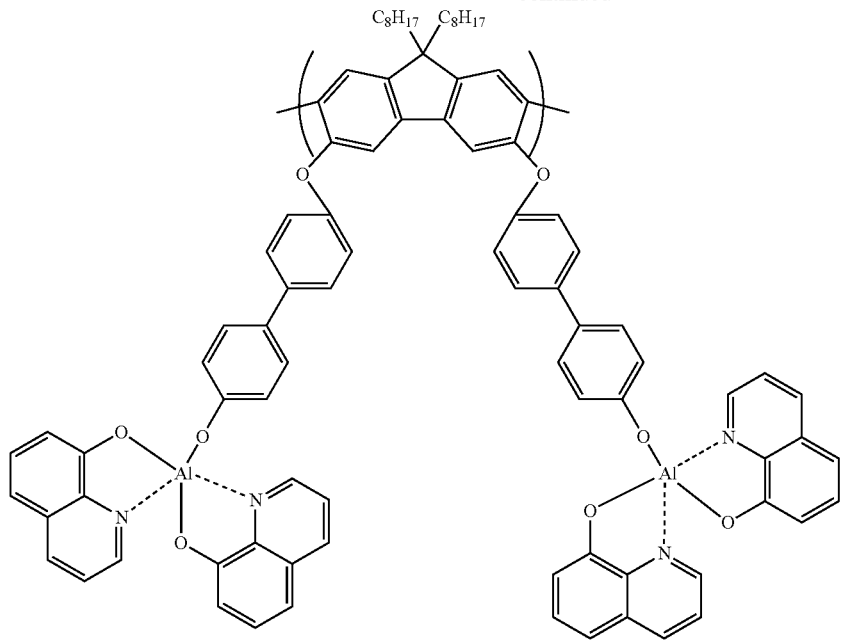
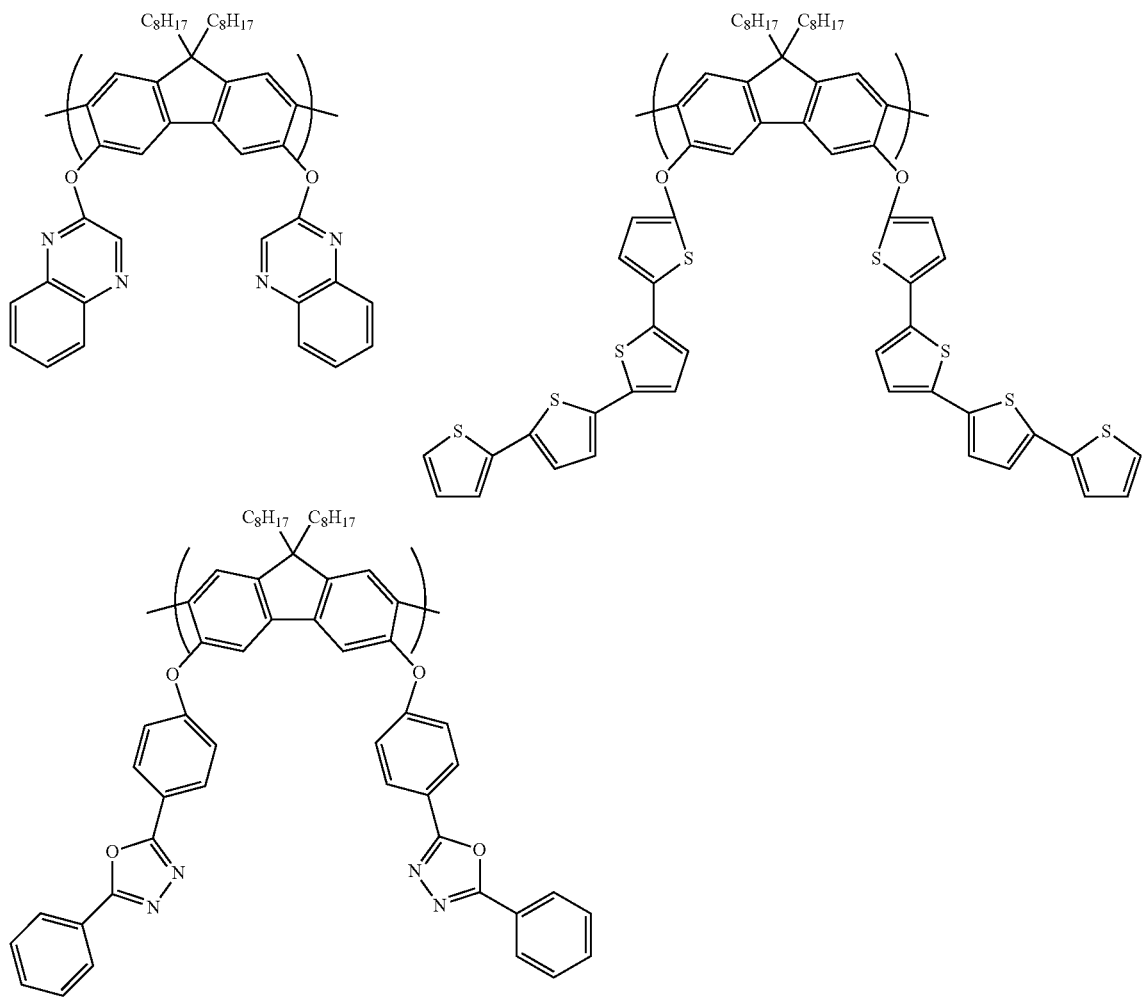

[Formula 51-2]
(6-3-2)
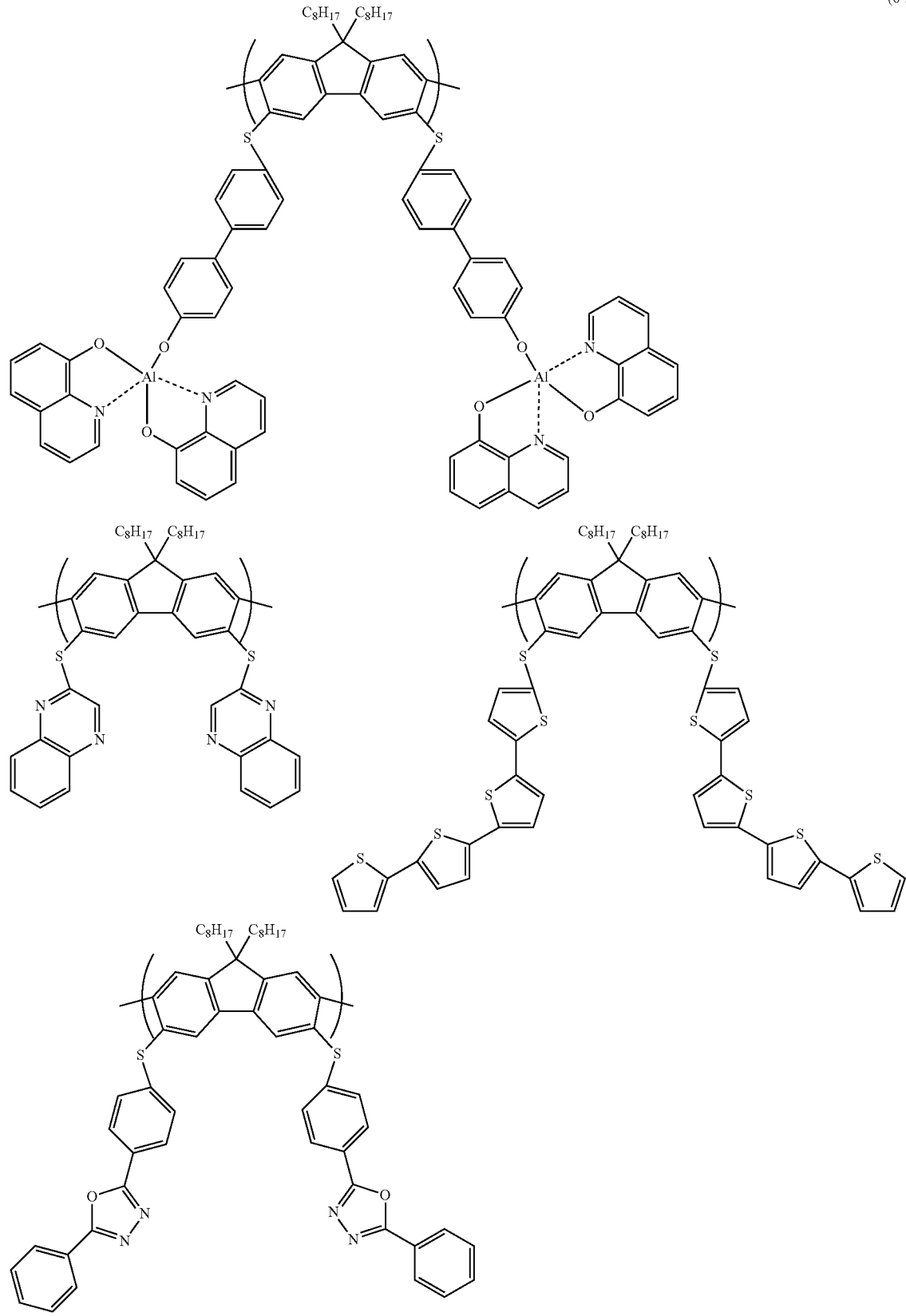

-continued
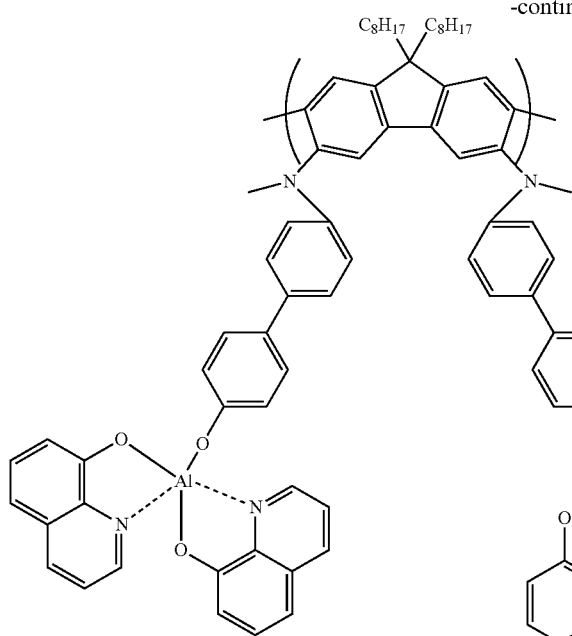
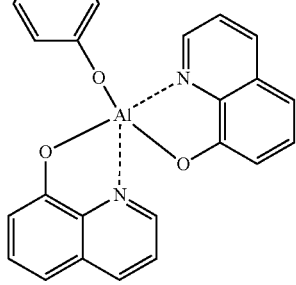
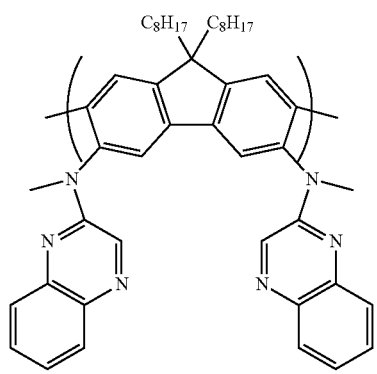
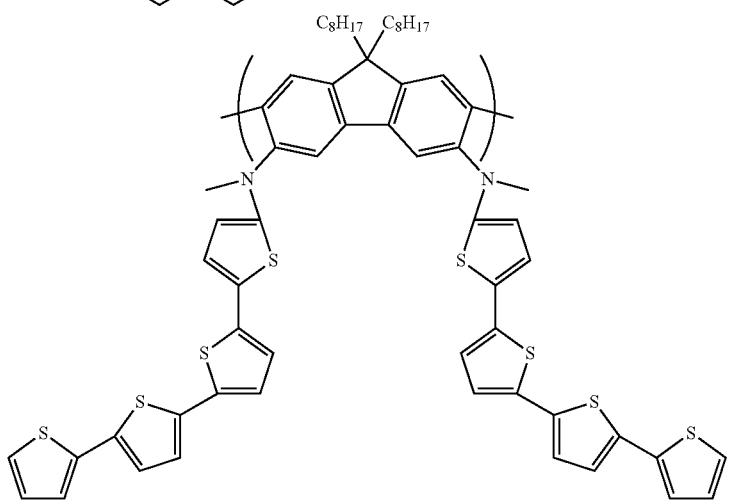
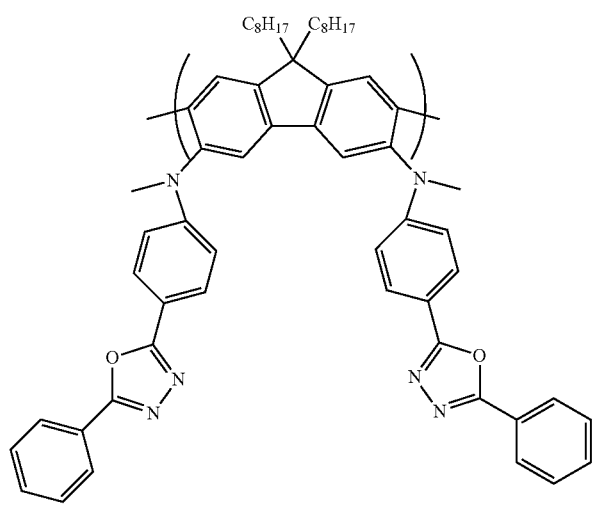

[Formula 52-1]
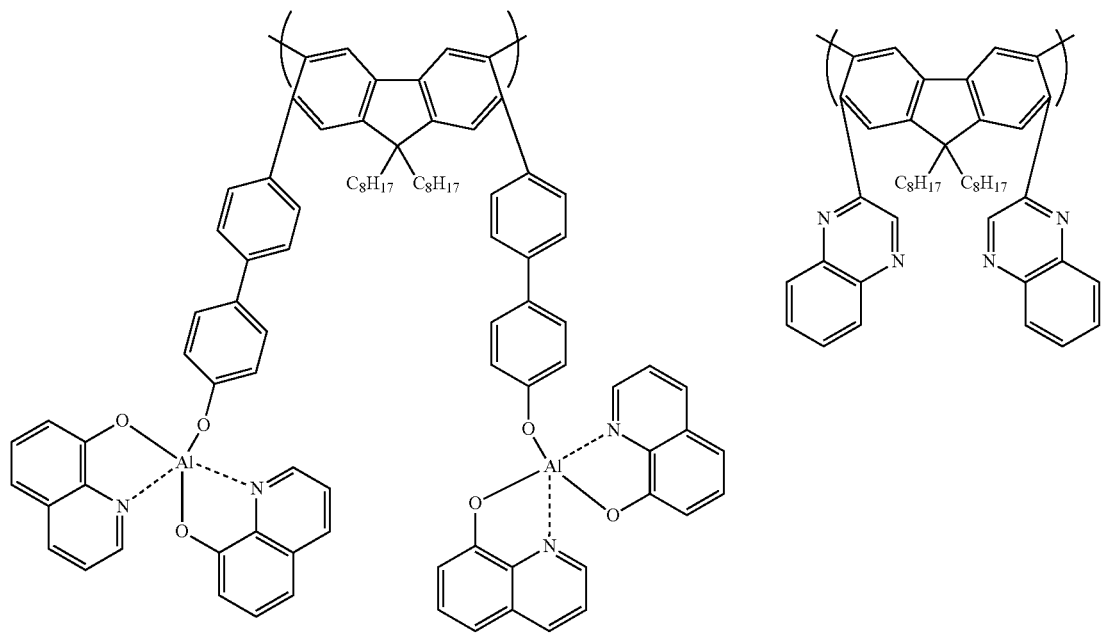
(6-4-1)
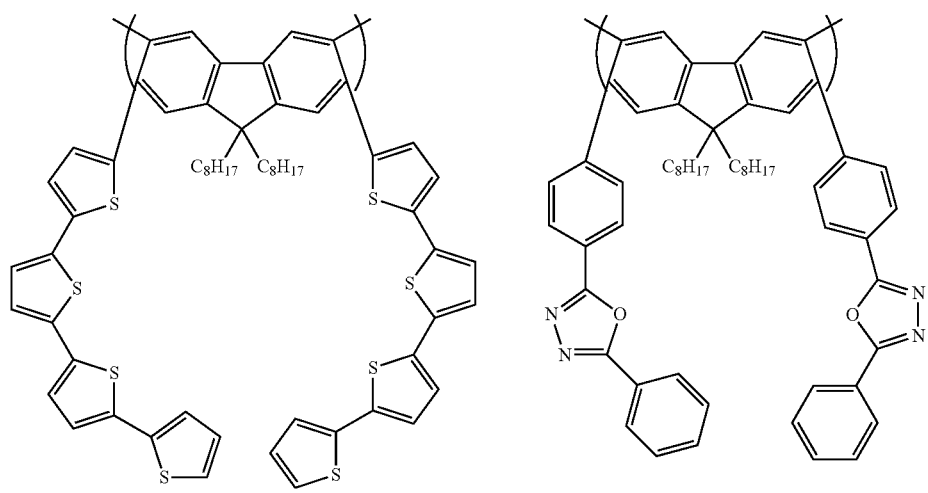

-continued
123
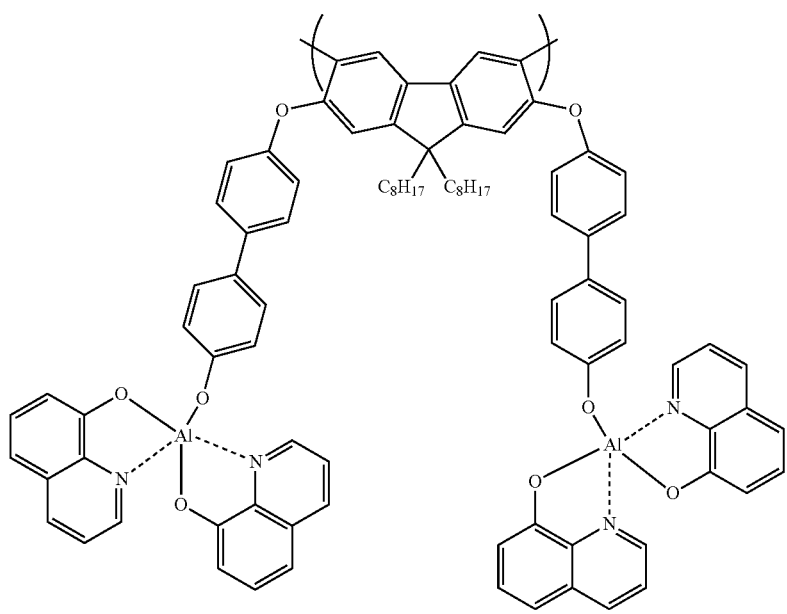
124
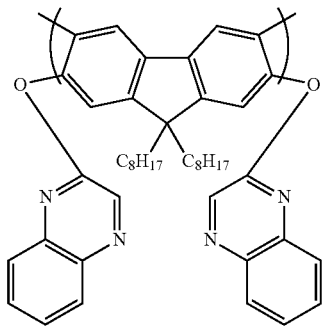
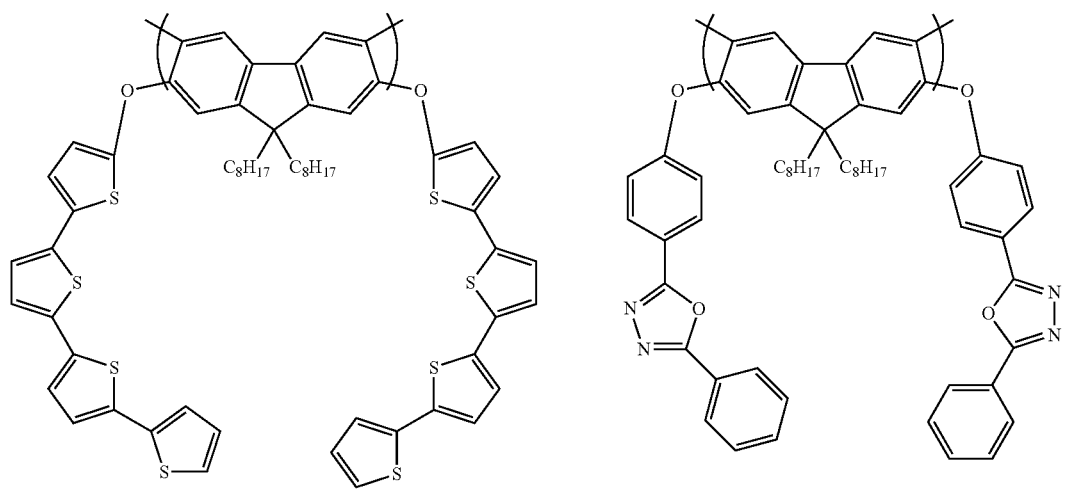

[Formula 52-2]
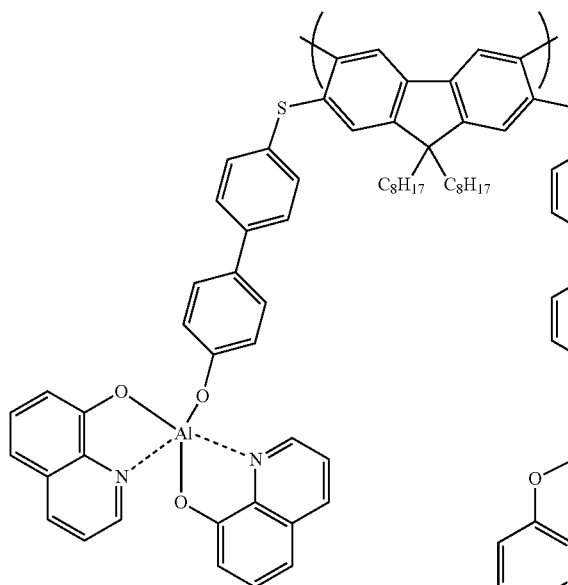
(6-4-2)
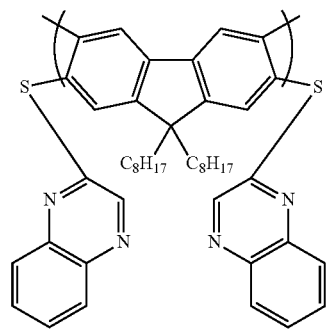
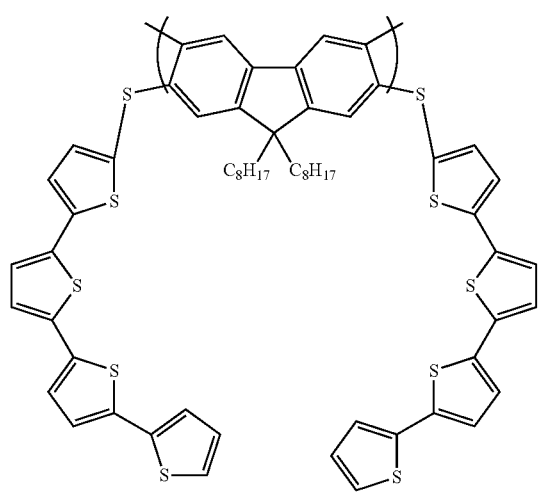
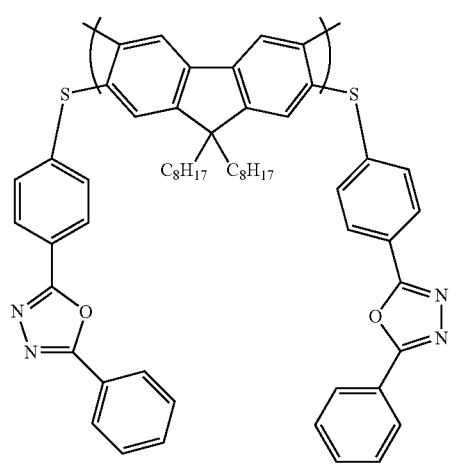

127
128
-continued
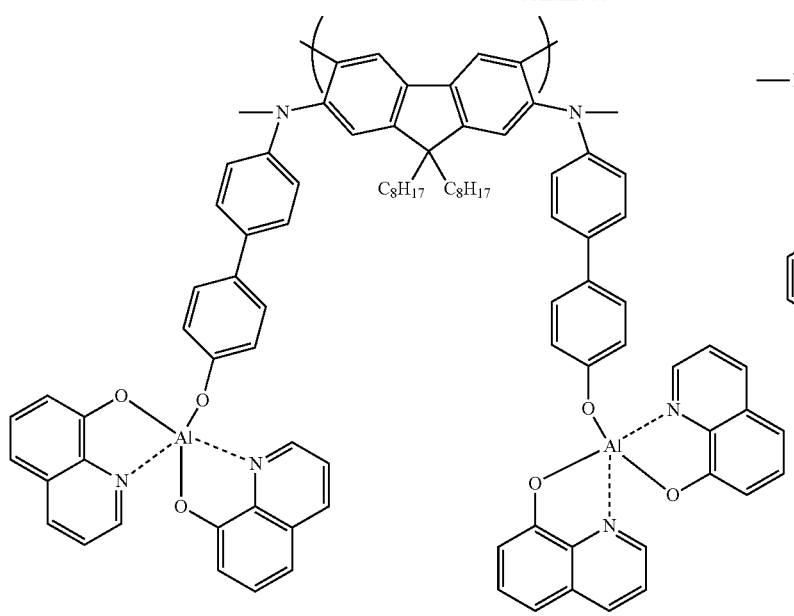
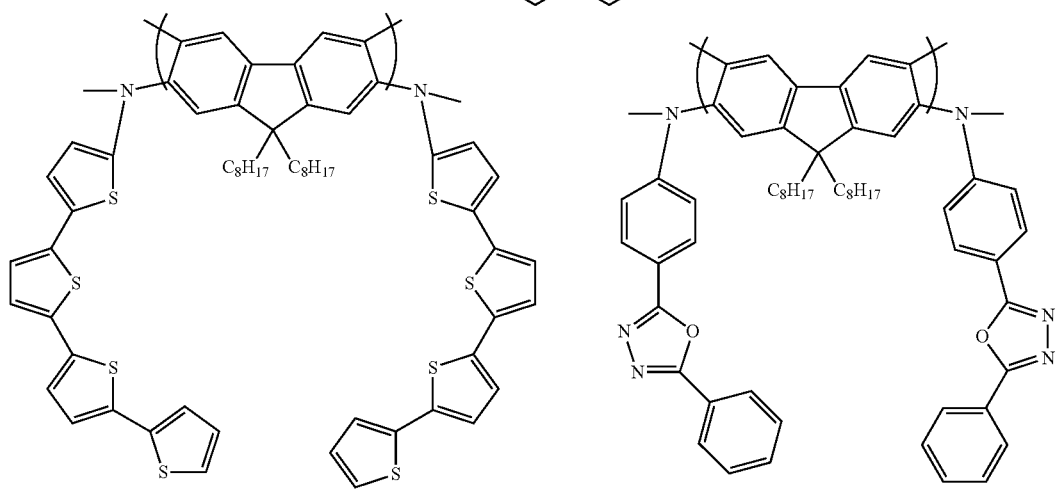
[Formula 53]
(7-1)
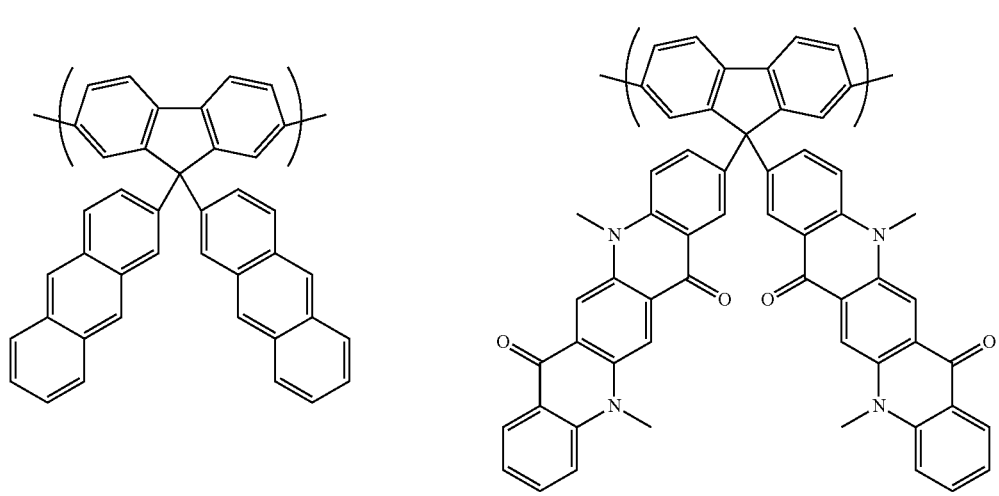

-continued
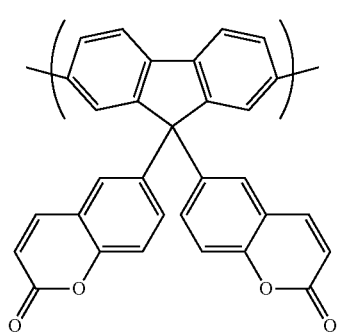
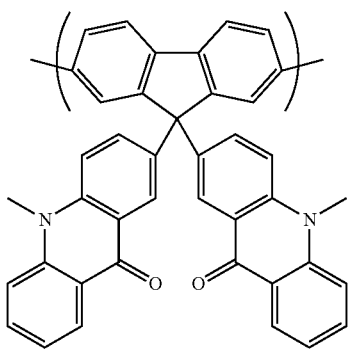
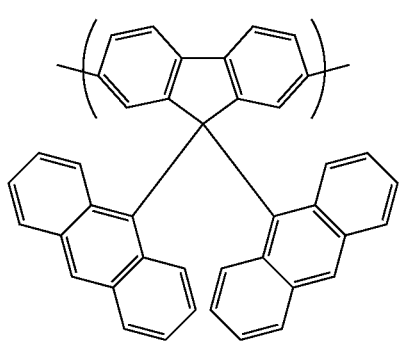
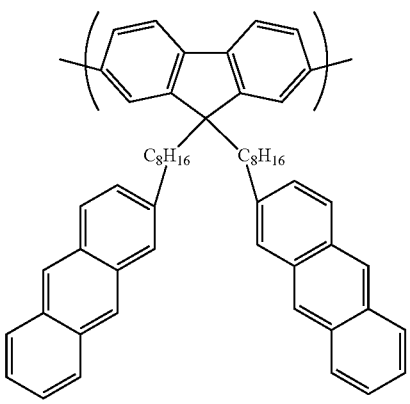
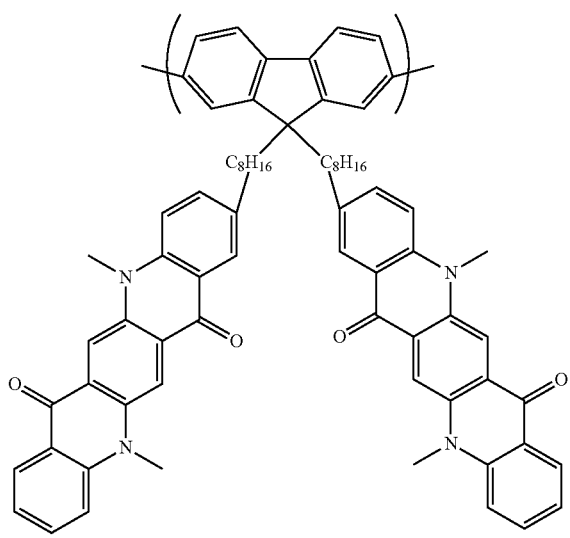
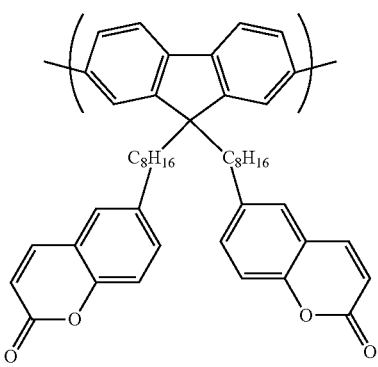
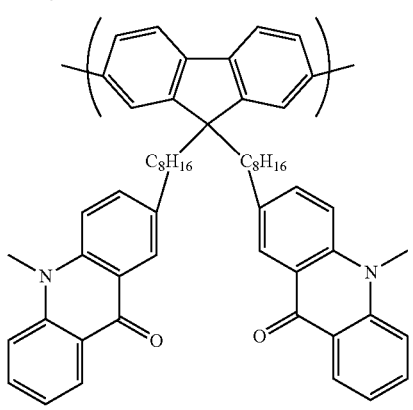
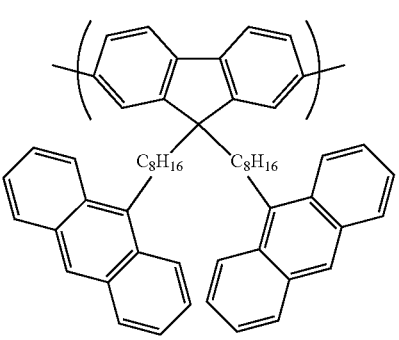

[Formula 54]
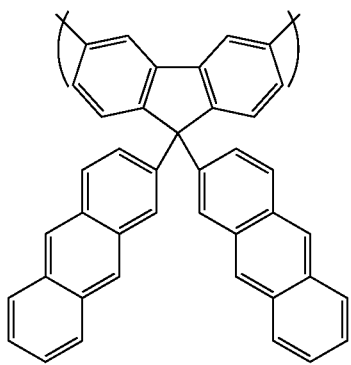
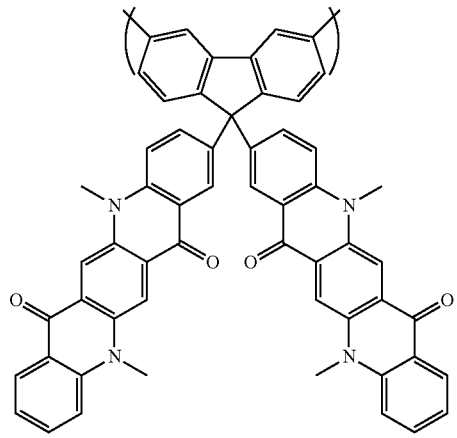
(7-2)
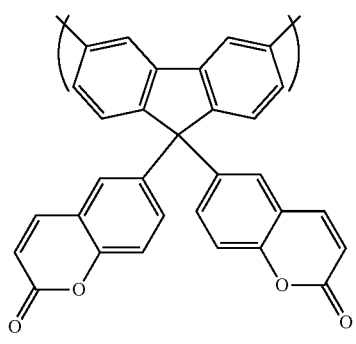
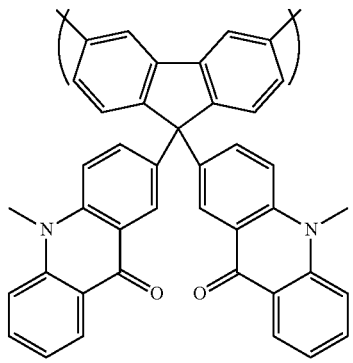
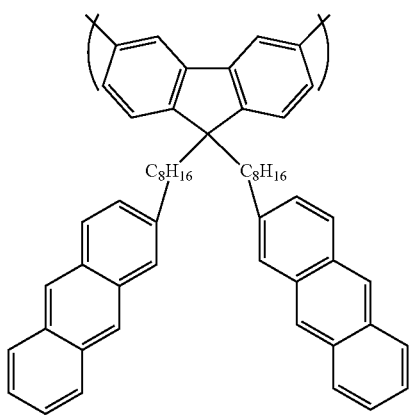
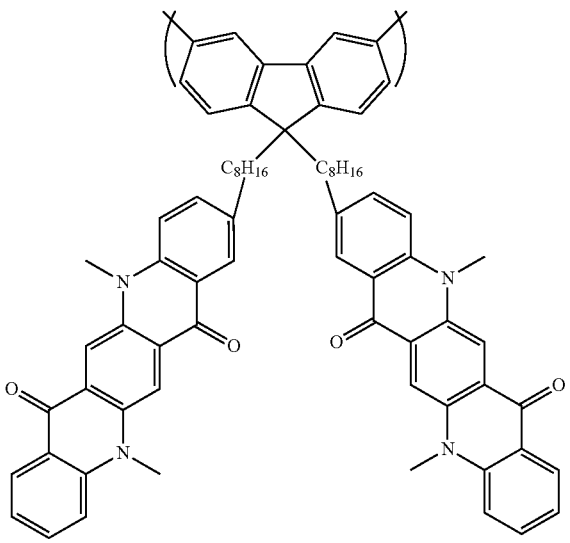

133
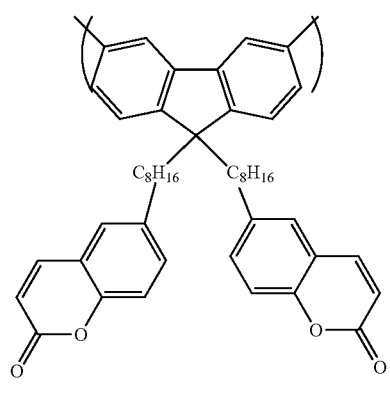
134
-continued
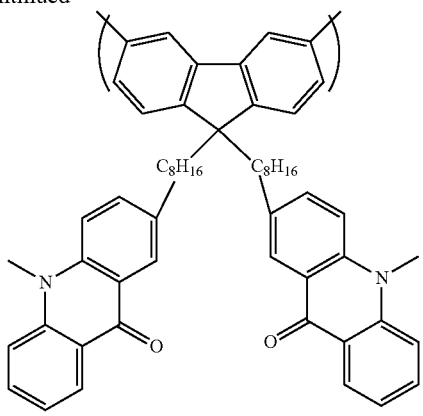
[Formula 55-1]
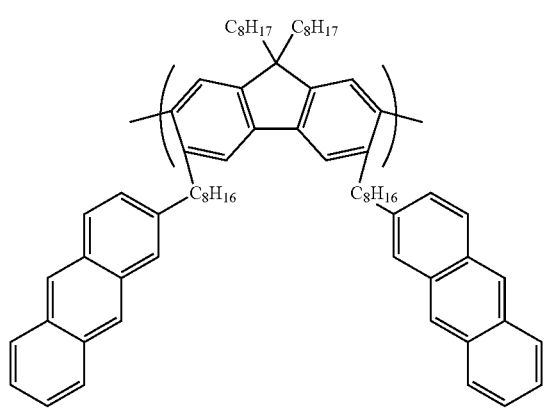
(7-3-1)
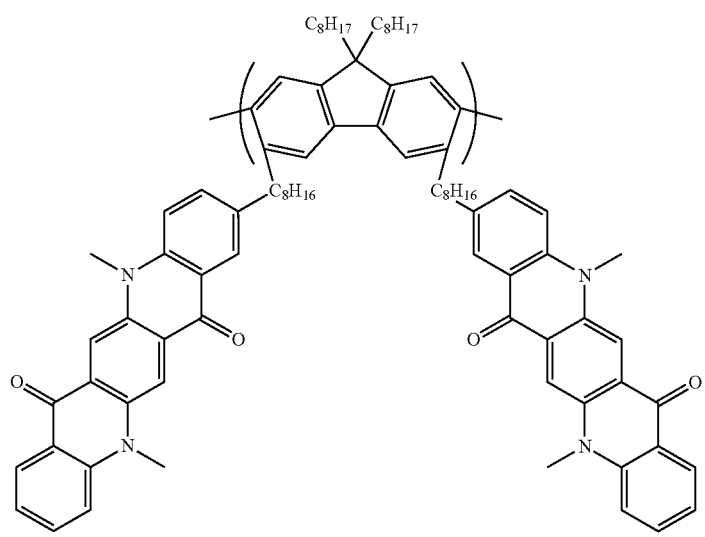

-continued
135
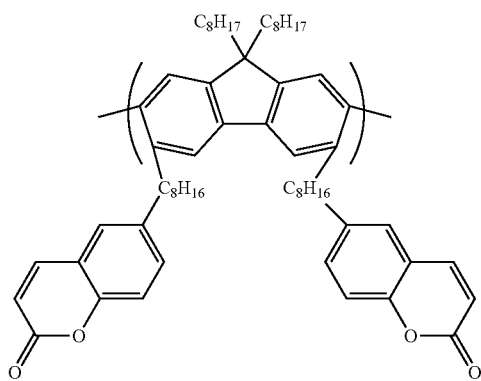
136
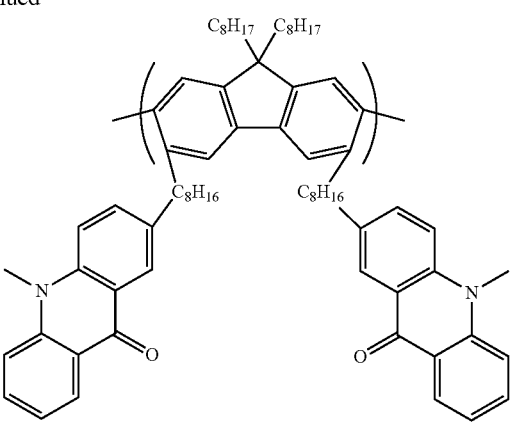
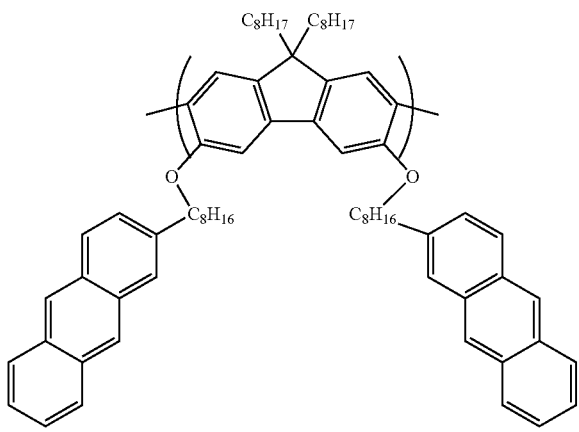
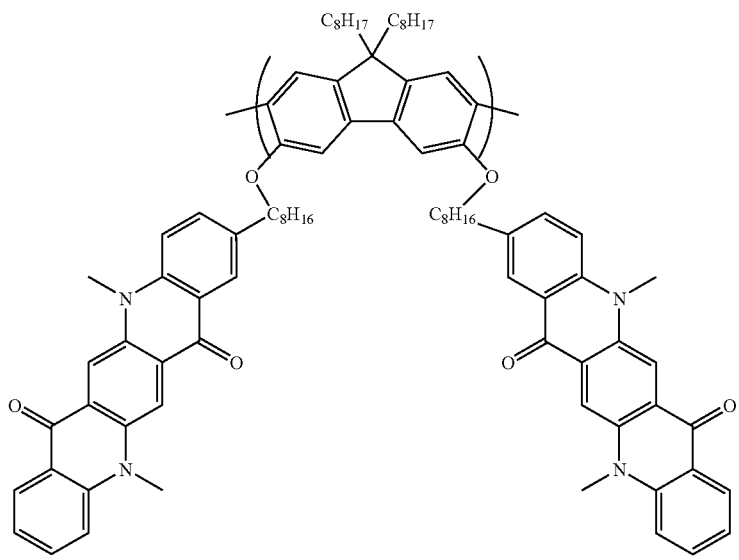

-continued
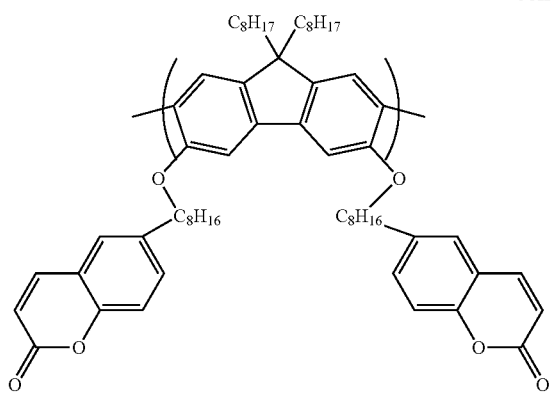
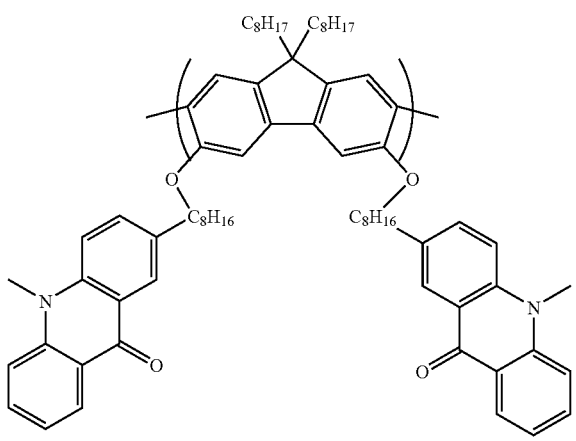
[Formula 55-2]
(7-3-2)
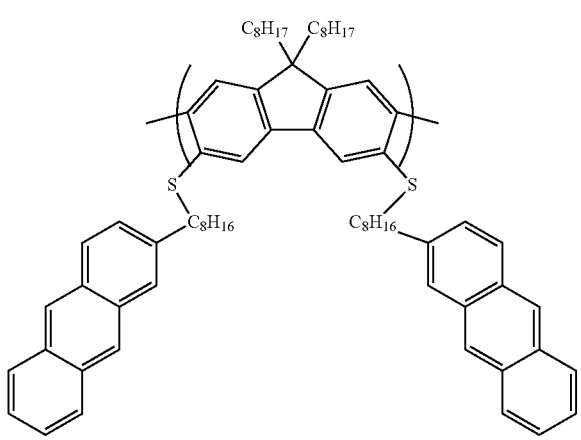

-continued
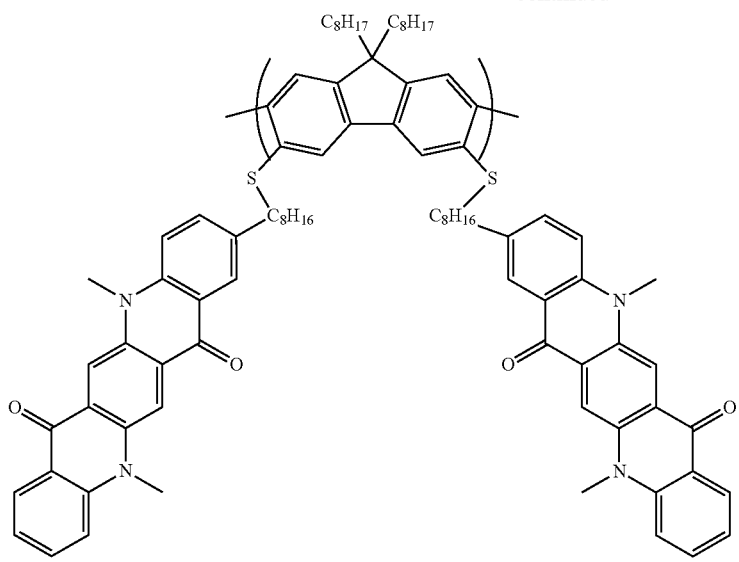
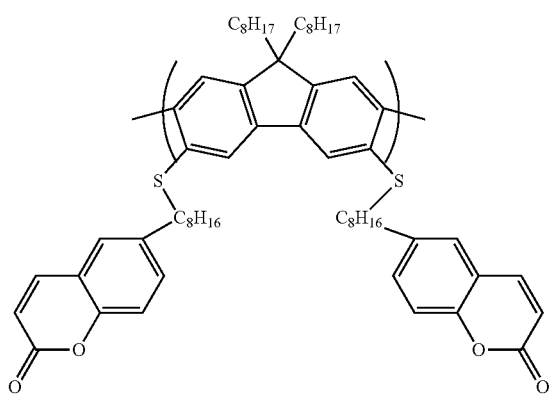
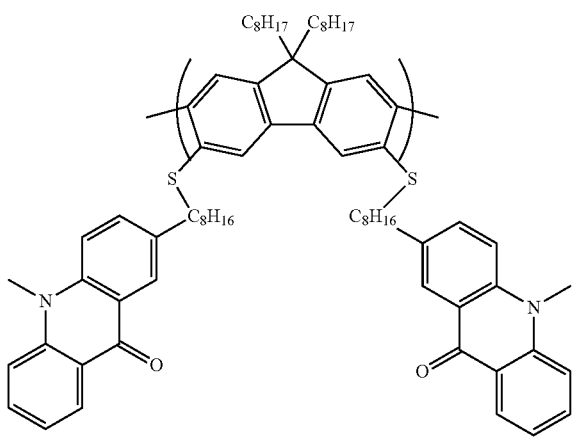

141
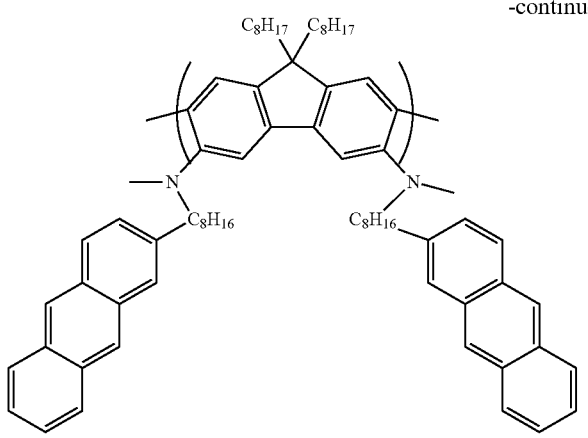
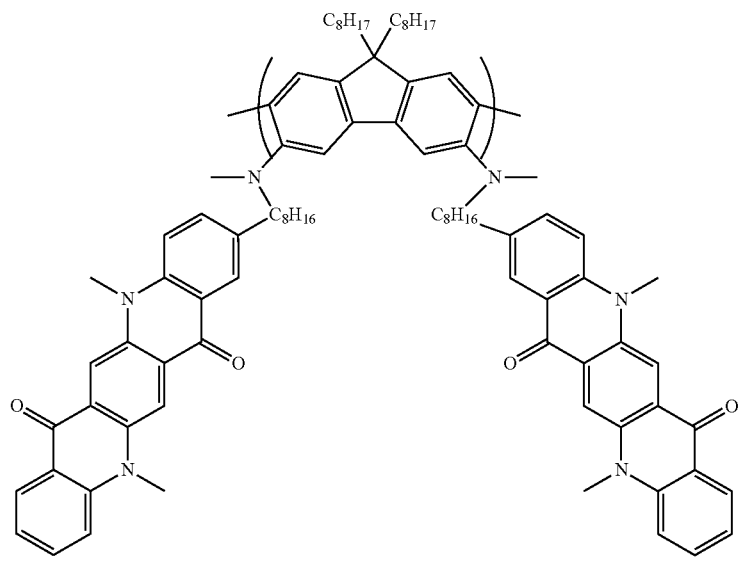
142
-continued
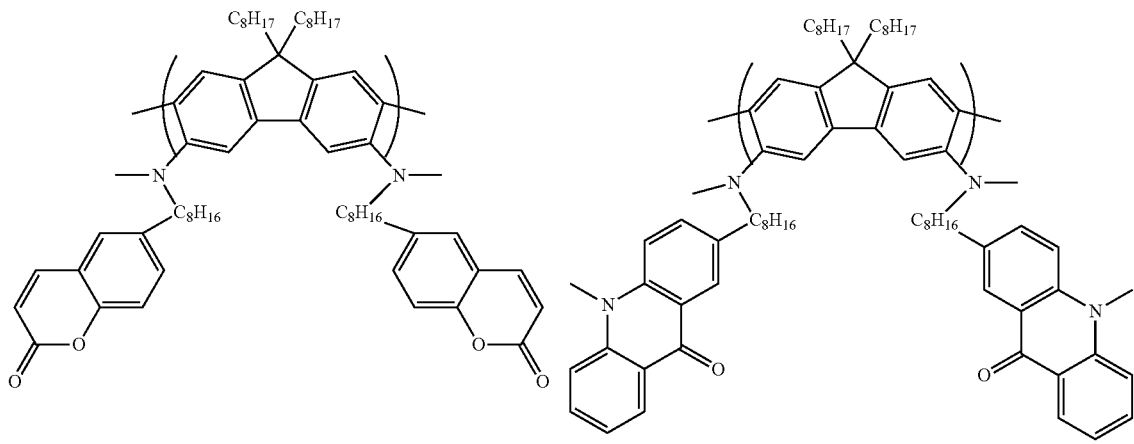

[Formula 56-1]
(7-4-1)
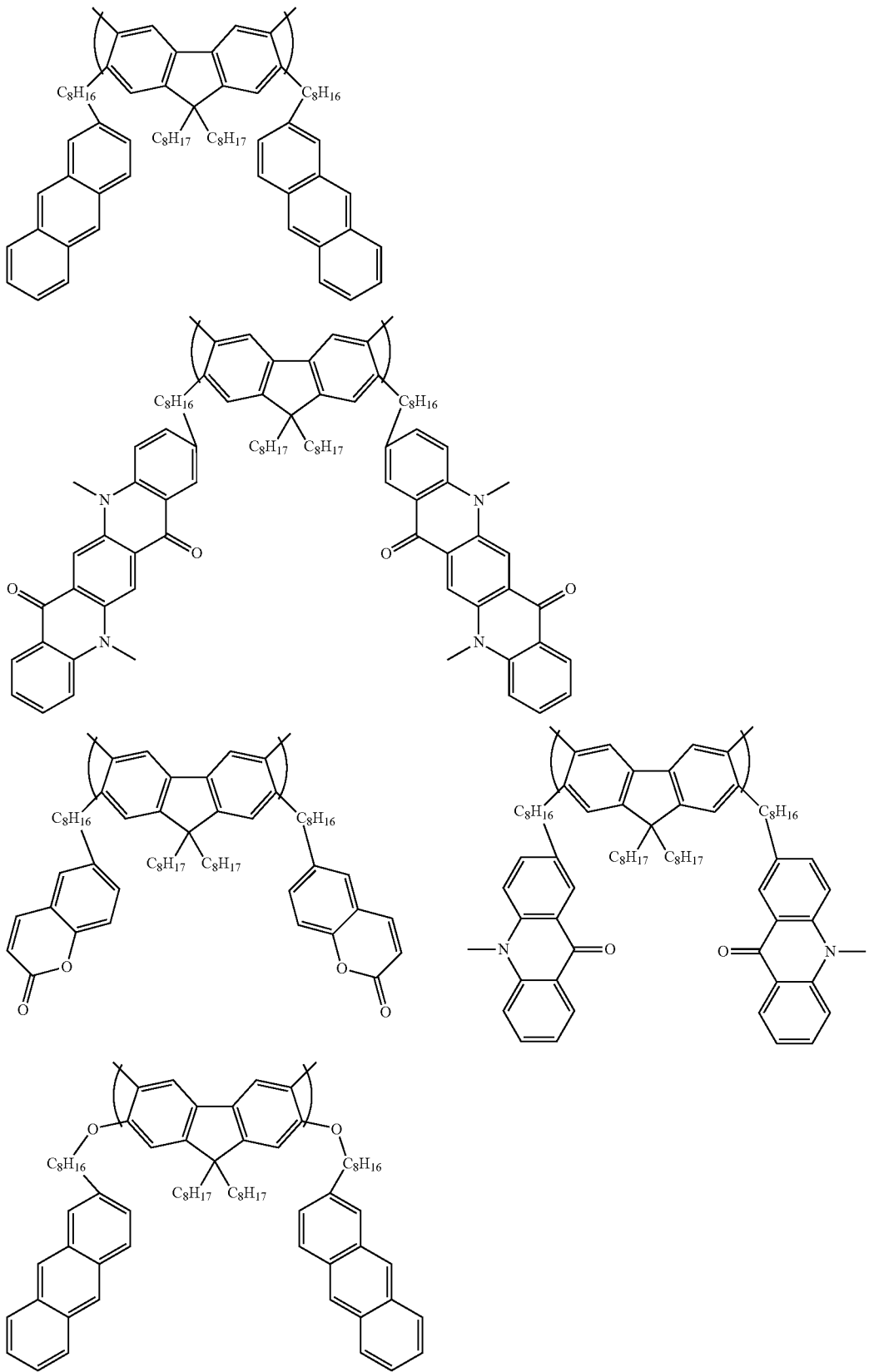

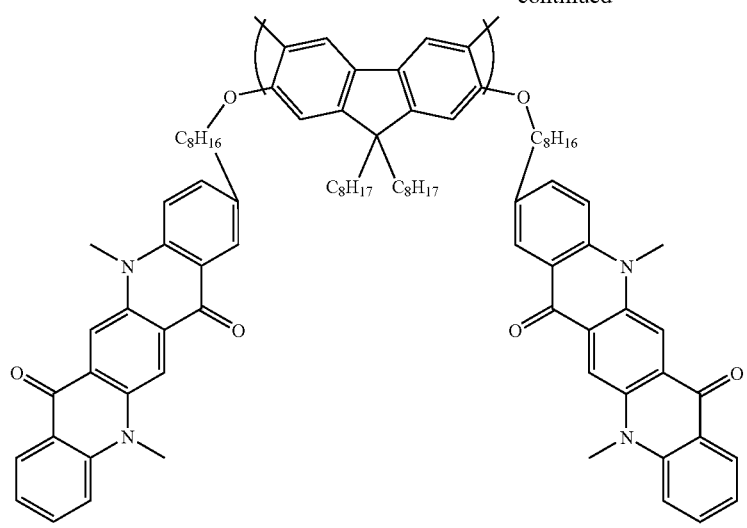
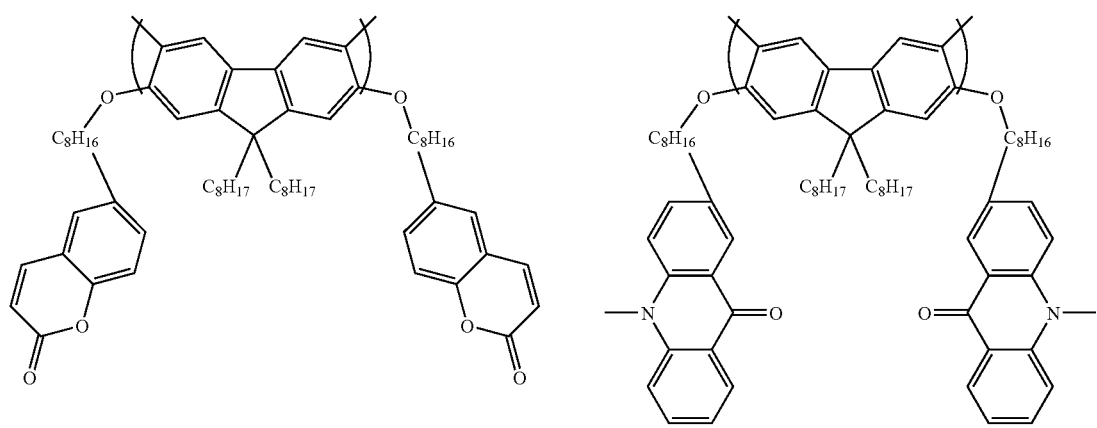
[Formula 56-2]
(7-4-2)
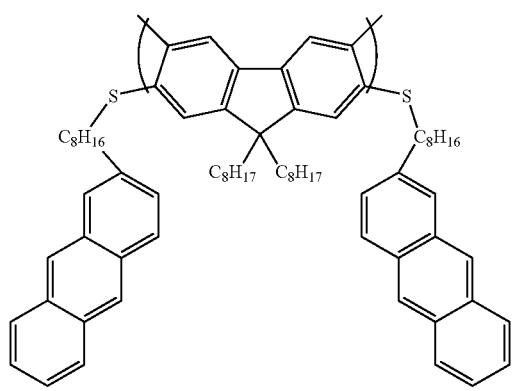

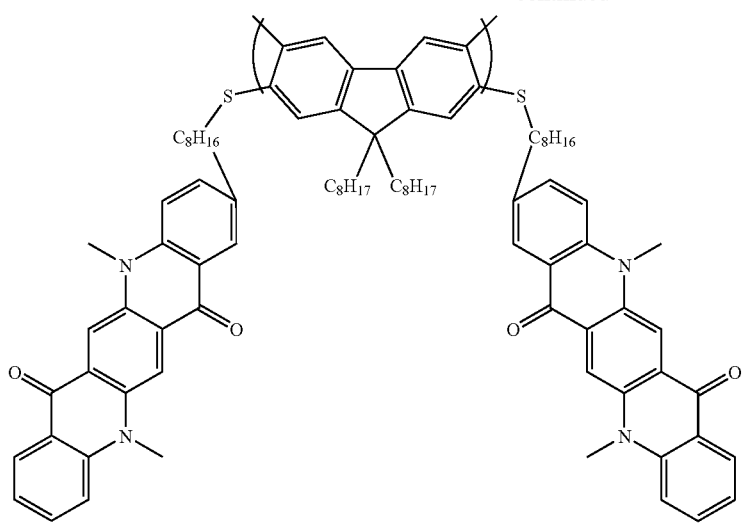
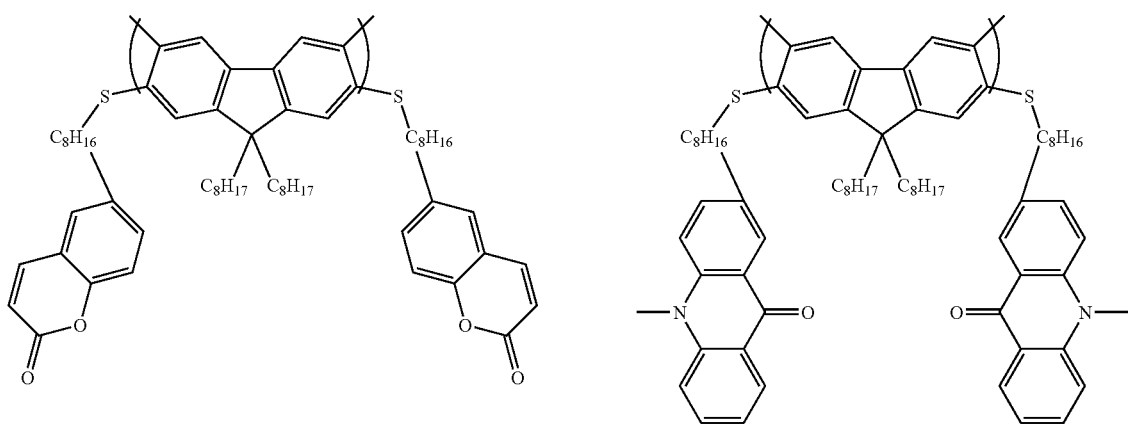
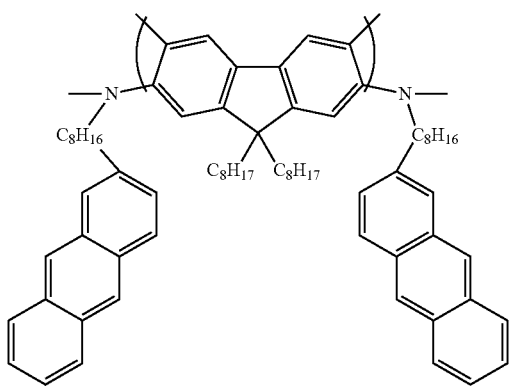

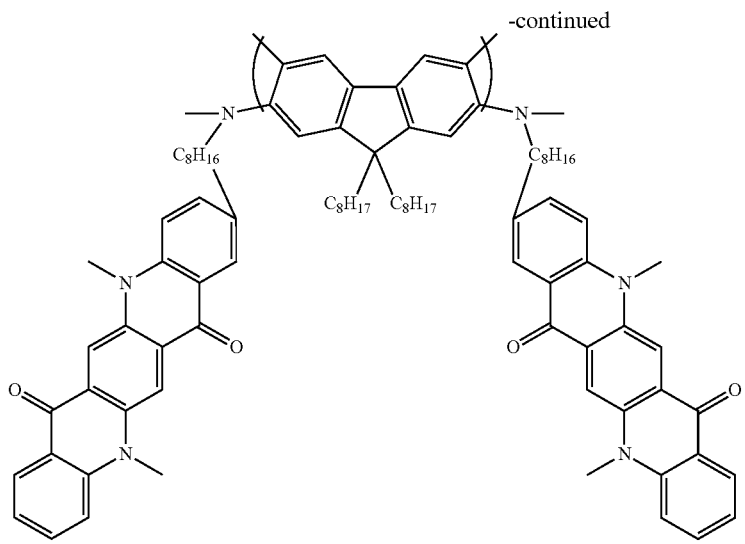

A polymer compound according to the present invention is preferably a copolymer containing the aforementioned repeat unit and one or more other types of repeat units in view of changing light emission wavelength, improving light emission efficiency and improving heat resistance. Examples of the "other types of repeat units" preferably include those represented by the following formula (8).

$$—Ar_1— \quad (8)$$

where $Ar_1$ is each independently represents an arylene group, divalent heterocyclic group or divalent group having a metal complex structure.

Examples of the arylene group, divalent heterocyclic group or divalent group having a metal complex structure include the same groups as mentioned above.

Of the repeat units represented by the aforementioned formula (8), those represented by the following formulas (9), (10), (11) or (12) are preferable.

[Formula 57]

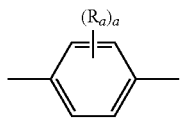

(9)

where $R_a$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group or nitro group; a represents an integer from 0 to 4; and when a plurality of $R_a$ are present, they may be the same or different.

[Formula 58]

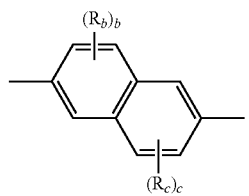

(10)

where $R_b$ and $R_c$ are each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group or nitro group;

b and c each independently represent an integer from 0 to 3; and when a plurality of $R_b$ and $R_c$ are present, they may be the same or different.

[Formula 59]

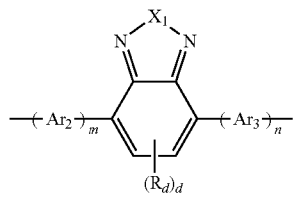

(11)

where $R_d$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group or nitro group;

d represents an integer from 0 to 2;

$Ar_9$ and $Ar_{10}$ each independently represent an arylene group, divalent heterocyclic group or a divalent group having a metal complex;

m and n, each independently represent 0 or 1;

$X_1$ is O, S, SO, $SO_2$, Se or Te; and when a plurality of $R_d$ are present, they may be the same or different.

[Formula 60]

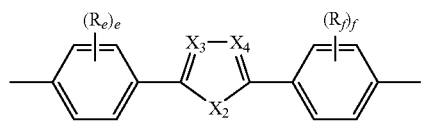

(12)

where $R_e$ and $R_f$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, cyano group or nitro group;

e and f each independently represent an integer from 0 to 4;

$X_2$ is O, S, SO, $SO_2$, Se, Te N—$R^7$ or $SiR^8R^9$;

$X_3$ and $X_4$ each independently represent N or C—$R^{10}$;

$R^7$, $R^8$, $R^9$ and $R^{10}$ each independently represent a hydrogen atom, alkyl group, aryl group, arylalkyl group or a monovalent heterocyclic group; and when a plurality of $R_e$, $R_f$ and $R^{10}$ are present, they may be the same or different.

Examples of the 5-membered ring at the center of the repeat unit represented by formula (12) include thiadiazole, oxadiazole, triazole, thiophene, furan and silole.

The repeat units represented by the aforementioned formula (13) are preferable included also in view of changing light emission wavelength, improving light emission efficiency and improving heat resistance.

[Formula 61]

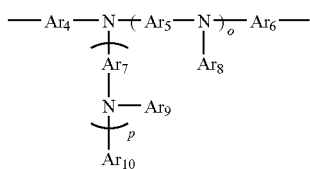

(13)

where $Ar_4$, $Ar_5$, $Ar_6$ and $Ar_7$ each independently represent an arylene group or a divalent heterocyclic group; $Ar_8$, $Ar_9$ and $Ar_{10}$ each independently represent an aryl group or a monovalent heterocyclic group; $Ar_4$, $Ar_5$, $Ar_6$, $Ar_7$ and $Ar_8$ may have a substituent; and o and p each independently represent an integer of 0 or 1 and $0 \leq o+p \leq 1$.

Specific examples of the repeat unit represented by the aforementioned formula (13) include those represented by the following formulas 133 to 140.

[Formula 62]

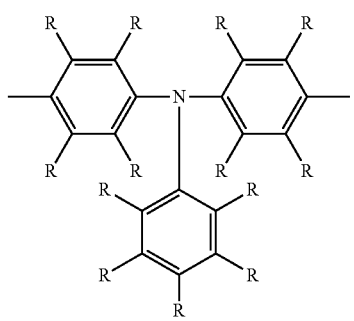

133

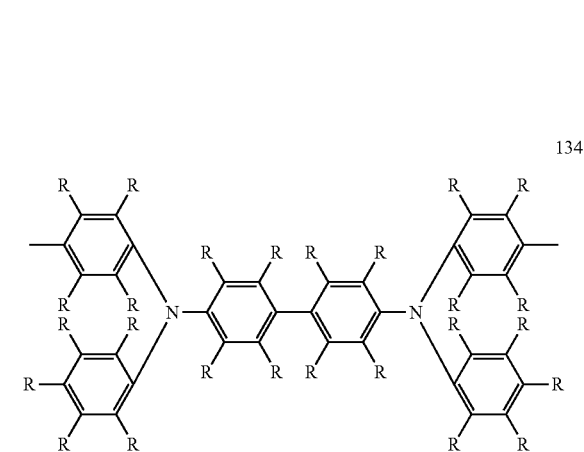

134

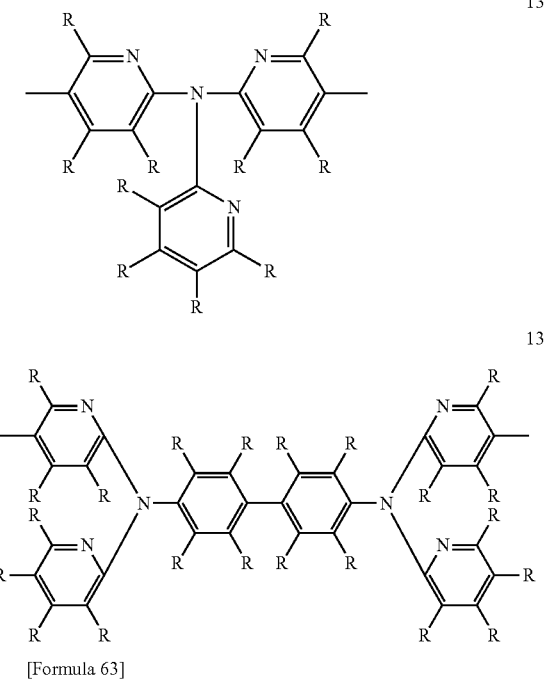

135

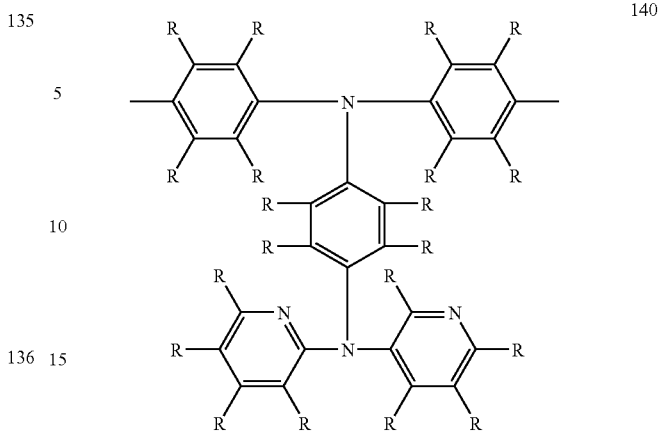

140

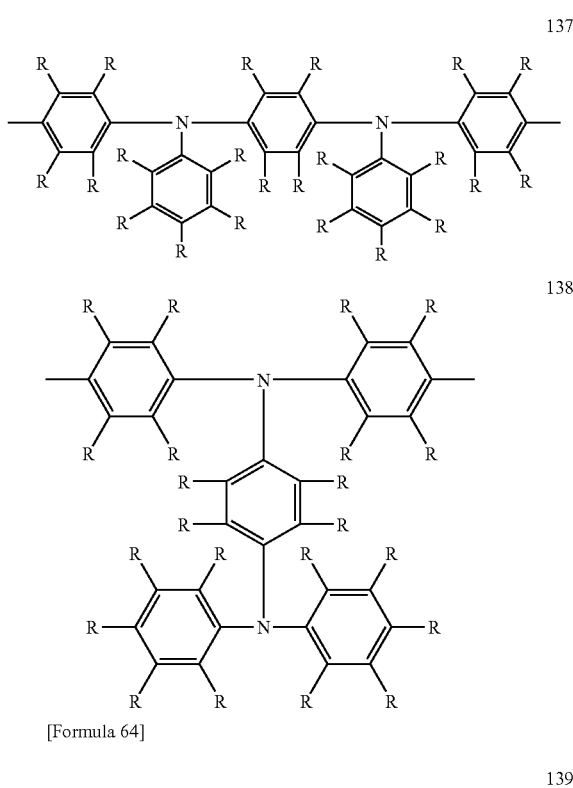

[Formula 63]

137

138

[Formula 64]

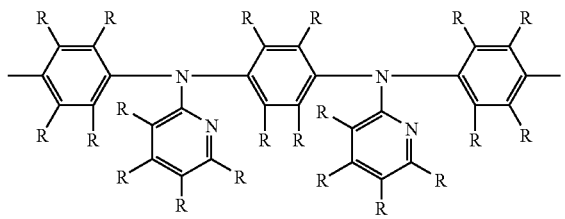

139

In the aforementioned formulas, R is the same as that in the cases of aforementioned formulas 1 to 132. To increase solubility of a polymer compound to a solvent, the polymer compound is preferably at least one atom other than a hydrogen atom, and symmetricalness in shape of a repeat unit including a substituent is preferably low.

In the aforementioned formulas, when R is a substituent including alkyl, in order to increase solubility of a polymer compound in a solvent, at least one cyclic or branched alkyl is preferably contained.

Furthermore, in the aforementioned formulas, when R partly contains an aryl group and a heterocyclic group, these groups may have one or more substituents.

In the repeat unit represented by the aforementioned Formula (13), it is preferable that $Ar_4$, $Ar_5$, $Ar_6$ and $Ar_7$ each independently represent an arylene group; $Ar_8$, $Ar_9$ and $Ar_{10}$ each independently represent an aryl group.

Of them, $Ar_8$, $Ar_9$ and $Ar_{10}$ preferably each independently represent an aryl group having 3 or more substituents; more preferably a phenyl group having 3 or more substituents, a naphthyl group having 3 or more substituents, or an anthranyl group having 3 or more substituents; and further preferably, a phenyl group having 3 or more substituents.

Of them, it is preferable that $Ar_8$, $Ar_9$ and $Ar_{10}$ each independently represent the following formula (13-1) and satisfy the relationship: o+p=1.

[Formula 65]

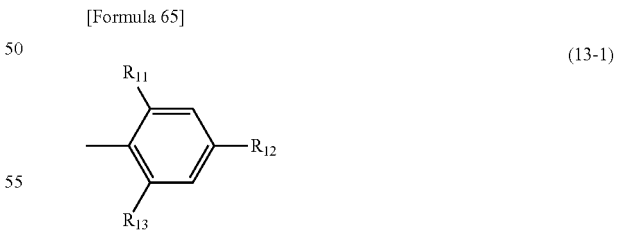

(13-1)

where $R^{11}$, $R^{12}$ and $R^{13}$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group, or halogen atom.

More preferably, in the formula (13-1), $R_{11}$ and $R_{13}$ each independently represent an alkyl group having 3 or less carbon atoms, alkoxy group having 3 or less carbon atoms or alkylthio group having 3 or less carbon atoms; and $R_{12}$ is an alkyl group having 3 to 20 carbon atoms, alkoxy group having 3 to 20 carbon atoms or alkylthio group having 3 to 20 carbon atoms.

In view of light emission efficiency, the repeat unit represented by the aforementioned formula (8) is preferably a condensed ring and more preferably a divalent group represented by any one of the aforementioned formulas 30 to 38, G to N, 49 to 93, O to Z and AA to AC.

Of them, in view of synthesis, divalent groups represented by the aforementioned formulas 30 to 32, 36, G, J, K, M, 49 to 68, 79 to 93 are preferable; and divalent groups represented by the aforementioned formula 30, 31, 36, G, K, M, 54, 65, 67, 79, 82, 83, 87, and 93 are more preferable; and divalent groups represented by the aforementioned formula 36, G, K, 79, 82, 83, 87 and 93 are further preferable.

A polymer compound according to the present invention may be a random, block or graft copolymer, a polymer having an intermediate structure between them, for example, a random copolymer analogous to a block copolymer. In view of obtaining a light-emitting polymer having a high yield of fluorescent and phosphorescent quantum, a random copolymer analogous to a block copolymer, a block polymer or graft copolymer is more preferable than a complete random copolymer. Not only copolymers having a branched main chain and three or more terminal ends but also a dendrimer are included.

In a polymer compound according to the present invention, if a polymerizable group is left as the terminal group thereof, light emission property and lifespan of the resultant device using the polymer may decrease. Therefore the terminal group may be protected by a stable group. The stable group having a conjugate bond continued to the conjugation structure of the main chain is preferable, for example, a structure bonded to an aryl group or a heterocyclic group via a carbon-to-carbon bond may be mentioned. Specific examples thereof include substituents shown in Formula 10 of JP-A-09-45478.

Examples of a good solvent for a polymer compound according to the present invention include chloroform, methylene chloride, dichloroethane, tetrahydrofuran, toluene, xylene, mesitylene, tetralin, decalin and n-butylbenzene. The concentration of a polymer compound varies depending upon the structure and molecular weight of the polymer compound; however, the polymer compound may be dissolved in these solvents in a concentration of 0.1 wt % or more.

Next, a method of producing a polymer compound according to the present invention will be explained.

A polymer compound according to the present invention can be produced by using a compound represented by $Y_1$-A-$Y_2$ as one of the raw materials and subjecting the raw materials to condensation polymerization.

In the formula, A has a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring; the functional group directly bonded to a saturated carbon of a fluorenediyl group or bonded to the fluorenediyl group via —$R_k$—X— ($R_k$ represents an alkylene group and X represents a direct bond or bonding group) at X, that is, represents a fluorenediyl group that may be substituted.

$Y_1$ and $Y_2$ each independently represent a condensation-polymerizable substituent.

Furthermore, when a polymer compound according to the present invention has a repeat unit except -A-, condensation polymerization may be performed in the presence of a compound, which serves as a repeat unit except -A- and has two substituents involved in condensation polymerization.

As the compound having two substituents involved in condensation polymerization and serving as a repeat unit except the repeat unit represented by -A-, for example, mention may be made of a compound represented by $Y_3$—$Ar_1$—$Y_4$ (where $Ar_1$ is the same as defined above, $Y_3$ and $Y_4$ each independently represent a substituent involved in condensation polymerization.

A polymer compound according to the present invention can be produced by subjecting a compound represented by $Y_3$—$Ar_1$—$Y_4$ in addition to a compound represented by $Y_1$-A-$Y_2$ to condensation polymerization.

As a compound serving as a repeat unit except the repeat unit represented by the aforementioned formula (I) and having two substituents corresponding to the aforementioned formula (13) and involved in condensation polymerization, a compound represented by the following formula (14) may be mentioned.

[Formula 66]

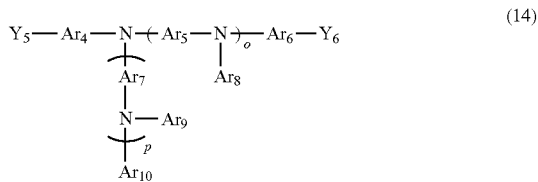

(14)

where the definitions and preferable examples of $Ar_4$, $Ar_5$, $Ar_6$, $Ar_7$, $Ar_8$, $Ar_9$, $Ar_{10}$, o and p are the same as mentioned above; and $Y_5$ and $Y_6$ each independently represent a substituent involved in condensation polymerization.

In a production method according to the present invention, examples of the substituent involved in condensation polymerization include a halogen atom, alkylsulfonate group, arylsulfonate group, arylalkylsulfonate group, boric acid ester group, sulfonium-methyl group, phosphonium-methyl group, phosphonate-methyl group, monohalogenated methyl group; —B(OH), formyl group, cyano group and vinyl group.

Examples of the halogen atom herein include a fluorine atom, chlorine atom, bromine atom and iodine atom.

Examples of the alkylsulfonate group include a methanesulfonate group, ethanesulfonate group and trifluoromethanesulfonate group. Examples of the arylsulfonate group include a benzenesulfonate group and p-toluenesulfonate group. Examples of the arylsulfonate group include a benzylsulfonate group.

Examples of the boric acid ester group include the groups represented by the following formulas.

[Formula 67]

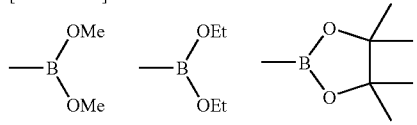

-continued

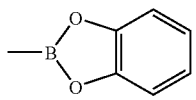

where Me represents a methyl group and Et represents an ethyl group.

Examples of the sulfonium-methyl group include the groups represented by the following formulas.

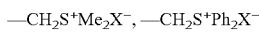

where X represents a halogen atom and Ph represents a phenyl group.

Examples of the phosphonium-methyl group include the groups represented by the following formula.

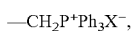

where X represents a halogen atom.

Examples of the phosphonate-methyl group include the groups represented by the following formula.

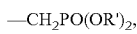

where X represents a halogen atom, R' represents an alkyl group, aryl group or arylalkyl group.

Examples of the monohalogenated-methyl group include a methyl fluoride group, methyl chloride group, methyl bromide group and methyl iodide group.

A preferable substituent as the substituent involved in condensation polymerization varies depending upon the type of polymerization reaction. For example, in a reaction such as the Yamamoto coupling reaction using a nickel(0) complex, a halogen atom, alkylsulfonate group, arylsulfonate group or an arylalkylsulfonate group may be mentioned. In a reaction such as the Suzuki coupling reaction using a nickel catalyst or a palladium catalyst, an alkylsulfonate group, halogen atom, boric acid ester group or —B(OH)$_2$ may be mentioned.

More specifically, a production method according to the present invention can be carried out by using a compound, which has a plurality of substituents involved in condensation polymerization and serves as a monomer, if necessary, dissolved in an organic solvent, in the presence of an alkali or an appropriate catalyst, at a temperature from the melting point to the boiling point (both inclusive) of the organic solvent, for example, in accordance with a known method described in publications such as "Organic Reactions", Vol. No. 14, p. 270-490, John Wiley & Sons, Inc., (1965);

Organic Syntheses", Collective Volume VI, p. 407-411, John Wiley & Sons, Inc, (1988);

Chem. Rev., Vol. No. 95, p. 2457 (1995);

J. Organomet. Chem., Vol. No. 576, p. 147 (1999); and

Makromol. Chem., Macromol. Symp., Vol. No. 12, p. 229 (1987).

In a method of producing a polymer compound according to the present invention, a known condensation reaction may be used in accordance with the substituent involved in condensation polymerization.

For example, mention may be made of a method of polymerizing corresponding monomers by the Suzuki coupling reaction, a polymerization method by the Grignard reaction, a polymerization method using an Ni(O) complex, a polymerization method using an oxidization agent such as FeCl$_3$, an electrochemical oxidization polymerization method, and polymerization by a method of decomposing an intermediate polymer having an appropriate leaving group.

Of them, a polymerization method by the Suzuki coupling reaction, a polymerization method by the Grignard reaction, a polymerization method using a Ni(O) complex are preferable since structure control can be readily made.

Of the production methods of the present invention, mention may be preferably made of a method in which substituents ($Y_1$, $Y_2$, $Y_3$, $Y_4$, $Y_5$ and $Y_6$) involved in condensation polymerization are each independently selected from the group consisting of a halogen atom, alkylsulfonate group, arylsulfonate group, and arylalkylsulfonate group and subjected to condensation and polymerization in the presence of a Ni(O) complex.

Examples of the raw material compound include a dihalogenated compound, bis(alkylsulfonate) compound, bis(arylsulfonate) compound, bis(arylalkyl sulfonate) compound, halogen-alkylsulfonate compound, halogen-arylsulfonate compound, halogen-arylalkylsulfonate compound, alkylsulfonate-arylsulfonate compound, alkylsulfonate-arylalkylsulfonate compound, and alkylsulfonate-arylalkylsulfonate compound.

In this case, mention may be made of a method of producing a polymer compound controlled in sequence by use of, as a raw material, halogen-alkylsulfonate compound, halogen-arylsulfonate compound, halogen-arylalkylsulfonate compound, arylalkylsulfonate-arylsulfonate compound, alkylsulfonate-arylalkylsulfonate compound, or arylsulfonate-arylalkylsulfonate compound.

Of the production methods of the preset invention, mention is preferably made of a method in which substituents ($Y_1$, $Y_2$, $Y_3$, $Y_4$, $Y_5$ and $Y_6$) involved in condensation polymerization are each independently selected from the group consisting of a halogen atom, alkylsulfonate group, arylsulfonate group, arylalkylsulfonate group, boric acid group and boric acid ester group and subjected to condensation and polymerization in the presence of a Ni catalyst or a palladium catalyst such that the ratio of the total mole number (J) of the halogen atom, alkylsulfonate group, arylsulfonate group and arylalkylsulfonate group contained in the all raw material compounds relative to the total mole number (K) of the boric acid (—B(OH)$_2$) group and boric acid ester group substantially becomes substantially 1 (K/J generally falls within the range of 0.7 to 1.2).

Examples of specific combination of raw materials include combinations of a dihalogenated compound, bis(alkylsulfonate) compound, bis(arylsulfonate) compound or bis(arylalkyl sulfonate) compound, and a diboric acid compound or diboric acid ester compound.

Furthermore, mention may be made of a halogen-boric acid compound, halogen-boric acid ester compound, alkylsulfonate-boric acid compound, alkylsulfonate-boric acid ester compound, arylsulfonate-boric acid compound, arylsulfonate-boric acid ester compound, arylalkylsulfonate-boric acid compound, arylalkylsulfonate-boric acid compound, and arylalkylsulfonate-boric acid ester compound.

In this case, mention may be made of a method of producing a polymer compound controlled in sequence by use of, as raw materials, a halogen-boric acid compound, halogen-boric acid ester compound, alkylsulfonate-boric acid compound, alkylsulfonate-boric acid ester compound, arylsulfonate-boric acid compound, arylsulfonate-boric acid ester compound, arylalkylsulfonate-boric acid compound, arylalkylsulfonate-boric acid compound or arylalkylsulfonate-boric acid ester compound.

The organic solvent herein varies depending upon the compounds and the reaction to be used. Generally, in order to suppress a side reaction, deoxidization treatment is sufficiently applied to the solvent to be used and the reaction is preferable performed under an inert atmosphere. Also, similarly, dewater treatment is preferably applied. However, this is not applied to the case where a reaction is performed in a binary phase of water and a solvent such as in Suzuki coupling reaction.

Examples of the solvent include saturated hydrocarbons such as pentane, hexane, heptane, octane and cyclohexane;

unsaturated hydrocarbons such as benzene, toluene, ethyl benzene and xylene;

halogenated saturated hydrocarbons such as carbon tetrachloride, chloroform, dichloromethane, chlorobutane, bromobutane, chloropentane, bromopentane, chlorohexane, bromohexane, chlorocyclohexane and bromocyclohexane;

halogenated unsaturated hydrocarbons such as chlorobenzene, dichlorobenzene and trichlorobenzene;

alcohols such as methanol, ethanol, propanol, isopropanol, butanol and t-butyl alcohol;

carboxylic acids such as formic acid, acetic acid and propionic acid;

ethers such as dimethyl ether, diethyl ether, methyl-t-butyl ether, tetrahydrofuran, tetrahydropyran and dioxane;

amines such as trimethylamine, triethylamine, N,N,N',N'-tetramethylethylenediamine and pyridine; and amides such as N,N-dimethylformamide, N,N-dimethylacetamide, N,N-diethylacetamide, and N-methylmorpholine oxide. These solvents may be used singly or in a mixture. Of them, ethers are preferable, and tetrahydrofuran and diethyl ether are further preferable.

To perform a reaction, an alkali and a suitable catalyst may be appropriately added. They may be selected depending upon the reaction to be employed. The alkali or catalyst is preferably dissolved sufficiently in the solvent to be used. As a method for blending the alkali or catalyst, mention may be made of a method of adding an alkali or catalyst to a reaction solution while gently stirring the reaction solution under an inert atmosphere such as argon and nitrogen and a method of gently adding, conversely, a reaction solution to a solution of an alkali or catalyst.

When a polymer compound according to the present invention is employed in, for example, a polymer LED, since the purity of the polymer compound has an effect upon the performance of the device such as light emission property, it is preferable that before subjecting to polymerization, a monomer is purified by a method such as distillation, sublimation purification, or recrystallization and thereafter subjected to polymerization. Furthermore, after polymerization, purification treatment such as precipitation purification or fractionation by chromatography is preferably performed.

Next, application of a polymer compound according to the present invention will be explained.

The polymer compound of the present invention generally emits fluorescence or phosphorescence in a solid state and can be used as a polymer light-emitting material (light emission material of a high molecular weight).

The polymer compound has an excellent charge transportability and suitably used as a polymer LED material and as a charge transport material. The polymer LED using the polymer light-emitting material is a high performance polymer LED capable of being driven at a low voltage with high efficiency. Therefore, the polymer LED can be used as curved and planar light sources for backlight or illumination of liquid crystal displays and used in devices such as a segment type display device and a flat panel display of dot matrix.

Furthermore, the polymer compound of the present invention may be used as a laser dye, a material for an organic solar battery, organic semiconductor for an organic transistor and a material for a electrically conductive thin film such as an electrically conductive thin film or organic semiconductor thin film.

Moreover, the polymer compound of the present invention can be used as a material for a light-emitting thin film emitting fluorescence or phosphorescence.

Next, a polymer LED according to the present invention will be explained.

The polymer LED of the present invention is characterized by having an organic layer, which is positioned between the electrodes consisting of an anode and a cathode and contains a polymer compound according to the present invention.

The organic layer may be any one of a light-emitting layer, hole transport layer, hole injecting layer, electron transport layer, electron injection layer and interlayer; however, the organic layer is preferably a light-emitting layer.

The light-emitting layer herein refers to a layer having a function of emitting light. The hole transport layer refers to a layer having a function of transporting holes. The electron transport layer refers to a layer having a function of transporting electrons. Furthermore, the interlayer refers to a layer positioned between the light-emitting layer and the cathode and adjacent to the light-emitting layer and playing a role of isolating the light-emitting layer from the cathode or light-emitting layer from the hole injection layer or the hole transport layer. Not that the electron transport layer and hole transport layer are collectively referred to as a charge transport layer. Furthermore, the electron injection layer and hole injection layer are collectively referred to as a charge injection layer. The light-emitting layer, hole transport layer, hole injection layer, electron transport layer, and electron injection layer each independently consisting of two or more layers may be used.

When an organic layer serves as a light-emitting layer, the light-emitting layer consisting of the organic layer may further contain a hole transportable material, an electron transportable material or a light-emitting material. The light-emitting material herein refers to a material emitting fluorescence and/or phosphorescence.

When a polymer compound according to the present invention is mixed with a hole transportable material, the mixing ratio of the hole transportable material relative to the total mixture is 1 wt % to 80 wt %, and preferably 5 wt % to 60 wt %.

When a polymer material according to the present invention is mixed with an electron transportable material, the mixing ratio of the electron transportable material relative to the total mixture is 1 wt % to 80 wt %, and preferably, 5 wt % to 60 wt %.

When a polymer compound according to the present invention is mixed with a light-emitting material, the mixing ratio of the light-emitting material relative to the total mixture is 1 wt % to 80 wt %, and preferably, 5 wt % to 60 wt %.

When a polymer compound according to the present invention is mixed with a light-emitting material, hole transportable material and/or electron transportable material, the mixing ratio of the light-emitting material relative to the total mixture is 1 wt % to 50 wt %, and preferably, 5 wt % to 40 wt %; and the ratio of the hole transportable material plus electron transportable material is 1 wt % to 50 wt %, and prefer ably, 5 wt % to 40 wt %. Therefore, the content of the polymer compound of the present invention is 98 wt % to 1 wt %, and preferably, 90 wt % to 20 wt %.

As the hole transportable material, electron transportable material and light-emitting material, a known low molecular weight compound, triplet light-emitting complex or polymer compound may be used; however, a polymer compound is preferably used.

As the polymer hole transportable material, electron transportable material and light-emitting material, mention may be made of a polyfluorene and a derivative and copolymer thereof; a polyarylene and a derivative and copolymer thereof; a polyarylenevinylene and a derivative and copolymer thereof; and a copolymer of an aromatic amine and a derivative thereof, which are disclosed, for example, in WO99/13692, WO99/48160, GB2340304A, WO00/53656, WO01/19834, WO00/55927, GB2348316, WO00/46321, WO00/06665, WO99/54943, WO99/54385, U.S. Pat. No. 5,777,070, WO98/06773, WO97/05184, WO00/35987, WO00/53655, WO01/34722, WO99/24526, WO00/22027, WO00/22026, WO98/27136, U.S. Pat. No. 5,736,36, WO98/21262, U.S. Pat. No. 5,741,921, WO97/09394, WO96/29356, WO96/10617, EP0707020, WO95/07955, JP-A-2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-104057, JP-A-2000-80167, JP-A-10-324870, JP-A-10-114891, JP-A-9-111233 and JP-A-9-45478.

As a fluorescent material of a low molecular weight compound, use may be made of a naphthalene derivative, anthracene or a derivative thereof; perylene or a derivative thereof; a dye such as polymethine base, xanthene base, coumarin base or cyanine base dye, a metallic complex of 8-hydroxyquinoline or a derivative thereof; aromatic amine; tetraphenylcyclopentadiene or a derivative thereof; or tetraphenylbutadiene or a derivative thereof.

More specifically, known compounds, for example, described in JP-A-57-51781 and 59-194393 may be used.

Examples of the triplet light-emitting complex include $Ir(ppy)_3$ $Btp_2Ir(acac)$ containing iridium as a core metal, PtOEP containing platinum as a core metal and $Eu(TTA)_3$phen containing europium as a core metal.

[Formula 68]

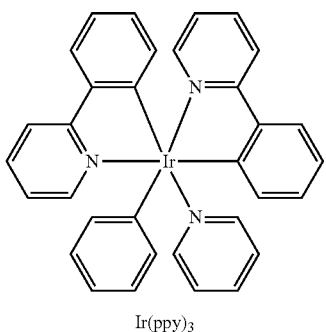

Ir(ppy)₃

[Formula 69]

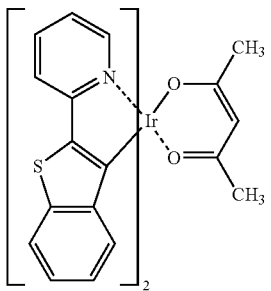

Btp₂Ir(acac)

[Formula 70]

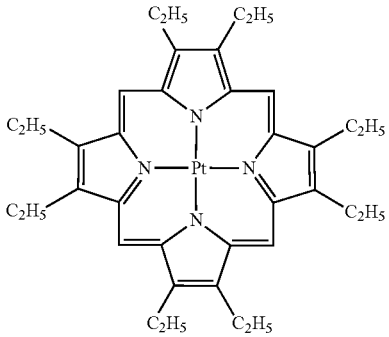

PtOEP

[Formula 71]

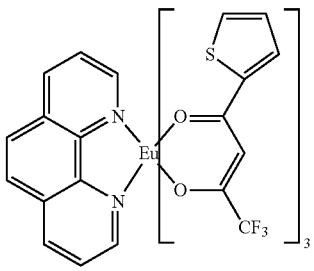

Eu(TTA)₃phen

Specific examples of the triplet light-emitting complex are described, for example, in Nature, (1998), 395, 151; Appl. Phys. Lett. (1999), 75(1), 4; Proc. SPIE-Int. Soc. Opt. Eng. (2001), 4105 (Organic Light-emitting Materials and Devices IV), 119; J. Am. Chem. Soc., (2001), 123, 4304; Appl Phys. Lett., (1997), 71 (18), 2596; Syn, Met., (1998), 94(1), 103; Syn. Met., (1999), 99 (2), 1361; Adv. Mater., (1999), 11(10), 852; and Jpn. J. Appl. Phys., 34, 1883 (1995).

A composition according to the present invention contains at least one type of material selected from a hole transportable material, electron transportable material and light-emitting material and a polymer compound according to the present invention and is used as a light-emitting material or a charge transport material.

The content ratio of at least one type of material selected from a hole transportable material, electron transportable material and light-emitting material as mentioned above relative to the polymer compound of the present invention may be determined depending upon the application; however, when the composition is as a light-emitting material, the content ratio is preferably the same as in the light-emitting layer.

A mixture of two or more polymer compounds according to the present invention can be used as a composition. To enhance the property (performance) of a polymer LED, the composition preferably contains two or more types of polymers selected from the group consisting of a polymer compound containing a hole injection/transport group at a side chain, a polymer compound containing an electron injection/transport group at a side chain, and a polymer compound containing a light-emitting group at a side chain.

In a light-emitting layer that the polymer LED of the present invention has, the optimal value of film thickness differs depending upon the material to be used and may be selected so as to have appropriate driving voltage value and light emission efficiency value. The film thickness is, for example, 1 nm to 1 μm, preferably 2 nm to 500 nm, and further preferably, 5 nm to 200 nm.

Examples of a method for forming the light-emitting layer include a method of forming a film from a solution. Examples of the method of forming a film from a solution include coating methods such as spin-coating method, casting method, microgravure coating method, gravure-coating method, bar-coating method, roll-coating method, wire-bar coating method, dip-coating method, spray-coating method, screen printing method, flexographic printing method, offset printing method, and inkjet printing method. In view of ease of pattern formation and multicolor coating, printing methods such as a screen printing method, flexographic printing method, offset printing method, and inkjet printing method are preferable.

As the ink composition to be used in printing methods, any composition may be used as long as at least one type of polymer compound according to the present invention is contained. The composition may contain a hole transportable material, electron transportable material, light-emitting material, solvent and additives such as a stabilizer may be contained other than a polymer compound according to the present invention.

The ratio of the polymer compound according to the present invention in the ink composition is generally 20 wt % to 100 wt % based on the total weight of the composition excluding a solvent and preferably 40 wt % to 100 wt %.

Furthermore, when a solvent is contained in an ink composition, the ratio of the solvent is generally 1 wt % to 99.9 wt % based on the total weight of the composition, preferably 60 wt % to 99.5 wt % and more preferably, 80 wt % to 99.0 wt %.

The viscosity of the ink composition varies depending upon the printing method. When the ink composition passes through an ejection apparatus in the case of inkjet printing method, the viscosity preferably falls within the range of 1 to 20 mPa·s at 25° C. in order to prevent clogging and bending at the time of ejection.

The solution of the present invention may contain additives for controlling viscosity and/or surface tension other than a polymer compound according to the present invention. Examples of the additives include a polymer compound (thickner) of a high molecular weight and a poor solvent for increasing viscosity, a polymer compound of a low molecular weight for reducing viscosity, and a surfactant for reducing surface tension may be used in an appropriate combination.

As the polymer compound of a high molecular weight, any polymer may be used as long as it is soluble in the same solvent as that of a polymer compound according to the present invention and as long as it does not inhibit light emission and charge transport. For example, polystyrene and polymethyl methacrylate of a high molecular weight or a polymer compound having a larger molecular weight of the polymer compounds of the present invention can be used. The weight average molecular weight is preferably 0.5 million or more and more preferably 1 million or more.

A poor solvent can be used as a thickner. More specifically, viscosity can be increased by adding a small amount of poor solvent for the solid matter of the solution. When a poor solvent is added for this purpose, any type and addition amount of the solvent may be used as long as the solid matter of the solution does not precipitate. In consideration of the stability during storage, the amount of the poor solvent is preferably 50 wt % or less relative to the total amount of the solvent and further preferably 30 wt % or less.

A solution according to the present invention may contain an antioxidant other than a polymer compound according to the present invention to improve storage stability. As the antioxidant, any antioxidant may be used as long as it is soluble in the same solvent for a polymer compound according to the present invention and it does not inhibit light emission or charge transport. For example, mention may be made of a phenol based antioxidant and a phosphorus based antioxidant.

When a solution according to the present invention is used as an ink composition, the solvent to be used may not be particularly limited; however, mention is preferably made of a solvent capable of dissolving or homogeneously dispersing components of the ink composition except for the solvent. Examples of the solvent include chlorine base solvents such as chloroform, methane chloride, 1,2-dichloroethane, 1,1,2-trichloroethane, chlorobenzene and o-dichlorobenzene;

ether base solvents such as tetrahydrofuran, dioxane and anisole;

aromatic hydrocarbon base solvents such as toluene and xylene;

aliphatic hydrocarbon base solvents such as cyclohexane; methylcyclohexane, n-pentane, n-hexane, n-heptane, n-octane, n-nonane and n-decane;

ketone base solvents such as acetone, methylethyl ketone, cyclohexanone, benzophenone and acetophenone;

ester solvents such as ethyl acetate, butyl acetate, ethyl-cellosolve acetate, methyl benzoate and phenyl acetate;

polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexane diol, and derivatives of these;

alcohol base solvents such as methanol, ethanol, propanol, isopropanol and cyclohexanol;

sulfoxide base solvents such as dimethylsulfoxide; and amide base solvents such as N-methyl-2-pyrrolidone and N,N-dimethylformamide.

These solvent may be used singly or in a combination of theses.

Of them, in view of solubility, homogeneity during film formation time and viscosity property of a polymer compound and the like, use is preferably made of the aromatic hydrocarbon base solvent, aliphatic hydrocarbon base solvent, ester base solvent and ketone base solvent; and more preferably, toluene, xylene, ethyl benzene, diethylbenzene, trimethylbenzene, n-propylbenzene, isopropylbenzene, n-butylbenzene, isobutylbenzene, s-butylbenzene, anisole, ethoxy benzene, 1-methylnaphthalene, cyclohexane, cyclohexanone, cyclohexylbenzene, bicyclohexyl, cyclohexenyl-cyclohexanone, n-heptyl-cyclohexane, n-hexyl-cyclohexane, 2-propyl-cyclohexanon, 2-heptanon, 3-heptanon, 4-heptanon, 2-octanone, 2-nonanone, 2-decanone, dicyclohexyl ketone, acetophenone and benzophenone.

As the number of types of solvents of the solution, in view of film formability, device characteristics etc., two or more types of solvents are preferable, 2 to 3 types of solvents are more preferable, and 2 types of solvents are further preferable.

When 2 types of solvents are contained in the solution, one of them may be present in a solid state at 25° C. In view of film formability, one of the solvent preferably has a boiling point of 180° C. or more and more preferably 200° C. or more. In view of viscosity, both types of solvents preferably dissolve 1 wt % or more of aromatic polymer at 60° C. and one of the two types of solvents may dissolve 1 wt % or more of aromatic polymer at 25° C.

When 2 types of solvents are contained in the solution, in view of viscosity and film formability, the solvent having the highest boiling point is contained in an amount of 40 to 90 wt % based on the total weight of the solvents in the solution, more preferably 50 to 90 wt %, and further preferably, 65 to 85 wt %.

The number of types of polymer compounds according to the present invention contained in a solution can be one or two or more. A polymer compound other than a polymer compound according to the present invention may be contained as long as it cannot damage device property, etc.

The solution of the present invention may contain water and a metal and a salt thereof in the rage of 1 to 1000 ppm. Examples of the metal include lithium, sodium, calcium, potassium, iron, copper, nickel, aluminum, zinc, chrome, manganese, cobalt, platinum and iridium. In addition, silicon, phosphorus, fluorine, chlorine, and bromine may be contained within the range of 1 to 1000 ppm.

A thin film can be produced by use of a solution according to the present invention in accordance with a spin-coating method, casting method, microgravure coating method, gravure-coating method, bar-coating method, roll-coating method, wire-bar coating method, dip-coating method, spray-coating method, screen printing method, flexographic printing method, offset printing method, inkjet printing method, or the like. Of them, the solution of the present invention is preferably used when a film is formed by a screen printing method, flexographic printing method, offset printing method, or inkjet printing method, and more preferably by an inkjet printing method.

Examples of the thin film to be prepared by use of a solution according to the present invention include a light-emitting thin film, electrically conductive thin film and organic semiconductor thin film.

The electrically conductive thin film of the present invention preferably has a surface resistance of 1 KΩ/□ or less. The electric conductivity of the thin film can be improved by doping a Lewis acid, an ionic compound and the like. The surface resistance is more preferably 100 KΩ/□ or less, and further preferably, 10 KΩ/□.

In the organic semiconductor thin film of the present invention, the value of larger one of an electron mobility and hole mobility is preferably not less than $10^{-5}$ cm$^2$/V/second, more preferably, not less than $10^{-3}$ cm$^2$/V/second, and further preferably, not less than $10^{-1}$ cm$^2$/V/second.

An organic transistor can be formed by forming the organic semiconductor thin film on a Si substrate having an insulating film formed of e.g., SiO$_2$ and a gate electrode formed therein and forming a source electrode and a drain electrode of Au or the like.

Furthermore, examples of a polymer LED according to the present invention include a polymer LED formed by providing an electron transport layer between an cathode and a light-emitting layer;

a polymer LED formed by providing a hole transport layer between an anode and a light-emitting layer; and a polymer LED formed by providing an electron transport layer between an cathode and a light-emitting layer and a hole transport layer between the anode and the light-emitting layer.

For example, the following structures a) to d) are specifically mentioned.

a) anode/light-emitting layer/cathode
b) anode/hole transport layer/light-emitting layer/cathode
c) anode/light-emitting layer/electron transport layer/cathode
d) anode/hole transport layer/light-emitting layer/electron transport layer/cathode (where the mark "/" means that individual layers are stacked in adjacent to each other.

Furthermore, in each of the structures, an interlayer may be provided between the light-emitting layer and the anode in adjacent to the light-emitting layer.

To describe more specifically, a') anode/interlayer/light-emitting layer/cathode
b') anode/hole transport layer/interlayer/light-emitting layer/cathode
c') anode/interlayer/light-emitting layer/electron transport layer/cathode
d') anode/hole transport layer/interlayer/light-emitting layer/electron transport layer/cathode When a polymer LED according to the present invention has a hole transport layer, examples of the hole transportable material to be employed include polyvinylcarbazole or a derivative thereof; polysilane or a derivative thereof; polysiloxane derivative having an aromatic amine in a side chain or the main chain; pyrazoline derivative; arylamine derivative; stilbene derivative; triphenyl-diamine derivative; polyaniline or a derivative thereof; polythiophene or a derivative thereof; polypyrrole or a derivative thereof; poly(p-phenylenevinylene) or a derivative thereof; and poly(2,5-thienylenevinylene) or a derivative thereof.

Specific examples of the hole transportable material include those described in JP-A-63-70257, JP-A-63-175860, JP-A-2-135359, JP-A-2-135361, JP-A-2-209988, JP-A-3-37992, and JP-A-3-152184.

Of them, as a hole transportable material for use in hole transport layer, mention may be preferably made of polymer hole transportable materials such as polyvinylcarbazole or a derivative thereof, polysilane or a derivative thereof, a polysiloxane derivative having an aromatic amine compound group in a side chain or the main chain, polyaniline or a derivative thereof, polythiophene or a derivative thereof, poly (p-phenylenevinylene) or a derivative thereof, and poly(2,5-thienylenevinylene) or a derivative thereof; and more preferably, polyvinylcarbazole or a derivative thereof, polysilane or a derivative thereof, and a polysiloxane derivative having an aromatic amine in a side chain or the main chain.

Examples of a hole transportable material of a low molecular compound include a pyrazoline derivative, arylamine derivative, stilbene derivative and triphenyl diamine derivative. The hole transportable material of a low molecular compound is preferably used by dispersing it in a polymer binder.

As the polymer binder to be mixed, it is preferred to use one which does not inhibit charge transfer extremely. Furthermore, it is suitable to use one having no intensive absorption to visible light. Example of the polymer binder include poly (N-vinylcarbazole), polyaniline or a derivative thereof, polythiophene or a derivative thereof, poly(p-phenylenevinylene)

or a derivative thereof, poly(2,5-thienylenevinylene) or a derivative thereof, polycarbonate, polyacrylate, polymethylacrylate, polymethylmethacrylate, polystyrene, polyvinylchloride and polysiloxane.

Poly(N-vinylcarbazole) or a derivative thereof can be obtained from a vinyl monomer through cation polymerization or radical polymerization.

Examples of polysilane or a derivative thereof include compounds described in Chem. Rev. Vol. No. 89, p. 1359 (1989) and the published specification of British Patent GB2300196. As a synthetic method thereof, the method described in these documents can be used. In particular, the Kipping method can be suitably used.

In polysiloxane or a derivative thereof, since a polysiloxane skeleton structure has no hole transportability, one having the aforementioned structure of a low molecular weight hole transportable material in a side chain or the main chain is suitably used. In particular, one having a hole transportable aromatic amine in a side chain or the main chain may be mentioned.

A method of forming a hole transfer layer film is not particularly limited. In the case of low molecular weight hole transportable material, a method of forming a film from a mixed solution with a polymer binder may be mentioned. In the case of a high molecular weight hole transportable material, a method of forming a film from a solution may be mentioned.

As a solvent for use in film-formation from a solution, one that can dissolve or homogenously disperse a hole transportable material is preferable. Examples of the solvent include chlorine base solvents such as chloroform, methane chloride, 1,2-dichloroethane, 1,1,2-trichloroethane, chlorobenzene and o-dichlorobenzene;

ether base solvents such as tetrahydrofuran and dioxane;

aromatic hydrocarbon base solvents such as toluene and xylene;

aliphatic hydrocarbon base solvents such as cyclohexane; methylcyclohexane, n-pentane, n-hexane, n-heptane, n-octane, n-nonane and n-decane;

ketone base solvents such as acetone, methylethyl ketone and cyclohexanone;

ester solvents such as ethyl acetate, butyl acetate and ethylcellosolve acetate;

polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexane diol, and derivatives of these;

alcohol base solvents such as methanol, ethanol, propanol, isopropanol and cyclohexanol;

sulfoxide base solvents such as dimethylsulfoxide; and amide base solvents such as N-methyl-2-pyrrolidone and N,N-dimethylformamide.

These solvent may be used singly or in combination.

Examples of the film formation method from a solution include a spin-coating method, casting method, microgravure coating method, gravure-coating method, bar-coating method, roll-coating method, wire-bar coating method, dip-coating method, spray-coating method, screen printing method, flexographic printing method, offset printing method and inkjet printing method.

As the film thickness of a hole transport layer, its optimal value varies depending upon the material to be used. The film thickness may be selected such that driving voltage and light emission efficiency take appropriately values. However, it is at least required to have a sufficient film thickness not to produce pin holes. The extremely thick film is not preferable because the driving voltage of the device increases. Accordingly, the film thickness of the hole transport layer is, for example, from 1 nm to 1 μm, preferably 2 nm to 500 nm, and further preferably, 5 nm to 200 nm.

When a polymer LED according to the present invention has an electron transport layer, as the electron transportable material to be used, a known material may be used. Examples thereof include a metal complex of oxadiazole derivative thereof;
anthraquinodimethane derivative thereof,
benzoquinone or a derivative thereof,
naphthoquinone or a derivative thereof,
anthraquinone or a derivative thereof,
tetracyanoanthraquino-dimethane or a derivative thereof,
fluorenone derivative,
diphenyl-dicyanoethylene or a derivative thereof;
diphenoquinone derivative, or
8-hydroxyquinoline or a derivative thereof;
polyquinoline or a derivative thereof;
polyquinoxaline or a derivative thereof; and
polyfluorene or a derivative thereof.

Specific examples include those described in JP-A-63-70257, JP-A-63-175860, JP-A-2-135359, JP-A-2-135361, JP-A-2-209988, JP-A-3-37992 and JP-A-3-152184.

Of them, mention is preferably made of a metal complex of oxadiazole derivative thereof, benzoquinone or a derivative thereof,
anthraquinone or a derivative thereof, or
8-hydroxyquinoline or a derivative thereof;
polyquinoline or a derivative thereof;
polyquinoxaline or a derivative thereof; and
polyfluorene or a derivative thereof, and further preferably, 2-(4-viphenyl)-5-(4-t-butylphenyl)-1,3,4-oxadiazole, benzoquinone, anthraquinone, tris(8-quinolyl)aluminum and polyquinoline.

A film formation method for an electron transport layer is not particularly limited. Examples of a film formation method using a low molecular weight electron transportable material include a vacuum deposition method for forming a film from powder and a method for forming a film from a solution or molten state. Examples of a film formation method using a high molecular weight electron transportable material include a method of forming a film from a solution or molten state. In the method of forming a film from a solution or molten state, a polymer binder as mentioned above may be used together.

As a solvent to be used in forming a film from a solution, one capable of dissolving or homogeneously dispersing an electron transportable material and/or a polymer binder is preferable. Examples of the solvent include chlorine base solvents such as chloroform, methane chloride, 1,2-dichloroethane, 1,1,2-trichloroethane, chlorobenzene and o-dichlorobenzene;

ether base solvents such as tetrahydrofuran and dioxane;

aromatic hydrocarbon base solvents such as toluene and xylene;

aliphatic hydrocarbon base solvents such as cyclohexane; methylcyclohexane, n-pentane, n-hexane, n-heptane, n-octane, n-nonane and n-decane;

ketone base solvents such as acetone, methylethyl ketone and cyclohexanone;

ester solvents such as ethyl acetate, butyl acetate and ethylcellosolve acetate;

polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexane diol, and derivatives of these;

alcohol base solvents such as methanol, ethanol, propanol, isopropanol and cyclohexanol;

sulfoxide base solvents such as dimethylsulfoxide; and amide base solvents such as N-methyl-2-pyrrolidone and N,N-dimethylformamide.

These solvent may be used singly or in combination.

As a method of forming a film from a solution or a molten state, use may be made of coating methods such as a spin-coating method, casting method, microgravure coating method, gravure-coating method, bar-coating method, roll-coating method, wire-bar coating method, dip-coating method, spray-coating method, screen printing method, flexographic printing method, offset printing method and ink-jet printing method.

As the film thickness of an electron transport layer, its optimal value varies depending upon the material to be used. The film thickness may be selected such that driving voltage and light emission efficiency take appropriately values. However, it is at least required to have a sufficient film thickness not to produce pin holes. The extremely thick film is not preferable because the driving voltage of the device increases. Accordingly, the film thickness of the electron transport layer is, for example, from 1 nm to 1 μm, preferably 2 nm to 500 nm, and further preferably, 5 nm to 200 nm.

Of the charge transport layers provided in adjacent to an electrode, one having a function of improving charge injection efficiency from the electrode and an effect of reducing the driving voltage of the device is generally called particularly as a charge injection layer (hole injection layer, electron injection layer) in some cases.

To improve adhesion properties to an electrode and improve charge injection from the electrode, the charge injection layer or an insulating layer of 2 nm or less in thickness may be provided in adjacent to the electrode. Alternatively, to improve adhesion properties to the interface or to prevent contamination, a thin buffer layer may be inserted into the interface between a charge transport layer and a light-emitting layer.

The order, number and thickness of layers to be stacked can be appropriately set in consideration of light emission efficiency and the lifespan of a device.

In the present invention, as a polymer LED having a charge injection layer (electron injection layer, hole injection layer) provided therein, mention may be made of a polymer LED having a charge injection layer in adjacent to a cathode and a polymer LED having an charge injection layer in adjacent to an anode.

For example, the following structures e) to p) may be specifically mentioned.

e) anode/charge injection layer/light-emitting layer/cathode
f) anode/light-emitting layer/charge injection layer/cathode
g) anode/charge injection layer/light-emitting layer/charge injection layer/cathode
h) anode/charge injection layer/hole transport layer/light-emitting layer/cathode
i) anode/hole transport layer/light-emitting layer/charge injection layer/cathode
j) anode/charge injection layer/hole transport layer/light-emitting layer/charge injection layer/cathode
k) anode/charge injection layer/light-emitting layer/electron transport layer/cathode
l) anode/light-emitting layer/electron transport layer/charge injection layer/cathode
m) anode/charge injection layer/light-emitting layer/electron transport layer/charge injection layer/cathode
n) anode/charge injection layer/hole transport layer/light-emitting layer/electron transport layer/cathode
o) anode/hole transport layer/light-emitting layer/electron transport layer/charge injection layer/cathode
p) anode/charge injection layer/hole transport layer/light-emitting layer/electron transport layer/charge injection layer/cathode.

Furthermore, in each of the structures, an interlayer may be provided between the light-emitting layer and the anode adjacent to the light-emitting layer. In this case, the interlayer may serve as a hole injection layer and/or hole transport layer.

Specific examples of the charge injection layer include a layer containing an electrically conductive polymer;

a layer formed between an anode and a hole transport layer and containing ionization potential value between that of an anode material and a hole transportable material contained in the hole transport layer; and a layer provided between a cathode and an electron transport layer and having an electron affinity value between that of an anode material and an electron transportable material contained in the electron transport layer.

When the charge injection layer is a layer containing an electrically conductive polymer, the electric conductivity of the electrically conductive polymer is preferably $10^{-5}$ S/cm to $10^3$ (both inclusive), more preferably $10^{-5}$ S/cm to $10^2$ (both inclusive), and further preferably $10^{-5}$ S/cm to $10^1$ (both inclusive) to reduce a leakage current between light-emitting pixels.

When the charge injection layer is a layer containing an electrically conductive polymer, the electric conductivity of the electrically conductive polymer is preferably $10^{-5}$ S/cm to $10^3$ S/cm (both inclusive), more preferably $10^{-5}$ S/cm to $10^2$ S/cm (both inclusive), and further preferably $10^{-5}$ S/cm to $10^1$ S/cm (both inclusive) to reduce a leakage current between light-emitting pixels.

To set an electric conductivity of the electrically conductive polymer at $10^{-5}$ S/cm to $10^3$ (both inclusive), generally an appropriate amount of ions are doped in the electrically conductive polymer.

The type of ions, if they are doped into a hole injection layer, are anion and if they are doped into an electron injection layer, are cations. Examples of the anions include polystyrene sulfonic acid ion, alkylbenzene sulfonic acid ion and camphor sulfonic acid ion. Examples of the cations include lithium ion, sodium ion, potassium ion and tetrabutylammonium ion.

The film thickness of a charge injection layer is from 1 nm to 100 nm, and preferably, 2 nm to 50 nm.

The material to be used in a charge injection layer may be appropriately selected in connection with the material to be used in a layer adjacent to an electrode. Examples thereof include polyaniline or a derivative thereof;
polythiophene or a derivative thereof;
polypyrrole or a derivative thereof;
polyphenylenevinylene or a derivative thereof;
polythienylenevinylene or a derivative thereof;
polyquinoline or a derivative thereof; polyquinoxaline or a derivative thereof;

an electrically conductive polymer such as a polymer containing an aromatic amine structure in the main chain or a side chain;

metal phthalocyanine (such as copper phthalocyanine); and carbon.

The insulating layer having a film thickness of 2 nm or less has a function of facilitating charge injection. Examples of the material of the insulating layer include a metal fluoride, metal oxide and organic insulating material. Examples of a polymer LED having an insulating layer of a film thickness of 2 nm or less include a polymer LED having an insulating layer having a film thickness of 2 nm or less in adjacent to a cathode, and a polymer LED having an insulating layer having a film thickness of 2 nm or less in adjacent to an anode.

For example, the following structures q) to ab) may be specifically mentioned.

q) anode/insulating layer having a film thickness of 2 nm or less/light-emitting layer/cathode r) anode/light-emitting layer/insulating layer having a film thickness of 2 nm or less/cathode s) anode/insulating layer having a film thickness of 2 nm or less/light-emitting layer/insulating layer having a film thickness of 2 nm or less/cathode t) anode/insulating layer having a film thickness of 2 nm or less/hole transport layer/light-emitting layer/cathode u) anode/hole transport layer/light-emitting layer/insulating layer having a film thickness of 2 nm or less/cathode v) anode/insulating layer having a film thickness of 2 nm or less/hole transport layer/light-emitting layer/insulating layer having a film thickness of 2 nm or less/cathode w) anode/insulating layer having a film thickness of 2 nm or less/light-emitting layer/electron transport layer/cathode x) anode/light-emitting layer/electron transport layer/insulating layer having a film thickness of 2 nm or less/cathode y) anode/insulating layer having a film thickness of 2 nm or less/light-emitting layer/electron transport layer/insulating layer having a film thickness of 2 nm or less/cathode z) anode/insulating layer having a film thickness of 2 nm or less/hole transport layer/light-emitting layer/electron transport layer/cathode aa) anode/hole transport layer/light-emitting layer/electron transport layer/insulating layer having a film thickness of 2 nm or less/cathode ab) anode/insulating layer having a film thickness of 2 nm or less/hole transport layer/light-emitting layer/electron transport layer/insulating layer having a film thickness of 2 nm or less/cathode Furthermore, in each of the structures, an interlayer may be provided between the light-emitting layer and the anode in adjacent to the light-emitting layer. In this case, the interlayer may serve as a hole injection layer and/or hole transport layer.

When an interlayer is applied to the aforementioned structures of a) to ab), the interlayer is preferably provided between an anode and a light-emitting layer and formed of a material which has an intermediate ionization potential between the anode, hole injection layer, or a hole transport layer and a polymer compound constituting the light-emitting layer.

Examples of the material for the interlayer include a polyvinylcarbazole or a derivative thereof; and a polymer having an aromatic amine in a side chain or the main chain, such as a polyarylene derivative, arylamine derivative, or triphenyl-diamine derivative.

The method of forming a film of an interlayer is not limited; however, when a polymer material is used, a method of forming a film from a solution may be mentioned.

As the solvent to be used for film formation from a solution, a solvent capable of dissolving or homogeneously dispersing a hole transportable material. Examples of the solvent include chlorine base solvents such as chloroform, methane chloride, 1,2-dichloroethane, 1,1,2-trichloroethane, chlorobenzene and o-dichlorobenzene;

ether base solvents such as tetrahydrofuran and dioxane; aromatic hydrocarbon base solvents such as toluene and xylene;

aliphatic hydrocarbon base solvents such as cyclohexane; methylcyclohexane, n-pentane, n-hexane, n-heptane, n-octane, n-nonane and n-decane;

ketone base solvents such as acetone, methylethyl ketone and cyclohexanone;

ester solvents such as ethyl acetate, butyl acetate, and ethyl-cellosolve acetate;

polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexane diol, and derivatives of these;

alcohol base solvents such as methanol, ethanol, propanol, isopropanol and cyclohexanol;

sulfoxide base solvents such as dimethylsulfoxide; and amide base solvents such as N-methyl-2-pyrrolidone and N,N-dimethylformamide.

These organic solvent may be used singly or in a combination of theses.

Examples of the method of forming a film from a solution include coating methods such as spin-coating method, casting method, microgravure coating method, gravure-coating method, bar-coating method, roll-coating method, wire-bar coating method, dip-coating method, spray-coating method, screen printing method, flexographic printing method, offset printing method, and inkjet printing method.

The film thickness of an interlayer differs in optimal value depending upon the material to be used and may be selected so as to have appropriate driving voltage value and light emission efficiency value. The film thickness is, for example, 1 nm to 1 μm, preferably 2 nm to 500 nm, and further preferably, 5 nm to 200 nm.

When the interlayer is provided in adjacent to a light-emitting layer, in particular, when both layers are formed by a coating method, the materials for the two layers are sometimes mixed with each other and negatively affect the characteristics of a device.

When the interlayer is provided by a coating method and thereafter the light-emitting layer is formed by a coating method, as a method of reducing contamination of the materials for the two layers, mention may be made of a method in which the interlayer is formed by a coating method and thereafter, the interlayer is heated to render it insoluble to the organic solvent to be used for forming the light emitting layer, and then the light-emitting layer is formed. The heating is generally performed at a temperature of about 150° C. to 300° C. and generally for about 1 minute to 1 hour. In this case, components which fail to be insoluble in the solvent can be removed by rinsing the interlayer with the solvent to be used for forming the light-emitting layer after heating and before forming the light-emitting layer. When insolubilization treatment is sufficiently performed by heating, rinse with the solvent is not required. To sufficiently perform insolubilization treatment by heating, a polymer compound containing at least one polymerizable group in a molecule is preferably used in the interlayer. In addition, the number of polymerizable groups is preferably 5% relative to the number of repeat units in a molecule.

As a substrate on which a polymer LED according to the present invention is formed, any substrate may be used as long as it cannot be influenced when an electrode is formed and then an organic material layer is formed. Examples of the substrate include substrates formed of glass, plastic, polymer film and silicon. When an opaque substrate is used, the opposite electrode is preferably transparent or semitransparent.

Generally, in a polymer LED according to the present invention, at least one of the anode or cathode is transparent or semitransparent. The anode is preferably transparent or semitransparent.

As the material for the anode, use may be made of, for example, a conductive metal oxide film and semitransparent metal thin film. Specific examples thereof include a film (NESA) formed of electrically conductive glass made of, for example, indium oxide, zinc oxide, tin oxide; and composites these such as indium tin oxide (ITO), indium/zinc/oxide, gold, platinum, silver and copper; and ITO, indium/zinc/oxide and tin oxide are preferable. Examples of the forming method include a vacuum deposition method, sputtering method, ion plating method and plating method. Furthermore, as the anode, use may be made of an organic electrically conductive film such as polyaniline or a derivative thereof or polythiophene or a derivative thereof.

The film thickness of an anode may be appropriately set in consideration of light permeability and electric conductivity, and is for example, 10 nm to 10 μm, preferably, 20 nm to 1 μm, and further preferably, 50 nm to 500 nm.

To facilitate injection of charge, a layer having an average thickness of 2 nm and formed of a phthalocyanine derivative, electrically conductive polymer or carbon or formed of a metal oxide, metal fluoride or an organic insulating material, may be provided on the anode.

As a material for the cathode to be used in a polymer LED according to the present invention, one having a small work function is preferable. Examples of the material to be used include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium;

alloys formed of at least two of them;

alloys formed of at least one of them and one selected from the group consisting of gold, silver, platinum, copper, manganese, titanium, cobalt, nickel, tungsten and tin;

graphite; and a graphite intercalation compound.

Examples of the alloy include

Magnesium-silver alloy, magnesium-indium alloy, magnesium-aluminum alloy, indium-silver alloy, lithium-aluminum alloy, lithium-magnesium alloy, lithium-indium alloy and calcium-aluminum alloy. The cathode may have a stacked structure consisting of two or more layers.

The film thickness of a cathode may be appropriately set in consideration of electric conductivity and durability, and is for example, 10 nm to 10 μm, preferably 20 nm to 1 μm and further preferable 50 nm to 500 nm.

Examples of the method of forming a cathode include a vacuum deposition method, sputtering method, laminate method in which a metal thin film is formed by thermocompression bonding. Furthermore, a layer formed of an electrically conductive polymer or a layer formed of e.g., a metal oxide, metal fluoride, or organic insulating material and having an average film thickness of 2 nm or less may be provided between the cathode and an organic layer. Alternatively, after the cathode is formed, a protecting layer for protecting the polymer LED may be applied. To use the polymer LED stably for a long time, the device may be externally protected preferably with a protecting layer and/or a protecting cover.

As the protecting layer, use may be made of e.g., a polymer compound, metal oxide, metal fluoride and metal borate. Furthermore, as the protecting cover, use may be made of e.g., glass plate and plastic plate on the surface of which treatment of lowing water permeability is applied. A method of adhering the cover tight with the substrate of a device with a thermoplastic resin or a photosetting resin, thereby sealing them, is preferably used. It is easy to prevent the device from being damaged by keeping a space by use of a spacer. If an inert gas such as nitrogen or argon is introduced into the space, it is possible to prevent oxidation of the cathode. Furthermore, if a desiccating agent such as barium oxide is placed in the space, it is possible to suppress a moisture content adsorbed in the manufacturing step from damaging the device. At least one of the methods is preferably employed.

A polymer LED according to the present invention may be used as a planar light source or a backlight of a segment type display device, a dot matrix display device and a liquid crystal display device.

To obtain planar light emission by use of a polymer LED according to the present invention, a planar anode and a planar cathode are placed so as to overlap with each other. To obtain patterned light emission, there are a method in which a mask having a patterned window is provided on the surface of the planar light-emitting device;

a method in which an organic material layer used in non light-emitting portion is formed extremely thick substantially not to emit light from the portion; and a method in which any one of or both of the anode and cathode are formed so as to have a pattern.

A pattern is formed in accordance with any one of the methods, and several electrodes are arranged so as to independently turn ON/Off. In this way, it is possible to obtain a segment type display device capable of displaying numerical values, characters, and simple symbols. Furthermore, to obtain a dot-matrix device, both an anode and a cathode may be formed in stripe form and arranged so as to cross perpendicularly with each other. Sector color display and multicolor display can be attained by a method of separately applying a plurality of types of polymer phosphors different in emission color, or by a method of using a color filter or a fluorescent conversion filter. A dot matrix device can be driven passively and may be driven actively in combination with, for example, TFT. These display devices can be used as display devices of a computer, television, portable handheld unit, mobile phone, car navigation and a view finder of a video camera, etc.

Furthermore, the planar light-emitting device is a thin-film spontaneous light-emitting device and suitably used as a planar light source for a backlight of a liquid crystal display device or a planar illumination light source. Furthermore, if a flexible substrate is used, the planar light emitting device can be used also as a curved surface light source or display device.

EXAMPLES

Now, the present invention will be more specifically explained with reference to Examples below, which will not be construed as limiting the invention.

The number average molecular weight in terms of polystyrene was obtained by SEC.

Column: TOSOH, TSKgel Super HM-H (2 columns+ TSKgel Super H 2000 (4.6 mm 1.d.×15 cm), detector: RI (SHIMADZU RID-10A), Tetrahydrofuran (THF) was used as a mobile phase.

Synthesis Example 1

Synthesis of Compound M-1

[Formula 72]

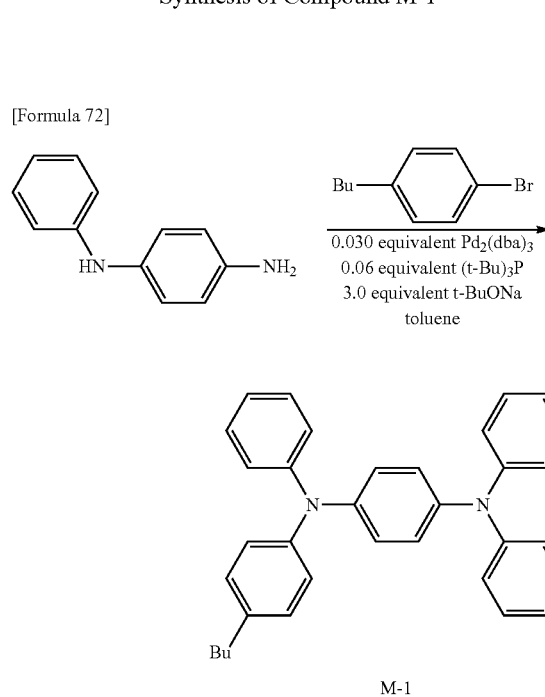

In a 300 ml four-neck flask, N-phenyl-1,4-phenylenediamine (5.53 g, 30 mmol), 4-bromo-n-butylbenzene (25.57 g, 120 mmol), Pd$_2$(dba)$_3$ (820 mg, 0.9 mmol), t-BuONa (8.65 g, 90 mmol) and toluene (120 ml) were mixed under an argon atmosphere. To the reaction solution, (t-Bu)$_3$P (360 mg, 1.8 mmol) was added and heated to 100° C. for 3 hours. After cooling, 200 ml of toluene was added. The reaction solution was washed with an aqueous NaCl solution (100 ml×3) and subsequently with water (200 ml). After the organic layer was dried over sodium sulfate, it was concentrated. The obtained liquid was purified by silica gel column chromatography (toluene:hexane=1:3) and thereafter further purified by silica gel column chromatography (hexane→toluene:hexane=1:3) to obtain 10.2 g of compound M-1.

$^1$H-NMR; δ 0.97 (9H, t), 1.37 (6H, m), 1.58 (6H, m), 2.55 (6H, t), 6.85-7.07 (18H, m), 7.17 (2H, t).

Synthesis Example 2

Synthesis of Compound M-2

[Formula 73]

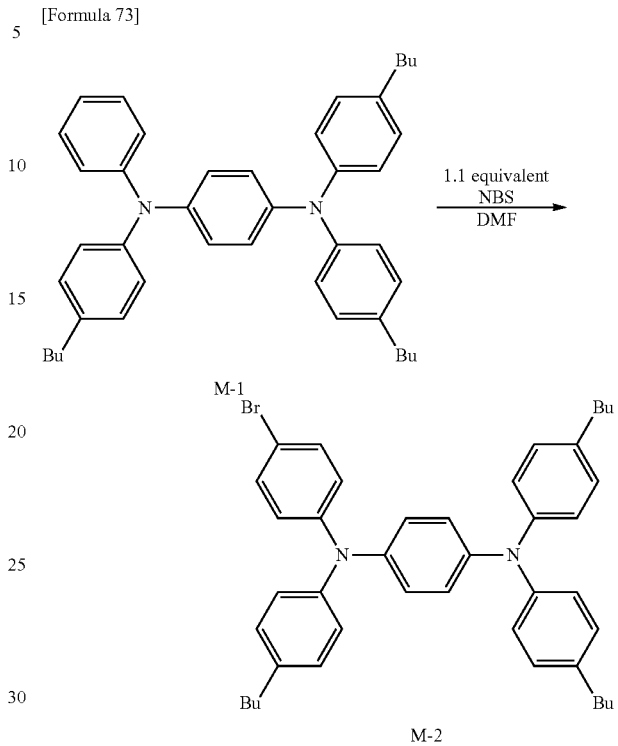

In a 100 ml four-neck flask, compound M-1 (1.45 g, 2.5 mmol), NBS (0.49 g, 0.27 mmol) and DMF (20 ml) were mixed under an argon atmosphere. The reaction solution was stirred at 0° C. for 4 hours. After completion of the reaction, 100 ml of hexane was added. The reaction mixture was washed with an aqueous KCl solution (100 ml×2) and subsequently with water (100 ml×2). After the organic layer was dried over sodium sulfate, it was concentrated. The obtained liquid was purified by silica gel column chromatography (toluene:hexane=1:6), twice to obtain 960 mg of compound M-2.

LC-MS (APCI method); m/z 660.2 ([M+H]$^+$)

Synthesis Example 3

Synthesis of Compound M-3

[Formula 74]

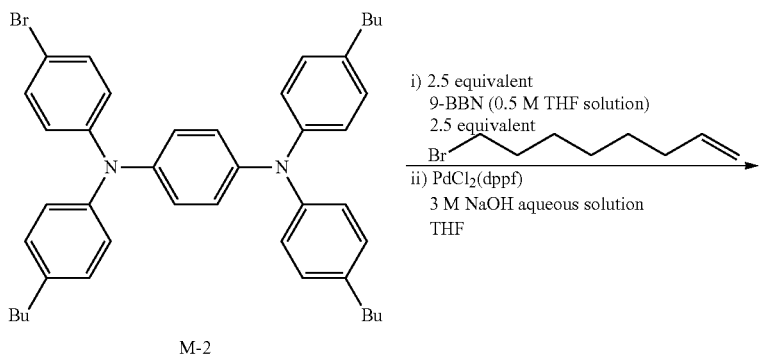

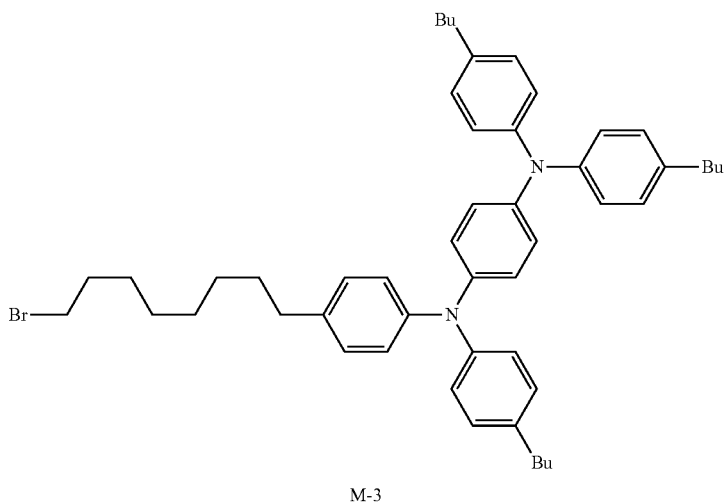

M-3

In a 300 ml three-neck flask, 8-bromooctene (1.91 g, 10 mmol) and THF (10 ml) were mixed under an argon atmosphere. To this, 9-BBN/0.5M-THF solution (20 ml, 10 mmol) was added dropwise at room temperature for 20 minutes and stirred at room temperature for 12 hours.

To the reaction solution, compound M-2 (2.64 g, 4.0 mmol), PdCl$_2$(dppf)(160 mg, 0.20 mmol), THF (10 ml) and an aqueous 3M NaOH solution (7 ml) were added. The resultant reaction solution was refluxed for 4.5 hours. After completion of the reaction, the reaction solution was cooled. To the reaction solution, hexane (20 ml) was added. While cooling the reaction solution with water, a hydrogen peroxide solution (2 ml) was added dropwise for 10 minutes and stirred at room temperature for 3 hours. The obtained organic layer was washed with water (200 ml×3), dried over sodium sulfate, concentrated and purified by silica gel column chromatography (toluene:hexane=1:10→toluene:hexane=1:3) twice to obtain 1.81 g of compound M-3.

LC-MS (APCI method); m/z 772.3 ([M+H]$^+$)

Synthesis Example 4

Synthesis of Compound M-4

[Formula 75]

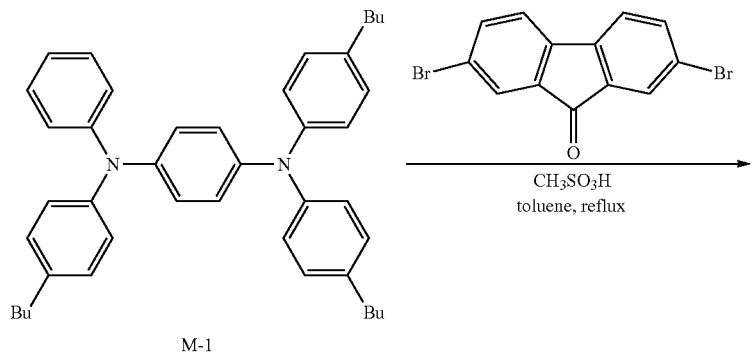

M-1

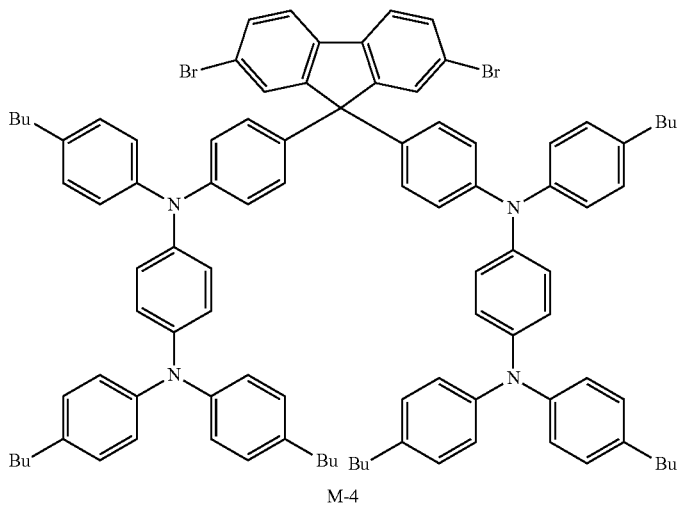

M-4

In a 100 mL eggplant flask, 2,7-dibromofluorenon (0.379 mg, 1.1 mmol), compound M-1 (1.37 g, 2.3 mmol), methane sulfonic acid (a single drop, catalyst amount), and toluene (6 ml) were mixed under an argon atmosphere, and refluxed for 15 hours. After cooling, 30 ml of toluene was added. The reaction solution was washed with an aqueous NaHCO$_3$ solution (100 ml×3) and subsequently with water (50 ml×2). The organic layer was dried over sodium sulfate and concentrated. The obtained liquid was purified by silica gel column chromatography (toluene:hexane=3:1) and thereafter further purified by silica gel column chromatography (toluene:hexane=6:1) to obtain 820 mg of compound M-4.

LC-MS (APCI method); m/z 1482.5 ([M+H]$^+$)

Synthesis Example 5

Synthesis of Compound M-5

[Formula 76]

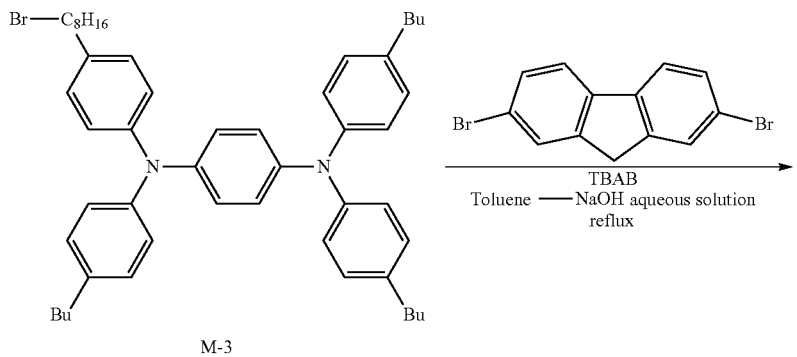

M-3

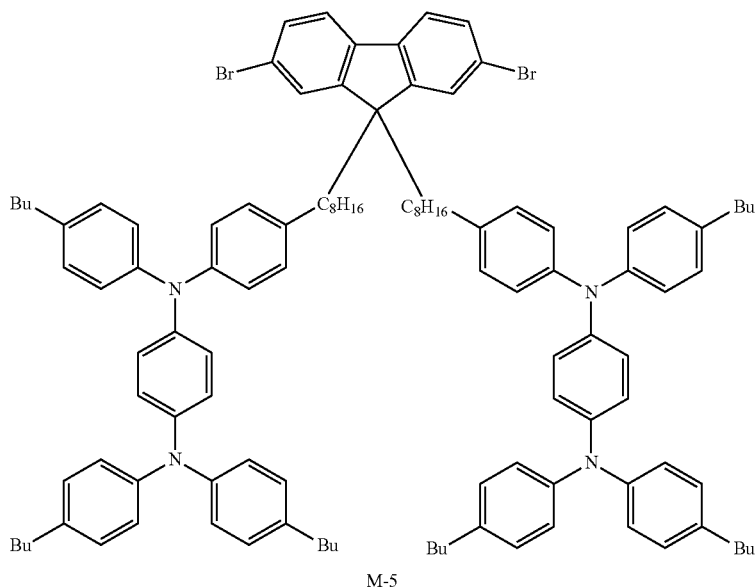

M-5

In a 100 mL eggplant flask, 2,7-dihydro-9,9-dihydrofluorene (0.26 g, 0.8 mmol), compound M-3 (1.85 g, 2.4 mmol), tetrabutylammonium bromide (50 mg, 0.8 mmol), an aqueous 50% sodium hydroxide solution (5 ml) and toluene (20 ml) were mixed under an argon atmosphere and refluxed for 13 hours. After cooling, 30 ml of toluene was added. The reaction solution was washed with water (50 ml×2). The organic layer was dried over sodium sulfate and concentrated. The obtained liquid was purified by silica gel column chromatography (toluene:hexane=1:5) and thereafter further purified by silica gel column chromatography (toluene:hexane=1:40) to obtain 820 mg of compound M-5.

LC-MS (APCI method); m/z 1705 ([M+H]$^+$)

Synthesis Example 6

Synthesis of Compound M-6

[Formula 77]

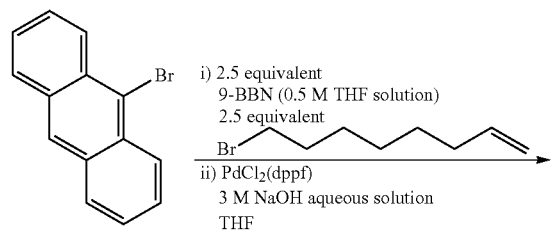

M-6

In a 300 ml three-neck flask, 8-bromooctene (12.61 g, 66 mmol) and THF (40 ml) were mixed under an argon atmosphere. To this, 9-BBN/0.5M-THF solution (132 ml, 66 mmol) was added dropwise at room temperature for 50 minutes and stirred at room temperature for 16 hours.

To the reaction solution, a compound, 9-bromoanthracene (7.71 g, 30 mmol), PdCl$_2$(dppf) (1.22 g, 1.5 mmol), THF (60 ml) and an aqueous 3M-NaOH solution (40 ml) were added and refluxed for 6.5 hours. After completion of the reaction, the reaction solution was cooled and hexane (70 ml) was added to the reaction solution. While cooling the reaction solution with water, a hydrogen peroxide solution (10 ml) was added dropwise for 30 minutes and stirred at room temperature for 4 hours. The obtained organic layer was washed with water (200 ml×3), dried over sodium sulfate, concentrated, and purified by silica gel column chromatography twice (hexane→toluene=1:2) to obtain 3.4 g of compound M-6.

LC-MS (APCI method); m/z 370.1 ([M+H]$^+$)

$^1$H-NMR; δ 1.42 (8H, t), 1.86 (4H, m), 3.41 (2H, t), 3.60 (2H, t), 7.46 (4H, m), 7.99 (2H, d), 8.26 (2H, d), 8.33 (1H, s).

Synthesis Example 7

Synthesis of Compound M-7

[Formula 78]

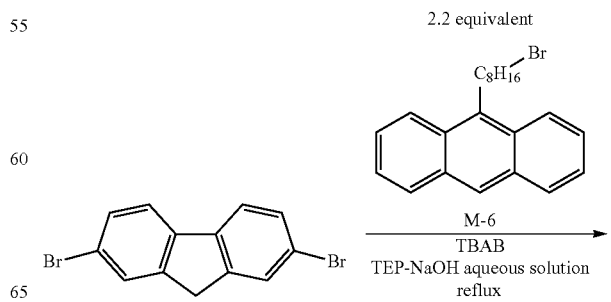

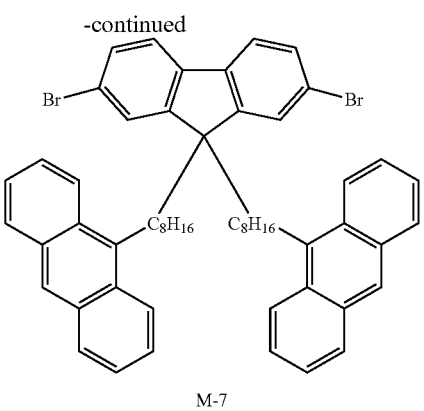

M-7

In a 100 mL eggplant flask, 2,7-dihydro-9,9-dihydrofluorene (0.62 g, 1.9 mmol), compound M-6 (1.54 g, 4.1 mmol) tetrabutylammonium bromide (140 mg, 1.9 mmol), an aqueous 50% sodium hydroxide solution (10 ml) and toluene (20 ml) were mixed under an argon atmosphere and refluxed for 5 hours. After cooling, 40 ml of toluene was added. The reaction solution was washed with water (50 ml×2). The organic layer was dried over sodium sulfate and concentrated. The obtained liquid was purified by silica gel column chromatography (toluene:hexane=1:1) and thereafter further purified by silica gel column chromatography (hexane) to obtain 830 mg of compound M-7.

LC-MS (APCI method); m/z 901.1 ([M+H]$^+$).

$^1$H-NMR; δ 0.72 (2H, m), 1.18-1.35 (6H, m), 1.57 (2H, m), 1.83 (2H, m), 2.00 (2H, t), 3.66 (2H, t), 7.55 (10H, m), 8.10 (2H, d), 8.34 (2H, d), 8.41 (1H, s).

Synthesis Example 8

Synthesis of Compound M-8

[Formula 79]

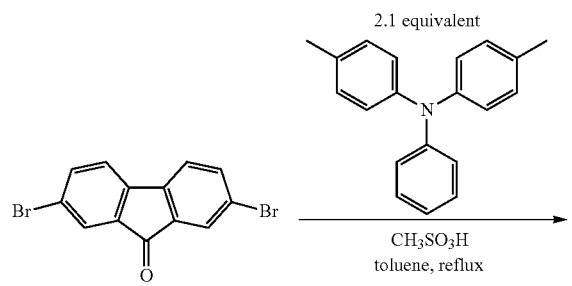

M-8

In a 200 mL eggplant flask, 2,7-dihydro-9,9-dihydrofluorene (2.94 g, 8.7 mmol), phenyl-di-p-toluylamine (4.99 g, 18.3 mmol) methane sulfonic acid (0.84 g, catalyst amount) and toluene (44 ml) were mixed under an argon atmosphere and refluxed for 15 hours. After cooling, 150 ml of toluene was added. The reaction solution was washed with an aqueous 2M NaHCO$_3$ solution (100 ml×3) and subsequently with water (100 ml×2). The organic layer was dried over sodium sulfate and concentrated. The obtained oil was purified by silica gel column chromatography (toluene:hexane=3:1) to obtain 1.33 g of compound M-8.

LC-MS (APCI method); m/z 865 ([M+H]$^+$)

Example 1

Synthesis of Polymer Compound P-1

[Formula 80]

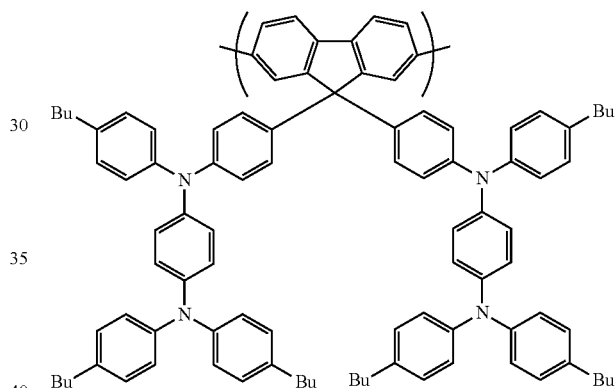

Compound M-4 (0.500 g) and 2,2'-bipyridyl (0.126 g) were dissolved, under an inert atmosphere, in dehydrated tetrahydrofuran (24 mL) previously bubbled with argon. Subsequently, bis(1,5-cyclooctadien)nickel (0){Ni(COD)$_2$} (0.223 g) was added to the reaction solution and stirred. After the temperature of the solution was raised to 60° C., the reaction was performed for 3 hours.

The reaction solution was cooled to room temperature and added dropwise to a solution mixture of 25% ammonia water (1 mL)/methanol (24 mL)/ion exchanged water (24 mL) and stirred for one hour. Thereafter, the precipitated substance was filtrated, dried under reduced pressure and subsequently dissolved in toluene (10 mL). To this, Radiolite (0.04 g) was added and stirred for 30 minutes. After insoluble matter was filtrated, the filtrate was purified through an alumina column. Subsequently, 4% ammonia water (20 mL) was added and stirred for 2 hours, and then the water layer was removed. Further, to the organic layer, about 20 mL of ion exchanged water was added and stirred for one hour, and then the water layer was removed. Thereafter, the organic layer was added to 60 ml of methanol and stirred for 0.5 hours. The precipitated substance was filtrated and dried under reduced pressure to obtain 0.28 g of polymer compound P-1.

Note that the number average molecular weight and weight average molecular weight thereof in terms of polystyrene were $Mn=9.8 \times 10^4$ and $Mw=2.3 \times 10^5$, respectively.

Example 2

Synthesis of Polymer Compound P-2

[Formula 81]

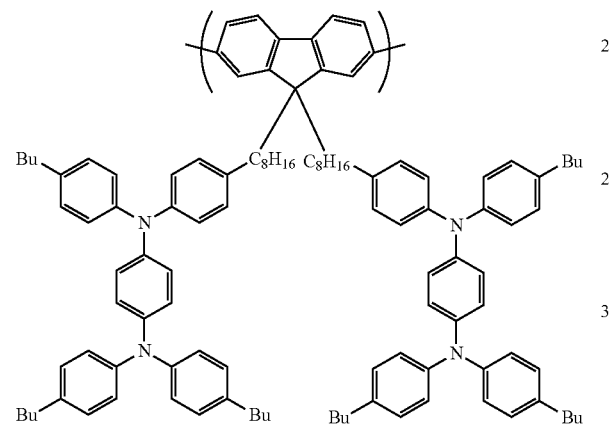

Compound M-5 (0.300 g) and 2,2'-bipyridyl (0.066 g) were dissolved, under an inert atmosphere, in dehydrated tetrahydrofuran (13 mL) previously bubbled with argon. Subsequently, bis(1,5-cyclooctadien)nickel (0){Ni(COD)$_2$} (0.116 g) was added to the reaction solution and stirred. After the temperature of the solution was raised to 60° C., the reaction was performed for 3 hours.

The reaction solution was cooled to room temperature and added dropwise to a solution mixture of 25% ammonia water (1 mL)/methanol (13 mL)/ion exchanged water (13 mL) and stirred for one hour. Thereafter, the precipitated substance was filtrated, dried under reduced pressure and subsequently dissolved in toluene (5 mL). To this, Radiolite (0.02 g) was added and stirred for 30 minutes. After insoluble matter was filtrated, the filtrate was purified through an alumina column. Subsequently, 4% ammonia water (10 mL) was added and stirred for 2 hours, and then the water layer was removed. Further, to the organic layer, about 10 mL of ion exchanged water was added and stirred for one hour, and then the water layer was removed. Thereafter, the organic layer was concentrated to 4 g under reduced pressure, added to 15 ml of methanol and stirred for 0.5 hours. The precipitated substance was filtrated and dried under reduced pressure to obtain 0.12 g of polymer compound P-2.

Note that the number average molecular weight and weight average molecular weight thereof in terms of polystyrene were $Mn=7.4 \times 10^4$ and $Mw=1.5 \times 10^5$, respectively.

Synthesis Example 9

Synthesis of Compound P-3

[Formula 82]

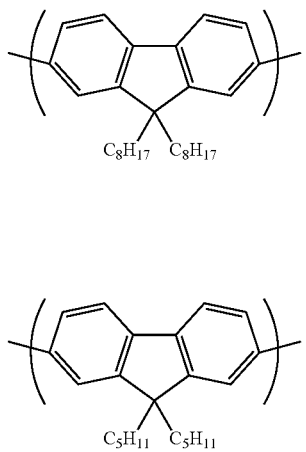

After 2,7-dibromo-9,9-di-n-octylfluorene (26.3 g, 48.0 mmol), 2,7-dibromo-9,9-bis(3-methylbutyl)fluorene (5.6 g, 12.0 mmol), and 2,2'-bipyridyl (22 g, 14.1 mmol) were dissolved in dehydrated tetrahydrofuran (1600 mL), the atmosphere of the reaction system was replaced with nitrogen by bubbling with nitrogen. To this solution, bis(1,5-cyclooctadien)nickel (0){Ni(COD)$_2$} (40.66 g, 147.8 mmol) was added under the nitrogen atmosphere. The temperature of the solution was raised to 60° C. and the reaction was performed for 8 hours while stirring. After completion of the reaction, the reaction solution was cooled to room temperature (about 25° C.) and added dropwise to a solution mixture of 25% ammonia water (1200 mL)/methanol (1200 mL)/ion exchanged water (1200 mL) and stirred for 0.5 hours. Thereafter, the precipitated substance was filtrated, dried under reduced pressure for 2 hours, and subsequently dissolved in toluene (1110 mL) and filtrated. To the filtrate, toluene was added to obtain a solution of about 2800 mL. After that, the organic layer was washed with 2000 ml of an aqueous 1N hydrochloric acid solution for one hour, 2200 mL of a 4% ammonia water for one hour, 1000 mL of ion exchanged water for 10 minutes, and further, with 1000 mL of ion exchanged water for 10 minutes. The organic layer was concentrated at 50° C. to 592 g under reduced pressure, added dropwise to 3330 mL of methanol, and stirred for 0.5 hours. The precipitated substance was filtrated, washed with 500 mL of methanol twice, and dried at 50° C. for 5 hours under reduced pressure. The yield of the obtained polymer compound P-3 was 12.6 g.

Note that the number average molecular weight and weight average molecular weight of polymer compound P-3 in terms of polystyrene were $Mn=8.7 \times 10^4$ and $Mw=1.8 \times 10^5$, respectively.

Synthesis Example 10

Synthesis of Compound P-4

[Formula 83]

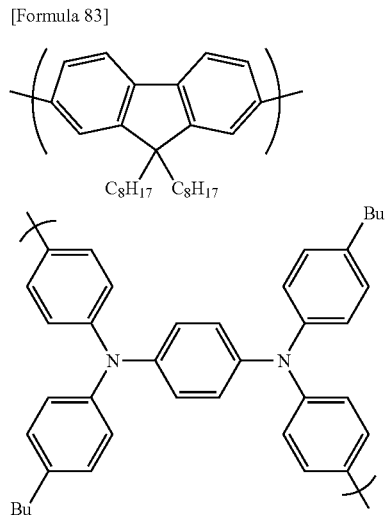

After 2,7-dibromo-9,9-dioctylfluorene (0.50 g, 0.90 mmol), N-N'-bis(4-n-butylphenyl)-N,N'-bis(4-bromophenyl)-1,4-phenylenediamine (0.27 g, 0.37 mmol) and 2,2'-bipyridyl (0.47 g, 3.1 mmol) were dissolved in dehydrated tetrahydrofuran (30 mL), the atmosphere of the reaction system was replaced with nitrogen by bubbling with nitrogen. To this solution, bis(1,5-cyclooctadien)nickel (0){Ni(COD)$_2$} (0.90 g, 3.3 mmol) was added under the nitrogen atmosphere. The temperature of the solution was raised to 60° C. and the reaction was performed for 3 hours. After completion of the reaction, the reaction solution was cooled and added dropwise to a solution mixture of 25% ammonia water (10 mL)/methanol (120 mL)/ion exchanged water (50 mL) and stirred for about one hour. Subsequently, the precipitate generated was collected by filtration. The precipitate was washed with ethanol and dried for 2 hours under reduced pressure. Subsequently, the precipitate was dissolved in toluene (30 mL). To this, 1N hydrochloric acid (30 mL) was added and stirred for one hour. The water layer was removed and 4% ammonia water (30 mL) was added to the organic layer and stirred for one hour and then the water layer was removed. The organic layer was added dropwise to 200 mL of methanol and stirred for one hour. The precipitated substance was filtrated and dried under reduced for 2 hours pressure and then dissolved in 30 mL of toluene. Thereafter, the solution was purified through an alumina column (the amount of alumina: 20 g). The collected toluene solution was added dropwise to 250 mL of methanol and stirred for one hour. The precipitated substance was filtrated and dried for 2 hours under reduced pressure. The yield of the obtained polymer compound P-4 was 0.32 g.

Note that the number average molecular weight and weight average molecular weight of polymer compound P-4 in terms of polystyrene were $2.3 \times 10^4$ and $8.5 \times 10^4$, respectively.

Example 3

Synthesis of Polymer Compound P-5

[Formula 84]

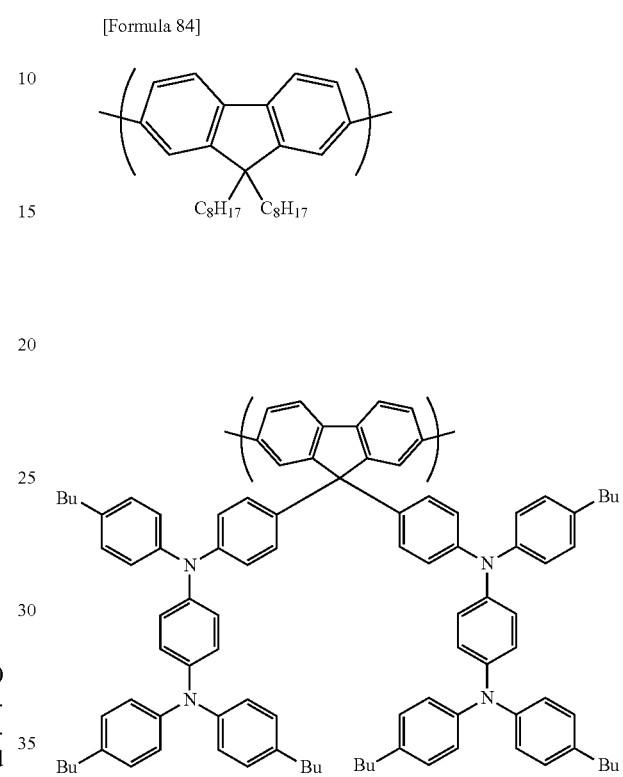

Compound M-4 (0.516 g), 2,7-dibromo-9,9-dioctylfluorene (0.254 g), 2,7-bis(1,3,2-dioxaboran-2-yl)-9,9-dioctylfluorene (0.424 g), palladium acetate (0.5 mg), tri(2-methylphenyl)phosphine (2.0 mg), Aliquat 336 (0.2 g, manufactured by Aldrich), toluene (10 ml) and an aqueous 2M Na$_2$CO$_3$ solution (2 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-5 was 719 mg.

Note that the number average molecular weight and weight average molecular weight of polymer compound P-5 in terms of polystyrene were $4.5 \times 10^4$ and $1.1 \times 10^5$, respectively.

Example 4

Synthesis of Polymer Compound P-6

[Formula 85]

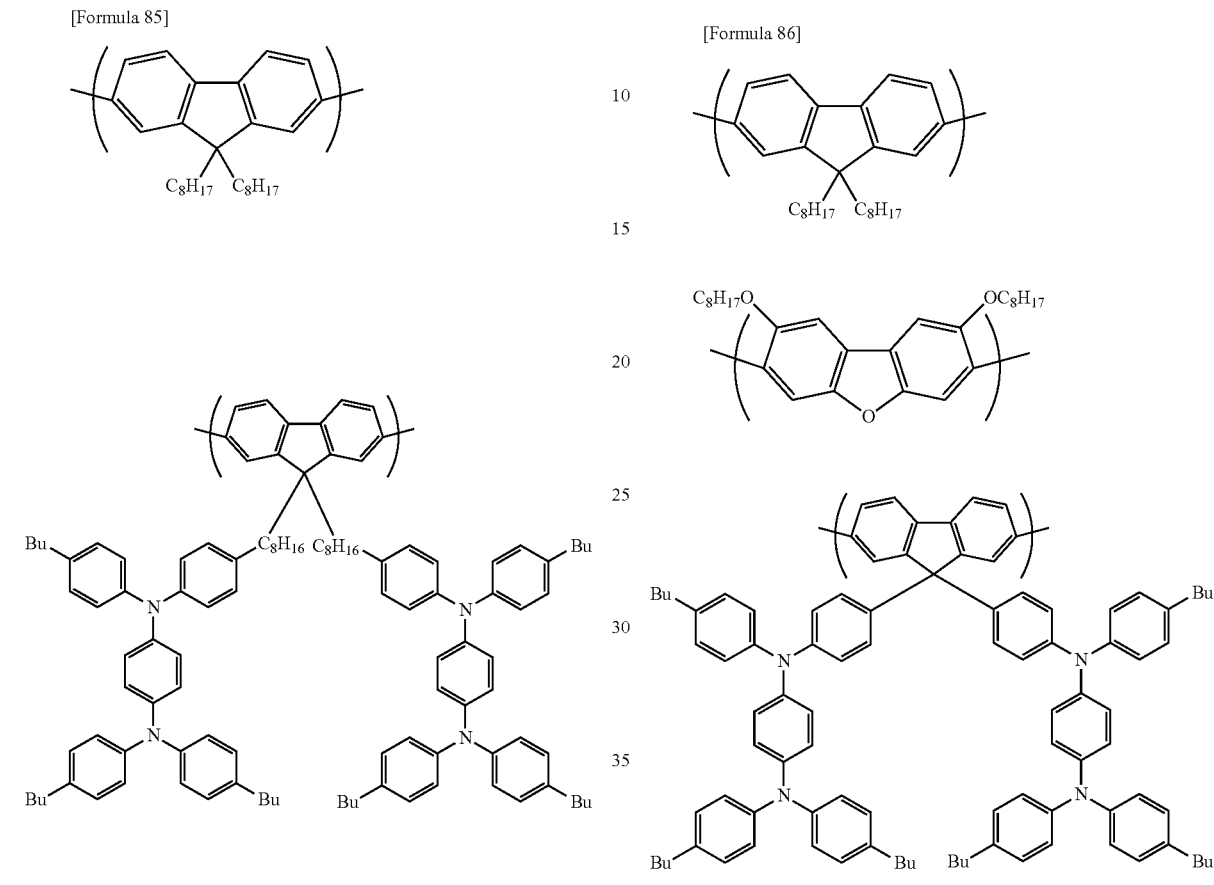

Compound M-5 (0.475 g), 2,7-dibromo-9,9-dioctylfluorene (0.204 g), 2,7-bis(1,3,2-dioxaboran-2-yl)-9,9-dioctylfluorene (0.339 g), palladium acetate (0.4 mg), tri(2-methylphenyl)phosphine (1.8 mg), Aliquat 336 (0.2 g, manufactured by Aldrich), toluene (9 ml) and an aqueous 2M $Na_2CO_3$ solution (2 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-6 was 451 mg.

Note that the number average molecular weight and weight average molecular weight of polymer compound P-6 in terms of polystyrene were $6.6 \times 10^4$ and $1.7 \times 10^5$, respectively.

Example 5

Synthesis of Polymer Compound P-7

[Formula 86]

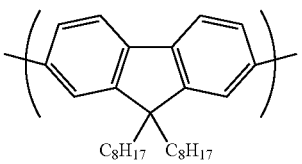

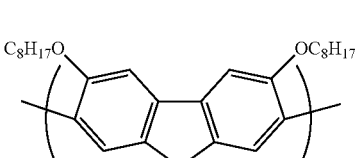

Compound M-4 (0.534 g), 2,7-dibromo-3,6-octyloxydibenzofuran (0.490 g), 2,7-bis(1,3,2-dioxaboran-2-yl)-9,9-dioctylfluorene (0.640 g), bis(triphenylphosphine)palladium dichloride (0.9 mg), Aliquat 336 (0.2 g, manufactured by Aldrich), toluene (9 ml) and an aqueous 2M $Na_2CO_3$ solution (3 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-7 was 772 mg.

Note that the number average molecular weight and weight average molecular weight of polymer compound P-7 in terms of polystyrene were $8.0 \times 10^4$ and $3.1 \times 10^5$, respectively.

Note that 2,7-dibromo-3,6-dioctyloxydibenzofuran was synthesized in accordance with the method described in JP-A-2004-059899.

Example 6

Synthesis of Polymer Compound P-8

[Formula 87]

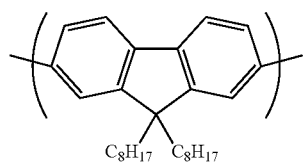

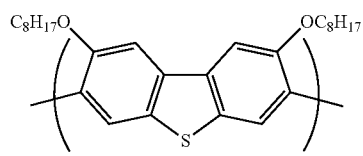

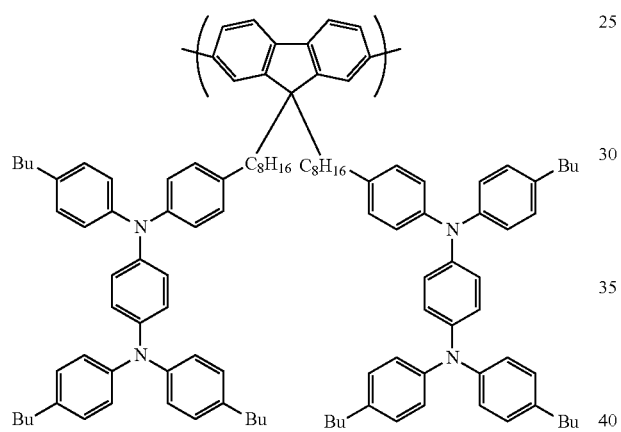

Compound M-5 (0.356 g), 2,7-dibromo-3,6-octyloxydibenzothiophene (0.575 g), 2,7-bis(1,3,2-dioxaboran-2-yl)-9,9-dioctylfluorene (0.640 g), bis(triphenylphosphine)palladium dichloride (0.9 mg), Aliquat 336 (0.2 g, manufactured by Aldrich), toluene (9 ml) and an aqueous 2M $Na_2CO_3$ solution (3 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-8 was 98 mg.

Note that the number average molecular weight and weight average molecular weight of polymer compound P-8 in terms of polystyrene were $2.7 \times 10^4$ and $8.0 \times 10^4$, respectively.

Note that 2,7-dibromo-3,6-dioctyloxydibenzothiophene was synthesized in accordance with the method described in JP-A-2004-002703.

Example 7

Synthesis of Polymer Compound P-9

[Formula 88]

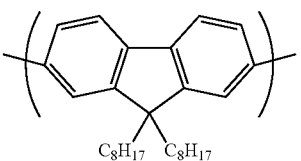

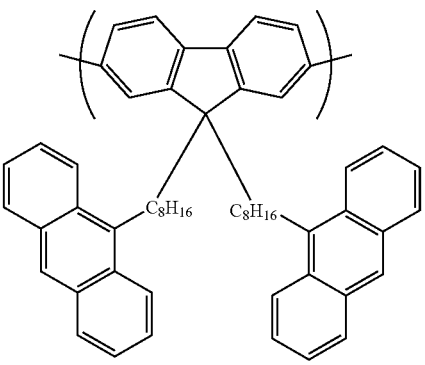

Compound M-7 (0.325 g), 2,7-dibromo-9,9-dioctylfluorene (0.461 g), 2,7-bis(1,3,2-dioxaboran-2-yl)-9,9-dioctylfluorene (0.640 g), bis(triphenylphosphine)palladium dichloride (0.9 mg), Aliquat 336 (0.2 g, manufactured by Aldrich), toluene (9 ml) and an aqueous 2M $Na_2CO_3$ solution (3 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-9 was 510 mg.

Note that the number average molecular weight and weight average molecular weight of polymer compound P-9 in terms of polystyrene were $8.3 \times 10^4$ and $1.6 \times 10^5$, respectively.

Synthesis Example 11

Synthesis of Compound P-10

[Formula 89]

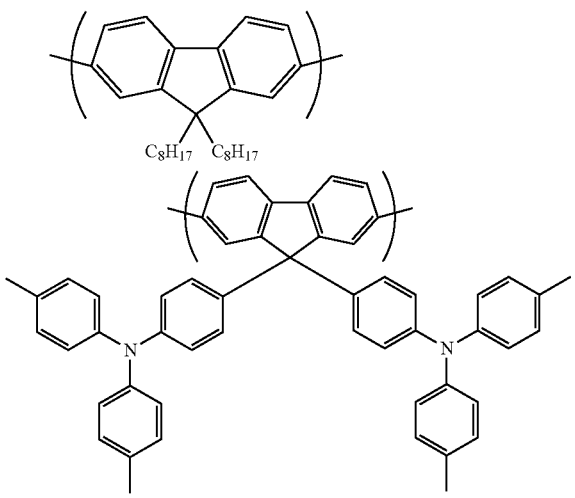

Compound M-8 (0.312 g), 2,7-dibromo-9,9-dioctylfluorene (0.461 g), 2,7-bis(1,3,2-dioxaboran-2-yl)-9,9-dioctylfluorene (0.640 g), bis(triphenylphosphine)palladium dichloride (0.9 mg), Aliquat 336 (0.2 g, manufactured by Aldrich), toluene (9 ml) and an aqueous 2M $Na_2CO_3$ solution (3 ml) were mixed under an inert atmosphere and refluxed for 3 hours. After completion of the reaction, a solution mixture of phenylboric acid (20 mg) and THF (2 ml) was added and further refluxed for 4 hours. Subsequently, an aqueous solution of sodium diethyldithiacarbamate was added to this and stirred at 85° C. for 4 hours. After cooling, the reaction solution was washed with water (30 ml) three times, 3% an aqueous acetic acid solution (30 ml) four times and water (30 ml) three times, and purified through an alumina column and a silica gel column. The obtained toluene solution was added dropwise to methanol (250 ml) and stirred for one hour. Thereafter, the obtained solid substance was filtrated and dried. The yield of the obtained polymer compound P-10 was 510 mg.

Note that the number average molecular weight and weight average molecular weight of polymer compound P-10 in terms of polystyrene were $9.4 \times 10^4$ and $2.5 \times 10^5$, respectively.

HOMO and LUMO energy values were determined by cyclic voltammetry (ALS 600, manufactured by P.A.S) and measured in an acetonitrile solvent containing 0.1 wt % tetrabutyl ammonium-tetrafluoroborate. A polymer compound was dissolved in chloroform so as to obtain a concentration of about 0.2 wt %. To the working pole, 1 mL of the chloroform solution of the polymer compound was then applied and the solvent was vaporized to form a thin film of the polymer compound. Measurement was performed using silver/silver ion electrode as a reference electrode and a grassy carbon electrode as a working electrode, and a platinum electrode as the opposite electrode in a glove box purged with nitrogen. The sweep rates of potentials all were measured at 50 mV/s.

Example 8

<Measurement of Oxidation Potential>

Polymer compound P-1 was dissolved in chloroform to prepare 0.2 wt % solution. The solution (0.05 mL) was applied onto a platinum electrode and chloroform was vaporized to prepare a thin film of polymer compound P-1. The measurement was performed in the same manner as above. Based on the obtained oxidation potential, HOMO energy was calculated.

Example 9

<Measurement of Oxidation Potential>

The oxidation potential of polymer compound P-2 was measured by the method mentioned above. Based on the obtained oxidation potential, HOMO energy was calculated.

Comparative Example 1

<Measurement of Oxidation Potential>

The oxidation potential of polymer compound P-3 was measured by the method mentioned above. Based on the obtained oxidation potential, HOMO energy was calculated.

TABLE 1

|  | Example 8 | Example 9 | Comparative Example 1 |
|---|---|---|---|
| Polymer compound | P-1 | P-2 | P-3 |
| Oxidation potential (mV) | 307 | 272 | 968 |
| Absolute value of HOMO energy (eV) | 5.3 | 5.2 | 5.9 |

Example 10

<Measurement of Oxidation Potential>

The oxidation potential of polymer compound P-5 was measured by the method mentioned above. Based on the obtained oxidation potential, HOMO energy was calculated.

Example 11

<Measurement of Oxidation Potential>

The oxidation potential of polymer compound P-6 was measured by the method mentioned above. Based on the obtained oxidation potential, HOMO energy was calculated.
<Measurement of Oxidation Potential>

The oxidation potential of polymer compound P-10 was determined in the same manner as above. Based on the obtained oxidation potential, HOMO energy was calculated.

TABLE 2

|  | Example 10 | Example 11 | Comparative Example 2 |
|---|---|---|---|
| Polymer compound | P-5 | P-6 | P-10 |
| Oxidation potential (mV) | 267 | 307 | 643 |
| Absolute value of HOMO energy (eV) | 5.22 | 5.26 | 5.59 |

Example 12

Preparation of Solution

Polymer compound P-1 obtained above was dissolved in toluene to prepare a toluene solution of a polymer concentration of 1.2 wt %.

Preparation of EL Device

On a glass substrate on which an ITO film of 150 nm thick is formed by a sputtering method, a thin film of 70 nm thick was formed by spin-coating using a solution obtained by filtrating a suspension solution of poly(3,4)ethylenedioxythiophene/polystyrene sulfonic acid (BaytronP AI4083, manufactured by Bayer) through a 0.2 µm membrane filter, and dried on a hot plate at 200° C. for 10 minutes. Subsequently, using the toluene solution obtained above, a film was formed by spin coating at a rotation rate of 1000 rpm. The film thickness of the formed film was about 71 nm. Furthermore, the film was dried under reduced pressure at 80° C. for one hour and then lithium fluoride was deposited to a thickness of about 4 nm. Calcium was deposited to a thickness of about 5 nm as a cathode, and then, aluminum was deposited to a thickness of about 72 nm. In this manner, an EL device was prepared. Note that deposition of a metal was initiated after a degree of vacuum reached $1 \times 10^{-4}$ Pa or less.

Performance of EL Device

When voltage was applied to the obtained device, EL light emission having a peak at 500 nm was obtained from the device. The intensity of EL light emission was almost in proportional to a current density. The maximum light emission efficiency of the device was 0.58 cd/A.

Furthermore, the voltage when the brightness exhibited 1.0 cd/m² was 3.44 V.

Example 13

Preparation of Solution

Polymer compound P-5 obtained above was dissolved in xylene to prepare a xylene solution of a polymer concentration of 1.5 wt %.

Preparation of EL Device

An EL device was prepared in substantially the same manner as in Example 12 except that the xylene solution obtained above was used. The rotation number during spin coating was 1500 rpm and the thickness of the obtained polymer film was 74 nm.

Performance of EL Device

When voltage was applied to the obtained device, EL light emission having a peak at 480 nm was obtained from the device. The intensity of EL light emission was almost in proportional to a current density. The maximum light emission efficiency of the device was 0.59 cd/A.

Furthermore, the voltage when the brightness exhibited 1.0 cd/m² was 3.48 V.

Comparative Example 3

Preparation of Solution

Polymer compound P-10 obtained above was dissolved in xylene to prepare a xylene solution of a polymer concentration of 1.5 wt Preparation of EL Device An EL device was prepared in substantially the same manner as in Example 12 except that the xylene solution obtained above was used. The rotation number during spin coating at this time was 1500 rpm and the thickness of the obtained film was 74 nm.

Performance of EL Device

When voltage was applied to the obtained device, EL light emission having a peak at 425 nm was obtained from the device. The intensity of EL light emission was almost in proportional to a current density. The maximum light emission efficiency of the device was 0.11 cd/A.

Furthermore, the voltage when the brightness exhibited 1.0 cd/m² was 3.84 V.

Comparative Example 4

Preparation of Solution

Polymer compound P-4 obtained above was dissolved in toluene to prepare a toluene solution of a polymer concentration of 1.8 wt %.

Preparation of EL Device

An EL device was prepared in substantially the same manner as in Example 12 except that the toluene solution obtained above was used. The rotation number during spin coating at this time was 2400 rpm and the thickness of the obtained film was 76 nm.

Performance of EL Device

When voltage was applied to the obtained device, EL light emission having a peak at 460 nm was obtained from the device. The intensity of EL light emission was almost in proportional to a current density. The maximum light emission efficiency of the device was 0.35 cd/A.

Furthermore, the voltage when the brightness exhibited 1.0 cd/m² was 3.96 V.

TABLE 3

|  | Example 12 | Example 13 | Comparative Example 3 | Comparative Example 4 |
|---|---|---|---|---|
| Polymer compound | P-1 | P-5 | P-10 | P-4 |
| Light emission efficiency (cd/A) | 0.58 | 0.59 | 0.11 | 0.35 |
| Voltage (V) at the time of 1.0 cd/m² | 3.44 | 3.48 | 3.84 | 3.96 |

Example 14

Preparation of Solution

Polymer compound P-9 obtained above was dissolved in xylene to prepare a xylene solution of a polymer concentration of 1.5 wt Preparation of EL Device An EL device was prepared in substantially the same manner as in Example 12 except that the xylene solution obtained above was used. The rotation number during spin coating at this time was 2000 rpm and the thickness of the obtained film was 71 nm.

Performance of EL Device

When voltage was applied to the obtained device, EL light emission having a peak at 435 nm was obtained from the device. The intensity of EL light emission was almost in proportional to a current density. The maximum light emission efficiency of the device was 1.08 cd/A.

Furthermore, the voltage when the brightness exhibited 1.0 cd/m² was 3.53 V.

TABLE 4

|  | Example 14 | Comparative Example 4 |
|---|---|---|
| Polymer compound | P-1 | P-4 |
| Light emission efficiency (cd/A) | 1.08 | 0.35 |
| Voltage (V) at the time of 1.0 cd/m² | 3.53 | 3.96 |

Example 15

Preparation of Solution

Polymer compound P-7 obtained above was dissolved in xylene to prepare a xylene solution of a polymer concentration of 1.5 wt %.

Preparation of EL Device

An EL device was prepared in substantially the same manner as in Example 12 except that the xylene solution obtained above was used. The rotation number during spin coating at this time was 1200 rpm and the thickness of the obtained film was 77 nm.

Performance of EL Device

When voltage was applied to the obtained device, EL light emission having a peak at 450 nm was obtained from the device. The intensity of EL light emission was almost in proportional to a current density. The maximum light emission efficiency of the device was 0.12 cd/A.

Example 16

Preparation of Solution

Polymer compound P-8 obtained above was dissolved in xylene to prepare a xylene solution of a polymer concentration of 1.5 wt g.

Preparation of EL Device

An EL device was prepared in substantially the same manner as in Example 12 except that the xylene solution obtained above was used. The rotation number during spin coating at this time was 1200 rpm and the thickness of the obtained film was 89 nm.

Performance of EL Device

When voltage was applied to the obtained device, EL light emission having a peak at 480 nm was obtained from the device. The intensity of EL light emission was almost in proportional to a current density. The maximum light emission efficiency of the device was 1.72 cd/A.

Industrial Applicability

The polymer compound of the present invention has effects such as high charge injectability and transportability, and high light emission efficiency. When a side chain has a hole injection/transport group, the energy of the highest occupied molecular orbital (HOMO) increases, with the result that hole injectability and hole transportability improve, increasing light emission efficiency. When a side chain has an electron injection/transport group, the energy of the lowest unoccupied orbital (LUMO) decreases, with the result that electron injectability and electron transportability improve, increasing light emission efficiency. When a side chain has a light-emitting group, it is expected that the light emission efficiency increases or light having a different wavelength from that of the main chain is emitted.

When a polymer compound whose main chain has electron transportability and side chain has a hole injection/transport group, a new function can be added without inhibiting the electron transportability of the main chain and the transportability of electrons and holes can be controlled. When a polymer compound whose main chain has electron transportability and side chain has a light-emitting group, light having a different wavelength from that of the main chain can be emitted. Furthermore, when a light-emitting group having high efficiency is used, the light emission efficiency can be also improved. When a polymer compound whose main chain has electron transportability and side chain has an electron injection/transport group, the electron transportability of the main chain can be improved.

As mentioned above, by separating the function of the side chain from that of the main chain, a function can be added without inhibiting the function of the main chain, with the result that high performance of the polymer compound can be expected.

Therefore, the polymer LED containing a polymer compound according to the present invention can be used as a curved or planar light source for a backlight of a liquid crystal display or illumination and in a segment type display device and a flat panel display of dot matrix.

The invention claimed is:

1. A light emitting or charge transport polymer compound having a fluorenediyl group that may have a substituent as a repeat unit in a main chain and a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring, characterized in that the functional group is directly bonded to a saturated carbon of the fluorenediyl group or bonded to the fluorenediyl group via —$R_k$—X— ($R_k$ represents an alkylene group and X represents a direct bond or bonding group) at X.

2. The polymer compound according to claim 1, wherein an absolute HOMO value of the polymer compound is 5.6 eV or less.

3. The polymer compound according to claim 1, wherein an absolute LUMO value of the polymer compound is 2.2 eV or more.

4. The polymer compound according to claim 1, wherein a number average molecular weight thereof is $10^3$ to $10^8$ in terms of polystyrene.

5. The polymer compound according to claim 1, having a hole injection/transport group as the functional side chain.

6. The polymer compound according to claim 1, having an electron injection/transport group as the functional side chain.

7. The polymer compound according to claim 1, having a light emitting group as the functional side chain.

8. The polymer compound according to claim 1, wherein the functional side chain is directly bonded to a 9th position of the fluorenediyl group that may have a substituent or bonded to the fluorenediyl group via —$R_k$—X— ($R_k$ represents an alkylene group and X represents a direct bond or bonding group) at X.

9. A light emitting thin film characterized by comprising a polymer compound according to claim 1.

10. The light-emitting thin film according to claim 9, wherein a light-emission quantum yield thereof is 50% or more.

11. An electrically conductive thin film characterized by comprising a polymer compound according to claim 1.

12. An organic semiconductor thin film characterized by comprising a polymer compound according to claim 1.

13. An organic transistor characterized by comprising the organic semiconductor thin film according to claim 12.

14. A composition characterized by comprising at least one kind of material selected from the group consisting of a hole transport material, an electron transport material and a light-emitting material, and at least one kind of polymer compound having a fluorenediyl group that may have a substituent as a repeat unit in a main chain and a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring, characterized in that the functional group is directly bonded to a saturated carbon of the fluorenediyl group or bonded to the fluorenediyl group via —$R_k$—X— ($R_k$ represents an alkylene group and X represents a direct bond or bonding group) at X.

15. A composition characterized by comprising at least two kinds of polymer compounds having a fluorenediyl group that may have a substituent as a repeat unit in a main chain and a functional side chain containing at least one functional group selected from the group consisting of a hole injection/transport group containing at least one hetero atom other than a nitrogen atom or at least two nitrogen atoms, an electron injection/transport group containing at least one hetero atom other than a nitrogen atom or at least two nitrogen atoms, and a light emitting group containing a condensed polycyclic aromatic hydrocarbon or a heterocyclic ring, characterized in that the functional group is directly bonded to a saturated carbon of the fluorenediyl group or bonded to the fluorenediyl group via —$R_k$—X— ($R_k$ represents an alkylene group and X represents a direct bond or bonding group) at X.

\* \* \* \* \*